US008289775B2

(12) United States Patent
Lee et al.

(10) Patent No.: US 8,289,775 B2
(45) Date of Patent: Oct. 16, 2012

(54) APPARATUS AND METHOD FOR INHIBITING EXCESS LEAKAGE CURRENT IN UNSELECTED NONVOLATILE MEMORY CELLS IN AN ARRAY

(75) Inventors: Peter Wung Lee, Saratoga, CA (US); Fu-Chang Hsu, San Jose, CA (US); Hsing-Ya Tsao, San Jose, CA (US)

(73) Assignee: Aplus Flash Technology, Inc., San Jose, CA (US)

( * ) Notice: Subject to any disclaimer, the term of this patent is extended or adjusted under 35 U.S.C. 154(b) by 603 days.

(21) Appl. No.: 12/456,744

(22) Filed: Jun. 22, 2009

(65) Prior Publication Data

US 2009/0316487 A1 Dec. 24, 2009

Related U.S. Application Data

(60) Provisional application No. 61/132,628, filed on Jun. 20, 2008.

(51) Int. Cl.
*G11C 11/34* (2006.01)
*G11C 11/4193* (2006.01)

(52) U.S. Cl. ......... 365/185.18; 365/185.02; 365/185.27; 365/185.29

(58) Field of Classification Search ............. 365/185.02, 365/185.18, 185.27, 185.29
See application file for complete search history.

(56) References Cited

U.S. PATENT DOCUMENTS

| | | | |
|---|---|---|---|
| 5,587,947 A * | 12/1996 | Chang et al. | 365/185.3 |
| 5,898,606 A * | 4/1999 | Kobayashi et al. | 365/63 |
| 5,901,090 A | 5/1999 | Haddad et al. | |
| 5,978,277 A | 11/1999 | Hsu et al. | |
| 6,023,188 A * | 2/2000 | Lee et al. | 327/536 |
| 6,510,085 B1 | 1/2003 | Fastow et al. | |
| 6,587,375 B2 * | 7/2003 | Chung et al. | 365/185.13 |
| 6,620,682 B1 | 9/2003 | Lee et al. | |
| 6,628,563 B1 | 9/2003 | Hsu et al. | |
| 6,777,292 B2 | 8/2004 | Lee et al. | |
| 6,807,103 B2 | 10/2004 | Cavaleri et al. | |

(Continued)

FOREIGN PATENT DOCUMENTS

WO PCT/US2009/003699 7/2009

OTHER PUBLICATIONS

Co-pending U.S. Appl. No. 12/387,771, filed May 7, 2009, "A NAND Based NMOS NOR Flash Memory Cell, a NAND Based NMOS NOR Flash Memory Array, and a Method of Forming a NAND Based NMOS NOR Flash Memory Array", assigned to the same assignee as the present invention.

(Continued)

*Primary Examiner* — Hoai V Ho
*Assistant Examiner* — Jay Radke
(74) *Attorney, Agent, or Firm* — Saile Ackerman LLC; Stephen B. Ackerman; Billy Knowles

(57) ABSTRACT

An apparatus and method for operating an array of NOR connected flash nonvolatile memory cells erases the array in increments of a page, block, sector, or the entire array while minimizing sub-threshold leakage current through unselected nonvolatile memory cells. The apparatus has a row decoder circuit and a source decoder circuit for selecting the nonvolatile memory cells for providing biasing conditions for reading, programming, verifying, and erasing the selected nonvolatile memory cells while minimizing sub-threshold leakage current through unselected nonvolatile memory cells.

77 Claims, 21 Drawing Sheets

U.S. PATENT DOCUMENTS

| | | | |
|---|---|---|---|
| 6,818,491 | B2 | 11/2004 | Lee et al. |
| 7,042,767 | B2 | 5/2006 | Wang et al. |
| 2001/0020840 | A1* | 9/2001 | Kojima .................. 323/282 |
| 2004/0029335 | A1 | 2/2004 | Lee et al. |
| 2004/0155234 | A1* | 8/2004 | Ishimaru et al. ............. 257/10 |
| 2005/0122776 | A1* | 6/2005 | Lee et al. ............. 365/185.11 |
| 2005/0179079 | A1 | 8/2005 | Wu |
| 2005/0248993 | A1* | 11/2005 | Lee et al. ............. 365/185.29 |
| 2006/0139998 | A1 | 6/2006 | Samachisa |
| 2008/0080242 | A1* | 4/2008 | Wang ............... 365/185.11 |

OTHER PUBLICATIONS

Co-pending U.S. Appl. No. 12/455,337, filed Jun. 1, 2009, "A NAND String Based NAND/NOR Flash Memory Cell, Array, and Memory Device Having Parallel Bit Llnes and Source Lines, having a Programmable Select Gating Transistor, and Circuits and Methods for Operating Same," assigned to the same assignee as the present invention.

Co-pending U.S. Appl. No. 12/455,936, filed Jun. 9, 2009, "Row-Decoder and Source-Decoder Structures Suitable for Erase in Unit of Page,Sector and Chip of a NOR-Type Flash Operating Below +/−10V BVDS," assigned to the same assignee as the present invention.

Co-pending U.S. Appl. No. 12/456,354, filed Jun. 16, 2009, "Row-Decoder and Select Gate Decoder Structures Suitable for Flashed-Based EEPROM Operating Below +/−10V BVDS," assigned to the same assignee as the present invention.

* cited by examiner

| | WL (Unsel) Sec: 414u | WL (Unsel) BLK: 412u | WL (Sel BLK:) SEL 432s | WL (Sel BLK:) UNSEL 432su | LBL (Sel Sec) SEL 450s | LBL (Sel Sec) UNSEL 450u | BLG (Sel Sec) SEL 433s | BLG (Sel Sec) UNSEL 433u | SL[N] (Sel Sec) SEL 426s | SL[N] (Sel Sec) UNSEL 426u | SLG (Sel Sec) SEL 467s | SLG (Sel Sec) UNSEL 467u | TPW SEL 244s | TPW UNSEL 244u |
|---|---|---|---|---|---|---|---|---|---|---|---|---|---|---|
| SLOW READ | 0V | -2V | VDD | -2V | 1V | 0V | HV''' | HV''' | 0V | 1V | VDD | 0V | 0V | 0V |
| FAST READ | 0V | 0V | HV''' | 0V | 1V | 0V | HV''' | HV''' | 0V | 1V | VDD | 0V | 0V | 0V |
| PAGE ERASE | 0V* | -10V! | 10V | -10V! | -10V | -10V | 0V | 0V | -10V | -10V | -10V | -10V | -10V | 0V |
| PAGE ERASE VERIFY | 0V | 0V | Vt1L | 0V | Vdd-Vt/0V | 0V | HV''' | HV''' | 0V | 1V | VDD | VDD | 0V | 0V |
| BLOCK ERASE | 0V* | -10V! | 10V | NA | -10V | 0V | 0V | 0V | -10V | -10V | -10V | -10V | -10V | 0V |
| BLOCK ERASE VERIFY | 0V | 0V | Vt1L | NA | Vdd-Vt/0V | 0V | HV''' | HV''' | 0V | 1V | VDD | VDD | 0V | 0V |
| SECTOR ERASE | 0V* | NA | 10V | NA | -10V | -10V | 0V | 0V | -10V | NA | -10V | -10V | -10V | 0V |
| SECTOR ERASE VERIFY | 0V | NA | Vt1L | NA | Vdd-Vt/0V | NA | HV''' | HV''' | 0V | NA | VDD | VDD | 0V | 0V |
| PAGE PROGRAM | 0V | -2V | -10V | -2V | 5V/0V | 0V | 10V | 10V | 0V | 1V | 10V | 0V | 0V | 0V |
| PAGE PROGRAM VERIFY | 0V | 0V | VtOH | 0V | Vdd-Vt/0V | 0V | HV''' | HV''' | 0V | 1V | VDD | 0V | 0V | 0V |

LEGEND
-10V! : Coupled from NOR Array's TPW
0V* : Coupled from NOR Array's TPW
HV''': HV=-5V
NA = Not Applicable

FIG. 13a

| | WL (Unsel Sec:) 414u | WL (Unsel BLK:) 412u | WL (Sel BLK:) SEL 432s | WL (Sel BLK:) UNSEL 432su | LBL (Sel Sec) SEL 450s | LBL (Sel Sec) UNSEL 450u | BLG (Sel Sec) SEL 433s | BLG (Sel Sec) UNSEL 433u | SL[N] (Sel Sec) SEL 426s | SL[N] (Sel Sec) UNSEL 426u | SLG (Sel Sec) SEL 467s | SLG (Sel Sec) UNSEL 467u | TPW SEL 244s | TPW UNSEL 244u |
|---|---|---|---|---|---|---|---|---|---|---|---|---|---|---|
| SLOW READ | 0V | -2V | HV" | -2V | 1V | 0V | HV" | HV" | 0V | 1V | VDD | 0V | 0V | 0V |
| FAST READ | 0V | 0V | HV' | 0V | 1V | 0V | HV" | HV" | 0V | 1V | VDD | 0V | 0V | 0V |
| PAGE ERASE | 0V* | -10V! | 10V | -10V! | -10V | -10V | 0V | 0V | -10V | -10V | -10V | -10V | -10V | 0V |
| PAGE ERASE VERIFY | 0V | 0V | Vt3L | 0V | Vdd-Vt/0V | 0V | HV" | 0V | 0V | 1V | VDD | VDD | 0V | 0V |
| BLOCK ERASE | 0V* | -10V! | 10V | NA | -10V | -10V | 0V | 0V | -10V | -10V | -10V | -10V | -10V | 0V |
| BLOCK ERASE VERIFY | 0V | 0V | Vt3L | NA | Vdd-Vt/0V | 0V | HV" | 0V | 0V | 1V | VDD | VDD | 0V | 0V |
| SECTOR ERASE | 0V* | NA | 10V | NA | -10V | NA | HV" | HV" | -10V | NA | -10V | -10V | -10V | 0V |
| SECTOR ERASE VERIFY | 0V | NA | -10V | NA | Vdd-Vt/0V | 0V | 0V | 0V | 0V | NA | VDD | VDD | 0V | 0V |
| PAGE PROGRAM | 0V | -2V | -10V | -2V | 4V/5V/6V/0V | 0V | 10V | 0V | 0V | 1.5V-1.8V | 10V | -10V | 0V | 0V |
| PAGE PROGRAM VERIFY | 0V | 0V | VtoH/Vt1H | 0V | Vdd-Vt/0V | NA | HV" | HV" | 0V | 1V | VDD | 0V | 0V | 0V |

LEGEND
-10V! : Coupled from NOR Array's TPW
0V* : Coupled from NOR Array's TPW
HV'' : HV~=5V
HV''' : HV~=6V
NA = Not Applicable

FIG. 13b

| | WL (Sel Blk) Sel 432s | WL (Un-sel BLK) Unsel 432su | XT Sel 535s | XT Unsel 535u | XD Sel 530s | XD Unsel 530u | NW Sel 552s | NW Unsel 552u | ISOB 566 | RDB 564 | VPX0 527b | VNX0 526a | VP1 562 | VN1 560 | VPX1 527a | VNX1 526b | ISOP 528 | VN2 568 |
|---|---|---|---|---|---|---|---|---|---|---|---|---|---|---|---|---|---|---|
| SLOW READ | VDD | -2V | VDD | -2V | VDD | -2V | VDD | VDD | -5V | 0V | VDD | 0V | VDD | VDD | VDD | -2V | 0V | -2V |
| FAST READ | HV″ | 0V | HV″ | 0V | HV″ | 0V | HV″ | HV″ | -5V | 0V | HV″ | 0V | HV″ | HV″ | HV″ | 0V | 0V | 0V |
| PAGE ERASE | 10V | 0V*⁻10V! | 10V | 0V | 10V | 0V | 10V | 10V | 0V | 10V | 10V | 0V | 10V | 0V | 10V | 0V | 0V | 0V |
| PAGE ERASE VERIFY | Vt1L | 0V | Vt1L | 0V | Vt1L | 0V | Vt1L | Vt1L | -5V | 0V | Vt1L | 0V | Vt1L | Vt1L | Vt1L | 0V | 0V | 0V |
| BLOCK ERASE | 10V | -10V! | 10V | 0V | 10V | 0V | 10V | 10V | 0V | 10V | 10V | 0V | 10V | 0V | 10V | 0V | 0V | 0V |
| BLOCK ERASE VERIFY | Vt1L | NA | Vt1L | NA | Vt1L | 0V | 0V | Vt1L | -5V | 0V | Vt1L | 0V | Vt1L | Vt1L | Vt1L | 0V | 0V | 0V |
| SECTOR ERASE | 10V | NA | 10V | NA | 10V | NA | 10V | 10V | 0V | 10V | 10V | -5V | 10V | 0V | 10V | 0V | 0V | 0V |
| SECTOR ERASE VERIFY | Vt1L | NA | Vt1L | NA | Vt1L | NA | Vt1L | Vt1L | -5V | 0V | Vt1L | 0V | Vt1L | Vt1L | Vt1L | 0V | 0V | 0V |
| PAGE PROGRAM | -10V | -2V | -10V | -2V | 0V | -10V | 0V | 0V | -12V | -10V | VDD | 0V | 0V | 0V | 0V | -10V | -5V | -2V |
| PAGE PROGRAM VERIFY | VtOH | 0V | VtOH | 0V | VtOH | 0V | VDD | VDD | -5V | 0V | VDD | 0V | VDD | VDD | VDD | 0V | 0V | 0V |

LEGEND
-10V! : Coupled from NOR Array's TPW
0V* : Coupled from NOR Array's TPW
HV‴: HV~-5V
HV″: HV~-6V
NA: Not Applicable

FIG. 14a

| | WL (Sel Blk) Sel 432s | WL (Un-sel BLK) Unsel 432su | XT Sel 535s | XT Unsel 535u | XD Sel 530s | XD Unsel 530u | NW Sel 552s | NW Unsel 552u | ISOB 566 | RDB 564 | VPX0 527b | VNX0 526a | VP1 562 | VN1 560 | VPX1 527a | VNX1 526b | ISOP 528 | VN2 564 |
|---|---|---|---|---|---|---|---|---|---|---|---|---|---|---|---|---|---|---|
| SLOW READ | HV" | -2V | HV" | 0V | HV" | 0V | HV" | HV" | -5V | 0V | HV" | 0V | HV" | HV" | HV" | -2V | 0V | -2V |
| FAST READ | HV" | 0V | HV' | 0V | HV' | 0V | HV' | HV' | -5V | 0V | HV' | 0V | HV' | HV' | HV' | 0V | 0V | 0V |
| PAGE ERASE | 10V | 0V*-10V! | 10V | 0V | 10V | 0V | 10V | 0V | 0V | 10V | 10V | 0V | 10V | 0V | 10V | 0V | 0V | 0V |
| PAGE ERASE VERIFY | Vt3L | 0V | Vt3L | 0V | HV" | 0V | HV" | HV" | -5V | 0V | HV" | 0V | HV" | HV" | HV" | 0V | 0V | 0V |
| BLOCK ERASE | 10V | -10V! | 10V | NA | 10V | 0V | 10V | 0V | 0V | 10V | 10V | 0V | 10V | 0V | 10V | 0V | 0V | 0V |
| BLOCK ERASE VERIFY | Vt3L | 0V | Vt3L | NA | HV" | 0V | HV" | HV" | -5V | 0V | HV" | 0V | HV" | HV" | HV" | 0V | 0V | 0V |
| SECTOR ERASE | 10V | NA | 10V | NA | 10V | NA | 10V | NA | 0V | 10V | 10V | 0V | 10V | 0V | 10V | 0V | 0V | 0V |
| SECTOR ERASE VERIFY | Vt3L | NA | Vt3L | NA | HV" | NA | HV" | NA | -5V | 0V | HV" | 0V | HV" | HV" | HV" | 0V | 0V | 0V |
| PAGE PROGRAM | -10V | -2V | -10V | -2V | 0V | -10V | 0V | 0V | -12V | -10V | VDD | -5V | 0V | 0V | 0V | -10V | -5V | -2V |
| PAGE PROGRAM VERIFY | Vt0H/Vt1H/Vt2H | 0V | Vt0H/Vt1H/Vt2H | 0V | HV" | 0V | HV" | HV" | -5V | 0V | HV" | 0V | HV" | HV" | HV" | 0V | 0V | 0V |

LEGEND
-10V! : Coupled from NOR Array's TPW
0V* : Coupled from NOR Array's TPW
HV"'; HV~=5V
HV''; HV~=6V
NA: Not Applicable

FIG. 14b

| | SL (Sel BLK) 426s/412s | SL (Unsel BLK) 426u/412u | ST Sel 620s | ST Unsel 620u | SXD Sel 610s | SXD Unsel 610u | BLG Sel 433s | BLG Unsel 433u | ERSB 615 | VP2 616 | SLS 632 | DISE 630 | PC 618 | PCB 619 |
|---|---|---|---|---|---|---|---|---|---|---|---|---|---|---|
| READ | 0V | VS1* | 0V | VS1* | VDD | 0V | HV" | HV" | VDD | HV" | VS1* | VDD | 0V | HV" |
| PAGE/BLOCK/SECTOR ERASE | −10V | −10V | 0V | NA | VDD | 0V | 0V | 0V | 0V | 0V | −10V | −10V | 0V | VDD |
| PAGE/BLOCK/SECTOR ERASE VERIFY | 0V | VS1* | 0V | VS1* | VDD | 0V | HV" | HV" | VDD | HV" | VS1* | VDD | 0V | HV" |
| PAGE PROGRAM | 0V | VS2** | 0V | VS2** | VDD | 0V | 10V | 0V | VDD | 10V | VS2** | HV" | 10V | 0V |
| PAGE PROGRAM VERIFY | 0V | VS1* | 0V | VS1* | VDD | 0V | HV" | 0V | VDD | HV" | VS1* | VDD | 0V | HV" |

LEGEND
NV": HV" ≈ 5V
VS1*: Vs1 ≈ 1V
VS2**: VS2 ≈ 1.5V~1.8V

FIG. 15

APPARATUS AND METHOD FOR INHIBITING EXCESS LEAKAGE CURRENT IN UNSELECTED NONVOLATILE MEMORY CELLS IN AN ARRAY

This application claims priority under 35 U.S.C. §119 to U.S. Provisional Patent Application Ser. No. 61/132,628, filed on Jun. 20, 2008, assigned to the same assignee as the present invention, and incorporated herein by reference in its entirety.

RELATED PATENT APPLICATIONS

U.S. patent application Ser. No. 12/387,771, filed on May 7, 2009 assigned to the same assignee as the present invention.

U.S. patent application Ser. No. 12/455,337, filed on Jun. 1, 2009 assigned to the same assignee as the present invention.

U.S. patent application Ser. No. 12/455,936, filed on Jun. 9, 2009 assigned to the same assignee as the present invention.

U.S. patent application Ser. No. 12/4563,54, filed on Jun. 16, 2009 assigned to the same assignee as the present invention.

BACKGROUND OF THE INVENTION

1. Field of the Invention

This invention relates generally to nonvolatile memory array structure and operation. More particularly, this invention relates to a NOR flash charge retaining nonvolatile memory device structures, peripheral circuits for NOR flash charge retaining nonvolatile memory devices and methods for operation of NOR nonvolatile memory devices. Even more particularly, this invention relates to peripheral circuits NOR nonvolatile memory devices and methods for operation of NOR nonvolatile memory devices that inhibit excess leakage currents during programming and erasing the NOR nonvolatile memory devices.

2. Description of Related Art

Nonvolatile memory is well known in the art. The different types of charge retaining nonvolatile memory include Read-Only-Memory (ROM), Electrically Programmable Read Only Memory (EPROM), Electrically Erasable Programmable Read Only Memory (EEPROM), NOR Flash Memory, and NAND Flash Memory. In current applications such as personal digital assistants, cellular telephones, notebook and laptop computers, voice recorders, global positioning systems, etc., the Flash Memory has become one of the more popular types of Nonvolatile Memory. Flash Memory has the combined advantages of the high density, small silicon area, low cost and can be repeatedly programmed and erased with a single low-voltage power supply voltage source.

The Flash Memory structures known in the art employ a charge retaining mechanism such as a charge storage phenomena and a charge trapping phenomena. In a charge storage mechanism, as with a floating gate nonvolatile memory, the charge representing digital data is stored on a floating gate of the device. The stored charge modifies the threshold voltage of the floating gate memory cell, which in turn determines or corresponds to the digital data stored. In a charge trapping mechanism, as in a Silicon-Oxide-Nitride-Oxide-Silicon (SONOS) or Metal-Oxide-Nitride-Oxide-Silicon (MONOS) type cell, the charge is trapped in a charge trapping layer between two insulating layers. The charge trapping layer in the SONOS/MONOS devices is a material with a relatively high dielectric constant (k) such as Silicon Nitride ($SiN_x$).

A present day flash nonvolatile memory is divided into two major product categories such as the fast random-access asynchronous NOR flash nonvolatile memory and the slower serial-access synchronous NAND flash nonvolatile memory. NOR flash charge retaining nonvolatile memory devices as presently designed is the high pin-count memory with multiple external address and data pins along with appropriate control signal pins. One disadvantage of NOR flash nonvolatile memory is as the cell capacity doubled, the required external pin count increases by one because one more external address pin is added. In contrast, NAND flash nonvolatile memory has an advantage of having a smaller pin-count than NOR with no address input pins. As the memory cell capacity increases, the NAND flash nonvolatile memory pin count remains constant. Both NAND and NOR flash nonvolatile memory cell structures in production today commonly use a one charge retaining (charge storage or charge trapping) transistor memory cell to store one bit of data as charge or as it commonly referred to as a single-level cell program cell (SLC). They are respectively referred as one-bit/one transistor NAND cell or NOR cell, storing a single-level cell programmed data in the cell.

The NAND and NOR flash nonvolatile memory provides the advantage of in-system program and erase capabilities and have a specification for providing at least 100K endurance cycles. In addition, both single-chip NAND and NOR flash nonvolatile memory product can provide giga-byte density because their highly-scalable cell sizes. For instance, presently a one-bit/one transistor NAND cell size is kept at ~$4\lambda^2$ ($\lambda$ being a minimum feature size in a semiconductor process), while NOR cell size is ~$10\lambda^2$. Furthermore, in addition to storing data as a single-level cell program cell having two voltage thresholds ($Vt0$ and $Vt1$), both one transistor NAND and NOR flash nonvolatile memory cells are able to store data as a multi-level program cell, wherein the cells store at least two bits per cell or two bits/one transistor with four multi-level threshold voltages ($Vt0$, $Vt1$, $Vt2$ and $Vt03$) in one physical cell.

NOR flash memories cells are arranged in an array, of rows and columns in a NOR-like structure. All the NOR Flash cells on each row share the same word line. The drain electrodes that are common to two cells on each column are commonly connected to the bit line (BL) associated with each column. Sources of each of the NOR flash cells of each of the rows of the array are commonly connected to the source lines that are often connected together to the ground reference voltage source.

Currently, the memory cell capacity of a single-chip double polycrystalline silicon gate NAND flash nonvolatile memory chip is 64 Gb. In contrast, a double polycrystalline silicon gate NOR flash nonvolatile memory chip has a memory cell capacity of 2 Gb for a chip of equivalent dimensions. The big gap between NAND and NOR flash nonvolatile memory cell capacity is a result of the superior scalability of NAND flash nonvolatile memory cell over a NOR flash nonvolatile memory. A NOR flash nonvolatile memory cell requires 5.0V drain-to-source (Vds) to maintain a high-current Channel-Hot-Electron (CHE) programming process. Alternately, a NAND flash nonvolatile memory cell requires 0.0V between the drain to source for a low-current Fowler-Nordheim channel tunneling program process. The above results in the one-bit/one transistor NAND flash nonvolatile memory cell size being only one half that of a one-bit/one transistor NOR flash nonvolatile memory cell. This permits a NAND flash nonvolatile memory device to be used in applications that require huge data storage. A NOR flash charge retaining nonvolatile memory device is extensively used as a program-code storage memory which requires less data storage and requires fast and asynchronous random access.

A NOR-type flash nonvolatile memory cell requires application of a 5.0V drain-to-source voltage (Vds) program voltage to all the nonvolatile memory cells connected to the selected and unselected bit lines of the selected sub-array or sector of NOR-type flash nonvolatile memory array. In a typical high-capacity NOR-type flash nonvolatile memory array design, the NOR-type flash nonvolatile memory array is divided into a multiple sub-arrays or sectors. Each sector for instance may include a sub-array of 1M Bytes (8 Mb) of NOR-type flash nonvolatile memory cells. Each sector may be further divided into blocks wherein each block has a capacity of 128 KB (1 Mb). A 1 Mb block comprises of 1024 word lines and 1024 bit lines. In other words, each common bit line will be connected with 1024 cells in parallel within the same P-type well TPW that is in the same N-type well.

A common concern for the NOR-type flash nonvolatile memory array designs of the prior art is a bit line leakage current that occurs for a read operation and for a program operation using either the channel-hot-electron or Fowler-Nordheim edge program operations. The bit line leakage current creates more of a problem in program operations than read operations, because the program operation of the NOR-type flash nonvolatile memory cells requires a +5.0V bit line voltage to create a drain-to-source voltage (Vds) of 5.0V. Alternately, the read operation has a drain-to-source voltage (Vds) of approximately +1.0V. The larger bit line voltage (+5.0V) is coupled to floating-gate of the NOR-type flash nonvolatile memory cell. This induces a positive voltage at the floating gate which causes conduction of a sub-threshold leakage current if the NOR-type flash nonvolatile memory cells erased threshold voltage Vt0 is less than +1.0V.

In the read operation, if each of the NOR-type flash nonvolatile memory cells has a low threshold voltage Vt0, each cell will conduct more than 10 nA leakage with bit lines set to a read bias voltage level of approximately +1.0V and the source lines set to a voltage level of approximately the ground reference voltage level (0.0V). Each bit line will conduct a leakage current of about 10 μA if all 1024 cells connected to the bit line have a low threshold voltage Vt0. The total leakage current for the total NOR-type flash nonvolatile memory array is approximately 10 mA bit line leakage induced to all of is the 1024 bit lines. In a normal read operation, each selected NOR-type flash nonvolatile memory cell would conduct approximately 20-40 μA to the bit line to the connected sense amplifier when reading a selected NOR-type flash nonvolatile memory cell. The remaining 1023 of (N−1) unselected NOR-type flash nonvolatile memory cells would have leakage of 10 μA creating the possibility of a read error or false read. In the worst-case, if each NOR-type flash nonvolatile memory cell conducts more than 10 μA, then the read operation will fail.

In the program operation, if each of the NOR-type flash nonvolatile memory cells has a low threshold voltage level VT0, each of the NOR-type flash nonvolatile memory cells will conduct approximately 1 μA leakage current when the bit line has approximately +5.0V applied to it and the source line has a voltage level that is approximately the ground reference voltage level (0.0V). Each bit line with a total of 1024 NOR-type flash nonvolatile memory cells could possibly conduct a leakage current of approximately 10 mA. If the total NOR-type flash nonvolatile memory array had NOR-type flash nonvolatile memory cells with the low threshold voltage level Vt0, then the total leakage current would 10 A. In normal program operation, each selected NOR-type flash nonvolatile memory cell on the selected bit line would only conduct approximately 100 μA per cell. As a result, the 1023 unselected NOR-type flash nonvolatile memory cell leakage of 10 mA and the program operation would fail, regardless of whether the program operation is a Channel-Hot-Electron program operation or a Fowler-Nordheim edge program operation.

SUMMARY OF THE INVENTION

An object of this invention is to provide an apparatus and method for reducing the sub-threshold total leakage current from all the unselected NOR-type flash nonvolatile memory cells connected to a bit line to a sub-threshold leakage current less than 1 μA.

Another object of this invention is to provide a row decoder circuit for selecting nonvolatile memory cells of an array of NOR connected nonvolatile memory cells for providing biasing conditions to word lines of the array of NOR connected nonvolatile memory cells for reading and programming the selected NOR connected nonvolatile memory cells while inhibiting bit line sub-threshold leakage current within the array.

Further, another object of this invention is to provide a source line decoder circuit for selecting and providing biasing conditions to source lines connected to the selected nonvolatile memory cells of an array of NOR connected nonvolatile memory cells for reading and programming the selected NOR connected nonvolatile memory cells while inhibiting source line sub-threshold leakage current within the array.

Still further, another object of this invention is to provide a column address decoder for selecting nonvolatile memory cells of an array of NOR connected nonvolatile memory cells and providing biasing conditions to bit lines of the array of NOR connected nonvolatile memory cells for reading and programming the selected NOR connected nonvolatile memory cells while inhibiting sub-threshold leakage current within the array.

To accomplish at least one of these objects, a nonvolatile memory device includes an array of nonvolatile memory cells arranged in rows and columns. The nonvolatile memory cells are connected into a NOR configuration where the nonvolatile memory cells located on each column are connected such that the drains of each of the nonvolatile memory cells are commonly connected to a local bit line associated with each column. The nonvolatile memory cells on each row have their gates commonly connected to a word line. The nonvolatile memory cells on two adjacent rows have their sources commonly connected to a source line. The array of nonvolatile memory cells is partitioned into sectors, where each sector is placed in an isolation well of a first impurity type. Each sector of the array of the nonvolatile memory cells is divided into blocks and each block is divided into pages. Each page includes one row of the nonvolatile memory cells connected to a word line.

The nonvolatile memory device has a row decoder that has a first block selector that activates when a block address indicates that a block is selected. The row decoder further includes a word line selector circuit, which based on a row address provides the word lines with word line operational voltages necessary for biasing the control gates of the nonvolatile memory cells for reading, programming, verifying, and erasing. The row decoder has a voltage level shifter for shifting a voltage level of a block select signal to activate pass gates to transfer the operational voltages to the word lines of the selected block for biasing the control gates of the nonvolatile memory cells of the block for reading, programming, verifying, and erasing the selected nonvolatile memory cells. The row decoder inhibits bit line and source line leakage current within the array by applying a word line read inhibit voltage and a word line program inhibit voltage to unselected word lines of the array.

The nonvolatile memory device has a source line decoder circuit that is connected to each source line within each block to transfer necessary source biasing voltages for reading, programming, verifying, and erasing selected nonvolatile memory cells to selected source lines. The source line decoder circuit has a second block selector circuit that when activated selects the block being addressed. The block selector circuit is connected to a source voltage level shifter that shifts the voltage level of the block selector signals for activating pass transistors to transfer the source line operational voltages to the source lines connected to the sources of the nonvolatile memory cells of the selected block for reading, programming, verifying, and erasing the selected nonvolatile memory cells. The source line decoder inhibits bit line and source line leakage currents within the array by applying a source line read inhibit voltage and a source line program inhibit voltage to unselected source lines of the array.

The nonvolatile memory device has a column decoder in communication with each local bit line for providing biasing voltages for reading, programming, verifying, and erasing selected nonvolatile memory cells while inhibiting bit line and source line leakage currents within the array. The row decoder, source line decoder, and column decoder provide inhibit biasing voltages to all the non-selected nonvolatile memory cells to minimize disturbances resulting from the reading, programming, verifying, and erasing selected nonvolatile memory cells.

For a slow read operation of a selected page of the array of nonvolatile memory cells, the row decoder transfers a single level cell program word line read biasing voltage to the word line of the selected nonvolatile memory cells for a single level cell program. The row decoder transfers a multiple level cell program read biasing voltage to the word line of the selected nonvolatile memory cells for a multiple level cell program. The row decoder further transfers the word line read inhibit voltage to the word lines of the unselected nonvolatile memory cells. The word read inhibit voltage has a magnitude that is sufficiently large to minimize sub-threshold leakage current from passing through unselected nonvolatile memory cells. The column decoder transfers a first bit line read biasing voltage to the drains of the selected nonvolatile memory cells. The column decoder provides a bit line read inhibit voltage to the unselected bit line and thus to the drains of unselected nonvolatile memory cells. The source line decoder transfers a source line biasing voltage to the source lines of the selected nonvolatile memory cells and transfers a source line read inhibit voltage to the source lines of unselected the nonvolatile memory cells. The source line read inhibit voltage is approximately equal to the bit line read biasing voltage to shift the programmed and erased threshold voltage of the unselected nonvolatile memory cells to minimize sub-threshold leakage current flowing in the unselected nonvolatile memory cells.

The single level cell program word line read voltage is the voltage level of the power supply voltage source (VDD) where the power supply voltage source is either +1.8V or +3.0V. The multiple level cell program word line read biasing voltage level is approximately +5.0V. The first bit line read biasing voltage level is approximately +1.0V and the source line biasing voltage level is approximately the ground reference voltage level. The word line read inhibit voltage level is approximately −2.0V. The bit line read inhibit voltage level is approximately the ground reference voltage level. The source line read inhibit voltage level is approximately +1.0V For a fast read operation of a selected page of the array of nonvolatile memory cells, the row decoder transfers a word line read biasing voltage to the word line of the selected nonvolatile memory cells for a single level cell program and multiple level cell program. The row decoder further transfers the word line read inhibit voltage to the word lines of the unselected nonvolatile memory cells. The word line read inhibit voltage has a magnitude that is sufficiently large to minimize sub-threshold leakage current from passing through unselected nonvolatile memory cells. The column decoder transfers the first bit line read biasing voltage to the bit lines and thus to the drains of the selected nonvolatile memory cells. The column decoder, further, provides a bit line read inhibit voltage to the unselected bit lines and thus to the drains of unselected nonvolatile memory cells. The source line decoder transfers a source line read biasing voltage to the source lines and thus to the sources of the selected nonvolatile memory cells. The source line decoder also transfers a source line read inhibit voltage to the source lines and thus to the sources of the unselected nonvolatile memory cells. The source line read inhibit voltage is approximately equal to the bit line read biasing voltage to shift the programmed and erased threshold voltage of the unselected nonvolatile memory cells to minimize sub-threshold leakage current flowing in the unselected nonvolatile memory cells.

The single level cell program word line read voltage level is the voltage level of the power supply voltage source (VDD) where the power supply voltage source is either +1.8V or +3.0V. The multiple level cell program word line read biasing voltage level is approximately +5.0V. The first bit line read biasing voltage level is approximately +1.0V and the source line biasing voltage level is approximately the ground reference voltage level. The word line read inhibit voltage level and the bit line read inhibit voltage level are approximately the ground reference voltage level. The source line read inhibit voltage level is approximately +1.0V For erasing a selected page, a selected block or a selected sector of the array of nonvolatile memory cells, the row decoder transfers a very high positive erase voltage to the word line of the selected nonvolatile memory cells and transfers a word line erase inhibit voltage to the word lines of the unselected nonvolatile memory cells of the selected block(s) to prevent disturbance of the unselected nonvolatile memory cells of the selected block(s). The row decoders of the unselected blocks of nonvolatile memory cells disconnect the word lines of the unselected nonvolatile memory cells of the unselected blocks so that the very high negative erase voltage is coupled from the isolation well of the first impurity type of the unselected block to the word lines of the unselected nonvolatile memory cells in unselected blocks to prevent disturbance of the unselected nonvolatile memory cells of the unselected block. The source line decoder transfers the very high negative erase voltage to the selected and unselected source lines. The very high negative erase voltage is applied to the isolation well of the first impurity type of the unselected blocks and the ground reference voltage level is transferred to the isolation well of the first impurity type of the selected blocks.

The magnitude of the voltage levels of the very high positive erase voltage and the very high negative erase voltage is approximately the breakdown voltage level of transistors forming the row decoder, column decoder, and the source line decoder. The voltage level of the very high positive erase voltage is from approximately +8.0V to approximately +10.0V and the voltage level of the very high negative erase voltage is from approximately −10.0V to approximately −8.0V. The voltage level of the word line erase inhibit voltage is approximately the ground reference voltage level for the unselected nonvolatile memory cells of the selected block(s) that is coupled from the isolation well by the row decoder disconnecting the unselected word lines such that they can float and allow the coupling of the ground reference voltage level for unselected nonvolatile memory cells of the selected block(s). With regards to the unselected nonvolatile memory cells of the unselected blocks, voltage level of the word line erase inhibit voltage is approximately the very high negative erase voltage that is coupled from the isolation well by the row decoder disconnecting the unselected word lines of the unselected blocks such that they can float and allow the coupling of the very high negative erase voltage to the unselected nonvolatile memory cells of the unselected blocks.

For verifying an erase of a selected page, selected blocks or selected sectors of the array of nonvolatile memory cells, the row decoder transfers a voltage level of a lower boundary of an erased threshold voltage level to the word line or word lines of the selected nonvolatile memory cells. The row decoder further transfers a word line verify inhibit voltage to the word lines of the unselected nonvolatile memory cells. The column decoder transfers a second bit line read biasing voltage to the bit lines and thus to the drains of the selected nonvolatile memory cells. The source line decoder transfers the source line read biasing voltage to the source lines and thus to the sources of the selected nonvolatile memory cells and transfers a source line read inhibit voltage to the source lines and thus to the sources of the unselected nonvolatile memory cells to minimize sub-threshold leakage current.

The lower boundary of an erased threshold voltage level is approximately +5.0V for the single level cell program and the multiple level cell programming. The voltage level of the second bit line read biasing voltage is approximately the voltage level of the power supply voltage source less a threshold voltage of an NMOS transistor where the power supply voltage source is either +1.8V or +3.0V. The bit line is pre-charged to the voltage level of the second bit line read biasing voltage. The pre-charged level of the second bit line read biasing voltage level is discharged to approximately 0.0V if the memory cell has not been successfully erased to the erased threshold voltage level and remains to be lower than the lower boundary of the erased threshold voltage level. If the nonvolatile memory cells have been successfully erased, the pre-charged level of the second bit line read biasing voltage level will be maintained when the threshold voltage of the successfully erased nonvolatile memory cells is greater than the lower boundary of the erased threshold voltage level. The source line read biasing voltage level is approximately the ground reference voltage level. The voltage level of the source line read inhibit voltage is approximately +1.0V.

In other embodiments, a method for operating an array includes steps for providing the operating conditions for slow reading, fast reading, page erasing, block erasing, sector erasing, page erase verifying, block erase verifying, sector erase verifying, page programming, and page program verifying of selected nonvolatile memory cells of the array of nonvolatile memory cells.

For the step of slow reading a selected page of the array of nonvolatile memory cells, a single level cell program word line read biasing voltage level is applied to the word line of the selected nonvolatile memory cells for a single level cell program. A multiple level cell program read biasing voltage is applied to the word line of the selected nonvolatile memory cells for a multiple level cell program. A word line read inhibit voltage is applied to the word lines of the unselected nonvolatile memory cells. The word line read inhibit voltage has a magnitude that is sufficiently large to minimize sub-threshold leakage current from passing through unselected nonvolatile memory cells. A first bit line read biasing voltage is applied to the drains of the selected nonvolatile memory cells. A bit line read inhibit voltage is applied to the unselected bit line and thus to the drains of unselected nonvolatile memory cells. A source line biasing voltage is applied to the source lines of the selected nonvolatile memory cells and a source line read inhibit voltage is applied to the source lines of unselected the nonvolatile memory cells. The source line read inhibit voltage is approximately equal to the first bit line read biasing voltage to shift the programmed and erased threshold voltage level of the unselected nonvolatile memory cells to minimize sub-threshold leakage current flowing in the unselected nonvolatile memory cells.

The single level cell program word line read voltage level is the voltage level of the power supply voltage source (VDD) where the power supply voltage source is either +1.8V or +3.0V. The multiple level cell program word line read biasing voltage level is approximately +5.0V. The first bit line read biasing voltage level is approximately +1.0V and the source line biasing voltage level is approximately the ground reference voltage level. The word line read inhibit voltage level is approximately −2.0V. The bit line read inhibit voltage level is approximately the ground reference voltage level. The source line read inhibit voltage level is approximately +1.0V For a the step of fast read operation of a selected page of the array of nonvolatile memory cells, a word line read biasing voltage level is applied to the word line of the selected nonvolatile memory cells for a single level cell program and multiple level cell program. A word line read inhibit voltage is applied to the word lines of the unselected nonvolatile memory cells that has a magnitude that is sufficiently large to minimize sub-threshold leakage current from passing through unselected nonvolatile memory cells. A first bit line read biasing voltage is applied to the drains of the selected nonvolatile memory cells. A bit line read inhibit voltage is applied to the unselected bit line and thus to the drains of unselected nonvolatile memory cells. A source line read biasing voltage is applied to the source lines of the selected nonvolatile memory cells and a source line read inhibit voltage is applied to the source lines of unselected the nonvolatile memory cells. The source line read inhibit voltage is approximately equal to the first bit line read biasing voltage to shift the programmed and erased threshold voltage level of the unselected nonvolatile memory cells to minimize sub-threshold leakage current flowing in the unselected nonvolatile memory cells.

The single level cell program word line read voltage has an amplitude that is the voltage level of the power supply voltage source (VDD) where the power supply voltage source is either +1.8V or +3.0V. The multiple level cell program word line read biasing voltage level is approximately +5.0V. The first bit line read biasing voltage level is approximately +1.0V and the source line read biasing voltage level is approximately the ground reference voltage level. The word line read inhibit voltage level and the bit line read inhibit voltage level are approximately the ground reference voltage level. The source line read inhibit voltage level is approximately +1.0V For the step of erasing a selected page, a selected block or a selected sector of the array of nonvolatile memory cells, a very high positive erase voltage is applied to the word line of the selected nonvolatile memory cells and transfers a word line erase inhibit voltage to the word lines of the unselected nonvolatile memory cells in the selected block to prevent disturbance of the unselected nonvolatile memory cells. The word lines of the unselected nonvolatile memory cells of the unselected block are disconnected so that the very high negative erase voltage is coupled from the isolation well of the first impurity type to the word lines of the unselected nonvolatile memory cells in unselected blocks to prevent disturbance of the unselected nonvolatile memory cells of the unselected block. The very high negative erase voltage is applied to the selected and unselected source lines. The very high negative erase voltage is applied to the isolation well of the first impurity type for sectors containing selected nonvolatile memory cells.

The magnitude of the voltage levels of the very high positive erase voltage and the very high negative erase voltage is approximately the breakdown voltage level of transistors forming the row decoder, column decoder, and the source line decoder. The voltage level of the very high positive erase voltage is from approximately +8.0V to approximately +10.0V and the voltage level of the very high negative erase voltage is from approximately −8.0V to approximately −10.0V. The voltage level of the word line erase inhibit voltage is approximately the ground reference voltage level for the unselected nonvolatile memory cells of the selected block(s) that is coupled from the isolation well by disconnecting the unselected word lines such that they can float and allow the coupling of the ground reference voltage level to unselected nonvolatile memory cells of the selected block(s) to prevent disturbance of the unselected memory cells of the selected block(s). With regards to the unselected nonvolatile memory cells of the unselected blocks, voltage level of the word line erase inhibit voltage is approximately the very high negative erase voltage that is coupled from the isolation well by the row decoder disconnecting the unselected word lines of the unselected blocks such that they can float and allow the coupling of the very high negative erase voltage to the unselected nonvolatile memory cells of the unselected blocks to prevent disturbance of the unselected nonvolatile memory cells of the unselected blocks.

For verifying an erase of a selected page, a selected block or a selected sector of the array of nonvolatile memory cells, a voltage level of a lower boundary of an erased threshold voltage level is applied to the word line or word lines of the selected nonvolatile memory cells. A word line verify inhibit voltage is applied to the word lines of the unselected nonvolatile memory cells in the selected and unselected blocks. A second bit line read biasing voltage is applied to the drains of the selected nonvolatile memory cells. The source line read biasing voltage is applied to the source lines of the selected nonvolatile memory cells and a source line read inhibit voltage is applied to the source lines of the unselected nonvolatile memory cells to minimize sub-threshold leakage current.

The lower boundary of an erased threshold voltage level is approximately +5.0V for the single level cell program and the multiple level cell programming. The voltage level of the second bit line read biasing voltage is approximately the voltage level of the power supply voltage source less a threshold voltage of an NMOS transistor where the power supply voltage source is either +1.8V or +3.0V. The bit line is pre-charged to the voltage level of the second bit line read biasing voltage. The pre-charged level of the second bit line read biasing voltage is discharged to approximately 0.0V if the memory cell has not been successfully erased to the erased threshold voltage level and remains to be lower than the lower boundary of the erased threshold voltage level. If the nonvolatile memory cells have been successfully erased, the pre-charged level of the second bit line read biasing voltage will be maintained when the threshold voltage of the successfully erased nonvolatile memory cells is greater than the lower boundary of the erased threshold voltage level. The source line read biasing voltage level is approximately the ground reference voltage level. The voltage level of the source line read inhibit voltage is approximately +1.0V.

BRIEF DESCRIPTION OF THE DRAWINGS

FIG. 1$b$ is a cross sectional view of a single transistor floating-gate NMOS NOR flash cell of the prior art.

FIG. 1$c$ is a schematic diagram of a single transistor floating-gate NMOS NOR flash cell of the prior art.

FIG. 1$d$ is a graph of two threshold voltage distributions of a single transistor floating-gate NMOS NOR flash cell having a positive erase level and a single positive program level of the prior art.

FIG. 1$e$ is a graph of four threshold voltage distributions of a single transistor floating-gate NMOS NOR flash cell having a positive erase level and three positive program levels of the prior art.

FIG. 2$b$ is a top plan layout view of a two one-transistor of floating-gate transistor NMOS NOR flash cells.

FIG. 2$c$ is a cross sectional view of a two one-transistor floating-gate transistor NMOS NOR flash cells.

FIG. 2$d$-1 is a plot of two threshold voltage distributions of a floating-gate transistor NMOS NOR flash cell having a positive program level and a single positive erase level of a single level cell program of a first implementation embodying the principles of the present invention.

FIG. 2$d$-2 is a plot of two threshold voltage distributions of the floating-gate transistor NMOS NOR flash cell having a positive program level and a single positive erase level of a second implementation embodying the principles of the present invention.

FIG. 2$e$1 is a plot of four threshold voltage distributions of a floating-gate transistor NMOS NOR flash cell having a positive erase level and three positive program levels of a multiple level cell program of the implementation embodying the principles of the present invention.

FIG. 2$e$-2 is a plot of four threshold voltage distributions of a floating-gate transistor NMOS NOR flash cell having a positive erase level and three positive program levels of the multiple level cell program of the second implementation embodying the principles of the present invention.

FIG. 2$f$-1 is a plot of two threshold voltage distributions of a floating-gate transistor NMOS NOR flash cell having a positive program level and a single positive erase level shifted while biasing the source line to a voltage level of approximately +1.0V of the single level cell program of the first implementation.

FIG. 2$f$-2 is a plot of two threshold voltage distributions of a floating-gate transistor NMOS NOR flash cell having a positive program level and a single positive erase level shifted while biasing the source line to a voltage level of approximately +1.0V of the single level cell program of the second implementation.

FIG. 2$g$-1 is a plot of four threshold voltage distributions of a floating-gate transistor NMOS NOR flash cell having a positive erase level and three positive program levels shifted while biasing the source line to a voltage level of approximately +1.0V of the multiple level cell program of the first implementation.

FIG. 2$g$-2 is a plot of four threshold voltage distributions of a floating-gate transistor NMOS NOR flash cell having a positive erase level and three positive program levels shifted while biasing the source line to a voltage level of approximately +1.0V of the multiple level cell program of the second implementation.

FIG. 13a is a table illustrating the voltage conditions applied to an array of a NMOS NOR flash floating-gate transistor cells having single level cell programmed cells (SLC) embodying the principles of the present invention.

FIG. 13b is a table illustrating the voltage conditions applied to an array of a NMOS NOR flash floating-gate transistor cells having multiple-level cell programmed cells (MLC) embodying the principles of the present invention.

FIG. 14a is a table illustrating the voltage conditions applied to row decoder of FIG. 6 for the NOR flash nonvolatile memory device having single level cell programmed cells (SLC) embodying the principles of the present invention.

FIG. 14b is a table illustrating the voltage conditions applied the to row decoder of FIG. 6 for the NOR flash nonvolatile memory device for NOR flash nonvolatile memory device having multiple-level cell programmed cells (MLC) embodying the principles of the present invention.

FIG. 15 is a table illustrating the voltage conditions applied to the source line decoder of FIG. 8 for the NOR flash nonvolatile memory device embodying the principles of the present invention.

DETAILED DESCRIPTION OF THE INVENTION

Figures 1A, 1C:
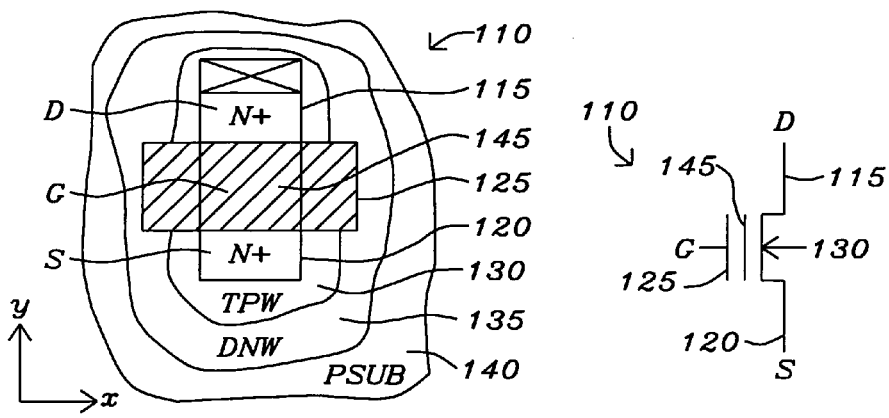
FIG. 1$a$ is a top plan layout view of a single transistor floating-gate NMOS NOR flash cell of the prior art.
Figure 1B:
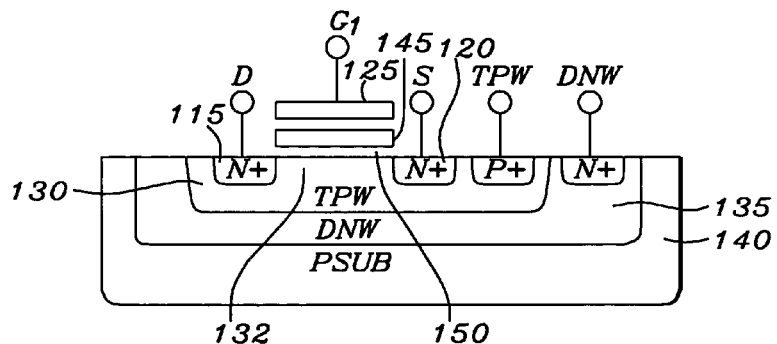

FIG. 1a is a top plan view of a NMOS NOR flash floating-gate transistor 110. FIG. 1b is a cross sectional view NMOS NOR flash floating-gate transistors 110 FIG. 1c is the schematic symbol NMOS NOR flash floating-gate transistors 110. The floating-gate type NMOS NOR flash cell 110 is formed in the top surface of a P-type substrate 140. An N-type material is diffused into the surface of the P-type substrate 140 to form a deep N-well 135. A P-type material is then diffused into the surface of the deep N-well 135 to form a P-well 130 (commonly referred to as a triple P-well). The N-type material is then diffused into the surface of a P-type well 130 to form the drain (D) 115 and the self-aligned source (S) 120. A first polycrystalline silicon layer is formed above the bulk region of the P-type well 130 between the drain region 115 and the source region 120 to form the floating gate 145. A second polycrystalline silicon layer is formed over the floating gate 145 to create a control gate (G) 125 of the NMOS NOR flash floating-gate transistors 110. The self-aligned source 120 is formed self-aligned between two adjacent second polycrystalline silicon layers of two control gates 125 of a pair of NMOS NOR flash floating-gate transistors 110. The self-aligned source 120 is commonly used in NMOS NOR flash floating-gate transistors 110 to reduce the source line pitch.

The gate length of the NMOS NOR flash floating-gate transistors 110 is the channel region 132 in the bulk region of P-type well 130 between drain region 115 and the source region 120. The NMOS NOR flash floating-gate transistor's 110 channel width is determined by the width of the N-diffusion of the drain 115 and the source 120. The typical unit size of the NMOS NOR flash floating-gate transistors 110 is about $10\lambda^2$ to $12\lambda^2$.

The floating-gate layer 145 stores electron charges to modify the threshold voltage of the NMOS NOR flash floating-gate transistors 110. In all operations, the P-type substrate 140 is connected to a ground reference voltage source (GND). The deep N-well 135 is connected to the power supply voltage source (VDD) in read and program operations but around +10.0V in the Fowler-Nordheim channel erase operation. In present designs of NMOS NOR flash floating-gate transistors 110, the power supply voltage source is either 1.8V or 3.0V. The triple P-type well 130 is connected to the ground reference voltage in normal read and program operation but to the +10.0V during erase operation. In other words, during the Fowler-Nordheim channel erase operation, both the deep N-well 135 and the triple P-well 130 are biased with the same voltage of approximately +10.0V to avoid forward leakage current through the P/N junction through the deep N-well 135 and the triple P-130.

In an array of NMOS NOR flash floating-gate transistors 110, the NMOS NOR flash floating-gate transistors 110 are arranged in rows and columns. The second polycrystalline silicon layer 125 that is the control gate of the NMOS NOR flash floating-gate transistors 110 is extended to form a word-line that connects to each of the NMOS NOR flash floating-gate transistors 110 on a row of the array.

A tunnel oxide 150 is formed on top of the channel region 132 between the drain region 115 and the source region 120 and the floating-gate 145. The thickness of the tunnel oxide 150 typically 100 Å. The tunnel oxide 150 is the layer through which the electron charges pass during the high current channel-hot-electron programming and low current Fowler-Nordheim channel erasing. In a traditional NOR operation, Fowler-Nordheim channel erasing expels stored electrons from the floating-gate 145 through the tunnel oxide 150 to cell's channel region 132 into the triple P-type well 130.

After an erase operation, fewer electron charges are stored in the floating-gate 145 that results in a decrease in the NMOS NOR flash floating-gate transistor's 110 first threshold voltage level (Vt0) to less than approximately 2.5V. In contrast, in a channel-hot-electron program operation, electrons are attracted into floating-gate 145 so that the NMOS NOR flash floating-gate transistor's 110 second threshold voltage level (Vt1) is set to the voltage greater than approximately 4.0V. The distributions of the first threshold voltage level (Vt0) for an erased state with a wide distribution and the second threshold voltage level (Vt1) for a programmed state with a narrow distribution are set to be positive to avoid any false reading induced by the NMOS NOR flash floating-gate transistors 110 having a negative threshold voltage level.

Figure 1D:
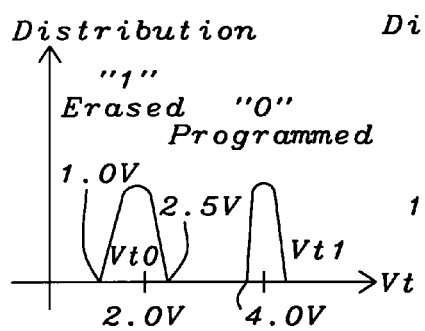

FIG. 1*d* is a graph of two threshold voltage distributions of a single transistor floating-gate NMOS NOR flash cell having a single level cell program. After an erase operation, there are fewer electron charges in the floating-gate 145 that result in lowering the threshold voltage of the NMOS NOR flash floating-gate transistors 110. Normally, the erased NMOS NOR flash floating-gate transistors 110 has a maximum value of its threshold voltage set to approximately +2.5V. In contrast, in channel-hot-electron-programming, electrons are attracted to the floating-gate 145 so that threshold voltage of the NMOS NOR flash floating-gate transistors 110 is increased to a minimum value voltage level of approximately +4.0V. By convention, the erased voltage threshold (Vt0) value of approximately +2.5V is designated as a logical data value of "1" and the programmed voltage threshold (Vt1) of +4.0V is designated as a logical data value of "0". The NMOS NOR flash floating-gate transistors 110 store a single bit of data is referred to as a single-bit-one-transistor NMOS NOR flash floating-gate cell (1b1T).

Figure 1E:
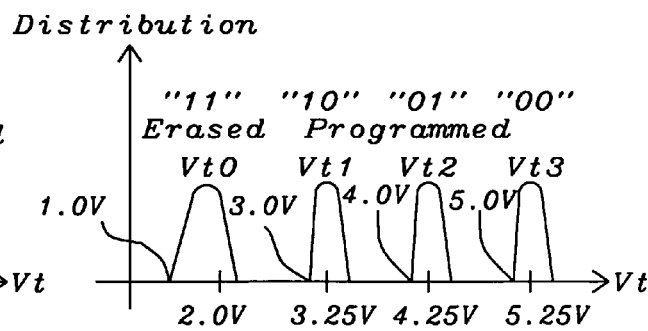

FIG. 1*e* is a graph of four threshold voltage distributions of a single transistor floating-gate NMOS NOR flash cell having one erase level and three program levels. It is known in the art that by varying the program conditions more than two threshold voltage levels can be created based on the quantity of charge placed on the floating-gate 145 of the NMOS NOR flash floating-gate transistors 110. This is commonly referred to multiple level cell programming of a NMOS NOR flash floating-gate cell. In this example, there are four threshold voltage levels that can be programmed to the NMOS NOR flash floating-gate transistors 110. The least positive wide-distribution threshold voltage level Vt0 is the erased voltage level with a maximum value of +2.5V for storing a logical data value of "11". The three positive narrow-distribution programmed voltage threshold voltage levels are set to be sufficiently spaced apart to allow accurate detection. In the present example, the first of the three positive voltage threshold levels Vt1 has a nominal value of approximately +3.25V for storing a logical data value "10". The second of the three voltage positive threshold levels Vt2 has a nominal value of approximately +4.25V for storing a logical data value "01". The third of the three positive voltage threshold level Vt3 has a nominal value of approximately +5.25V for storing a logical data value "00". Since each NMOS NOR flash floating-gate transistor 110 stores four distinctive positive threshold voltage states, each NMOS NOR flash floating-gate transistor 110 stores two bits binary data and is referred to as a two-bit-one-transistor NMOS NOR flash cell (2b/1T).

The nominal values of threshold voltages Vt1 and Vt2 of the NMOS NOR flash floating-gate transistors 110 may vary by more than 1.0V among different designs. The nominal values of threshold voltages Vt0 and Vt3 can have a wider threshold voltage distribution. For example, the threshold voltage Vt0 is may vary from approximately 1.0V to approximately 2.5V. The threshold voltage Vt3 can have much wider distribution. It must have a voltage greater than approximately 4.5V to ensure that the NMOS NOR flash floating-gate transistors 110 is in a non-conduction state. The assigned designations of 2-bit data states for four threshold voltage states may also vary between NMOS NOR flash floating-gate cell designs as described above in the NMOS NAND flash floating-gate cell.

Figure 2A:
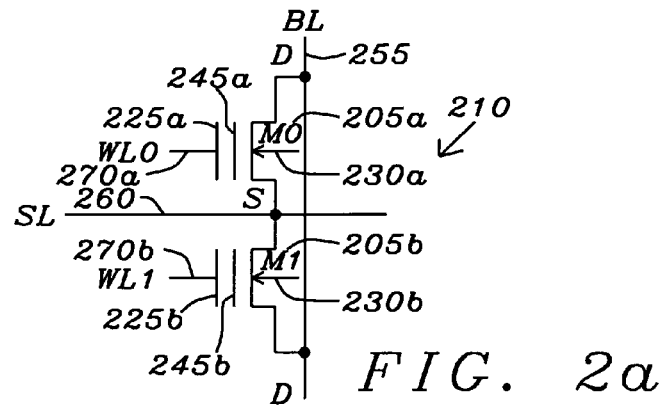
FIG. 2$a$ is a schematic diagram of a two one-transistor floating-gate transistor NMOS NOR flash cells.
Figure 2B:
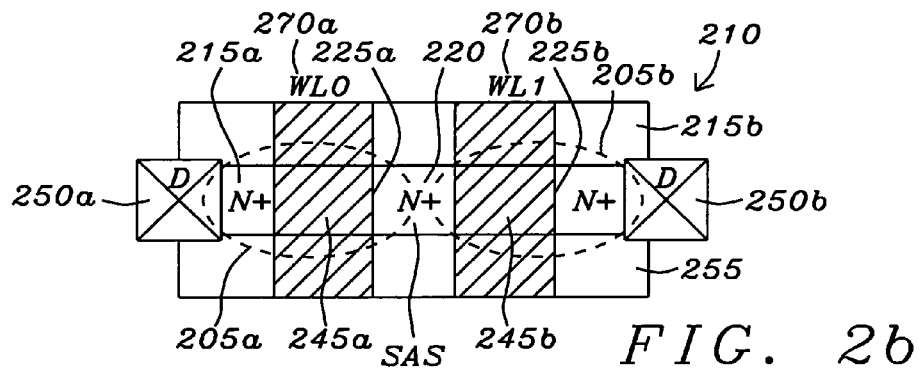
Figure 2C:
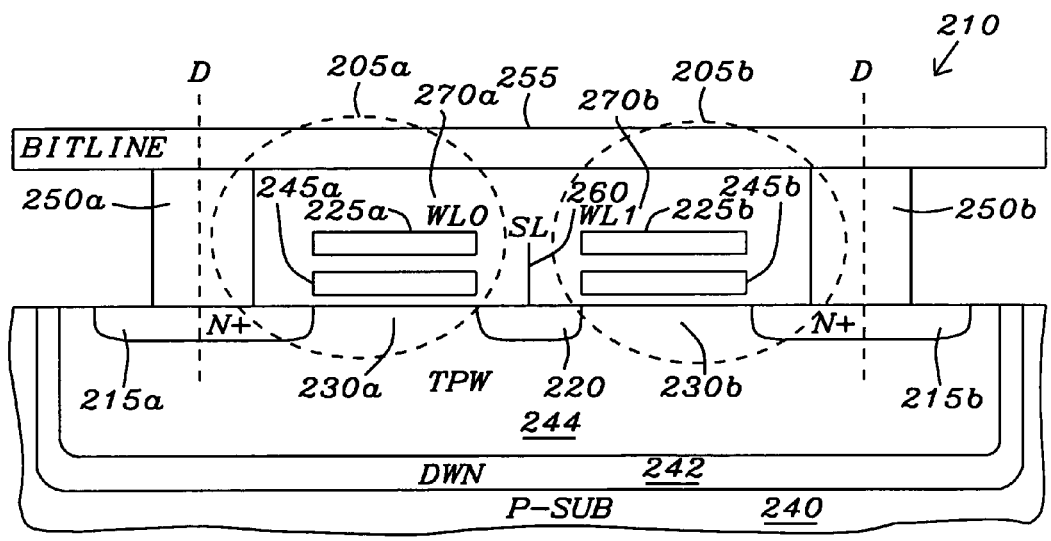

FIG. 2*a* is a schematic diagram of two one-transistor floating-gate NMOS NOR flash cells. FIG. 2*b* is a top plan layout view of two one-transistor floating-gate NMOS NOR flash cells. FIG. 2*c* is a cross sectional view of a two one-transistor floating-gate NMOS NOR flash cell. The two one-transistor floating-gate NMOS NOR flash cell 210 is formed in a P-type well TPW 244 within a deep N-well DNW 242 that are formed in the top surface of a P-type substrate 240. An N-type material is then diffused into the surface of the P-type well TPW 240 to form the drains (D) 215*a* and 215*b* of the two NMOS NOR floating gate transistors 205*a* and 205*b* and the self-aligned source (S) 220. The self-aligned source (S) 220 is shared by the two NMOS NOR floating gate transistors 205*a* and 205*b*. A first polycrystalline silicon layer is formed over the bulk regions 230*a* and 230*b* between the drain regions 215*a* and 215*b* and the self-aligned source region 220 to form the floating gates 245*a* and 245*b*. A second polycrystalline silicon layer is formed over the floating gates 245*a* and 245*b* to create the control gates (G) 225*a* and 225*b* of the floating-gate transistors 205*a* and 205*b*. The self-aligned source 220 is formed self-aligned between two adjacent second polycrystalline silicon layers of two control gates 225*a* and 225*b* of a pair of NMOS NOR two floating gate transistors 205*a* and 205*b*. The self-align source 220 is commonly used in NMOS NOR flash floating-gate transistors 210 to reduce the source line pitch. The drain regions 215*a* and 215*b* each have a metal contact 250*a* and 250*b*.

Each of the control gates control gates 225*a* and 225*b* are connected to word lines 270*a* and 270*b*. The word lines 270*a* and 270*b* connecting each of the control gates 225*a* and 225*b* of the floating gate transistors 205*a* and 205*b* located on a row of an array of the NMOS NOR floating gate transistors 205*a* and 205*b*. The two metal contacts 250*a* and 250*b* are connected to and shorted by a common metal bit line 255. The self-aligned source (S) 220 is connected to source line 260. Having the sources 220 and drains 215*a* and 215*b* of each pair of the NMOS NOR flash floating-gate transistors 210 connected together places the devices essentially in parallel.

Figures 1, 2D:
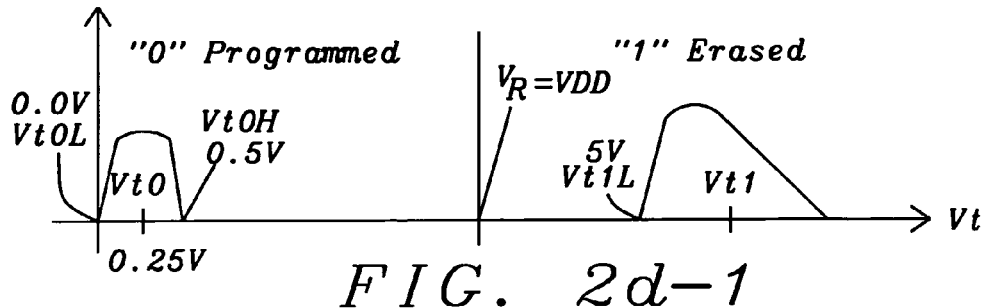

FIG. 2*d*-1 is a plot of two threshold voltage distributions of a floating-gate transistor NMOS NOR flash cell having a first implementation of a positive program level and a single positive erase level of a single level cell program. In the NMOS NOR floating gate transistors 205*a* and 205*b* of FIG. 2*a*, either the drains (D) 215*a* and 215*b* or source line 260 is connected to a voltage level of approximately the ground reference voltage level (0.0V) and the P-type well TPW 244 is also biased voltage level of approximately the ground reference voltage level (0.0V). The programmed threshold voltage level Vt0 is the programmed state for a datum of a logical "0" and the erased threshold voltage level Vt1 is the erased state for a datum of a logical "1". The programmed threshold voltage level Vt0 is accomplished employing a Fowler-Nordheim edge tunneling programming operation and the erased threshold voltage level Vt1 is accomplished employing a Fowler-Nordheim channel tunneling erase operation. The low and narrow programmed threshold voltage level Vt0 is the result of a bit-by-bit and iterative program operation such that programmed threshold voltage level Vt0 can be easily be controlled. The low and narrow programmed threshold voltage level Vt0 distribution achieves a fast, low-voltage VDD read operation without a boosted word line voltage. The high positive erased threshold voltage level Vt1 has a wide threshold voltage distribution with a lower boundary Vt1L that is larger than approximately +5.0V. The low positive narrow programmed threshold voltage level Vt0 has a distribution ranging from a lower boundary Vt0L of approximately 0.0V to an upper boundary Vt0H of approximately +0.5V and nominal value of the programmed threshold voltage level Vt0 is approximately +0.25V. Each of the NMOS NOR floating gate transistors 205a and 205b that have two threshold voltage levels are each referred to as being a single level cell program cell (SLC). The read voltage level, VR is used to distinguish between the programmed threshold voltage level Vt0 that stores the logical "0" and the erased threshold voltage level Vt1 that stores the logical "1" is set to approximately the voltage level of the power supply voltage source VDD to accomplish a read with out having a boosted read voltage level.

Figures 2, 2D:
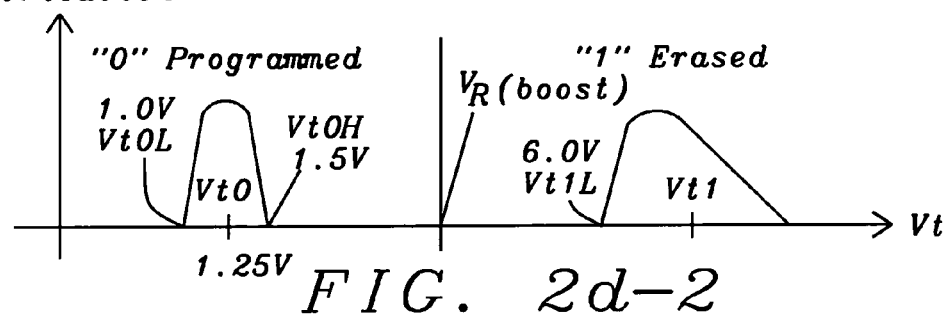
Figures 1, 2E:
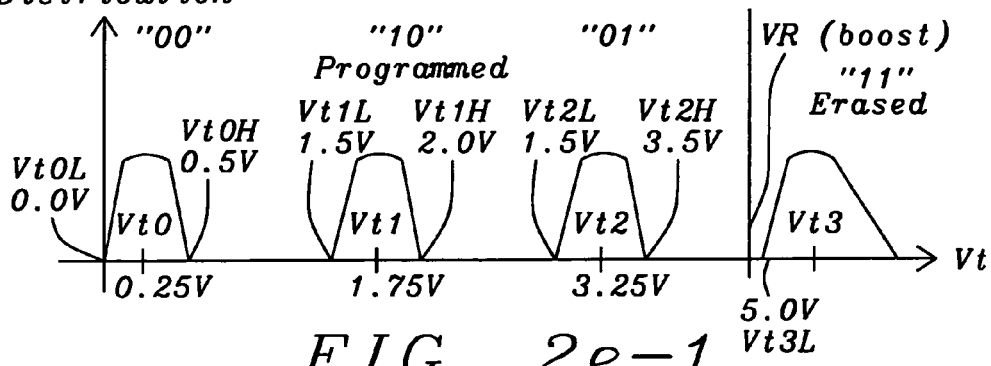
Figures 2, 2E:
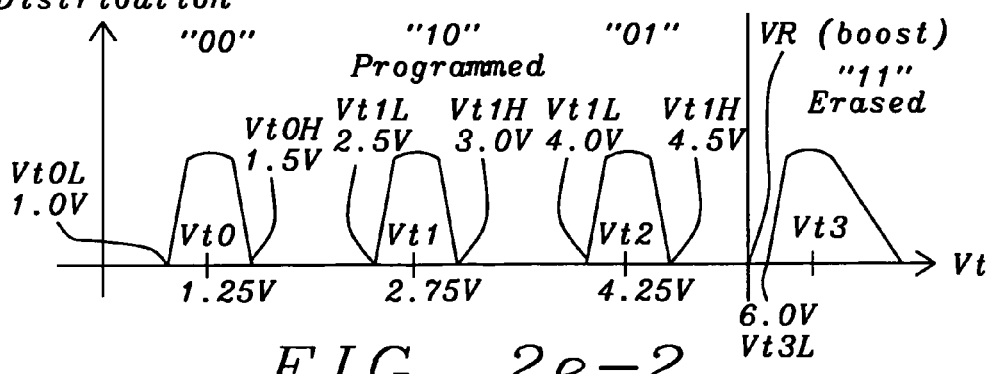
Figures 1, 2F:
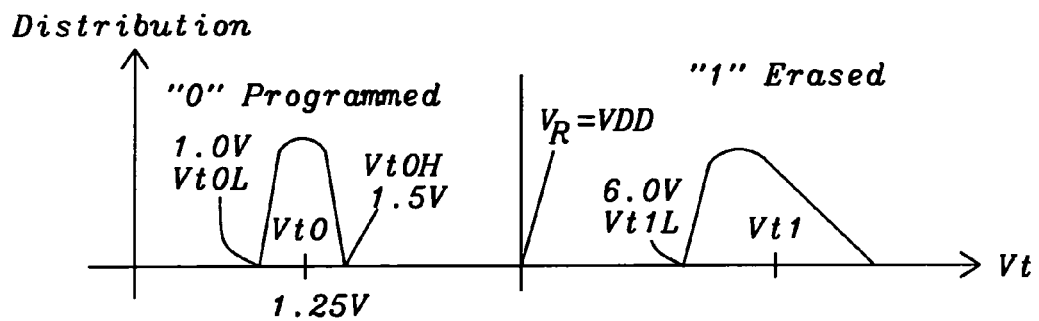
Figures 2, 2F:
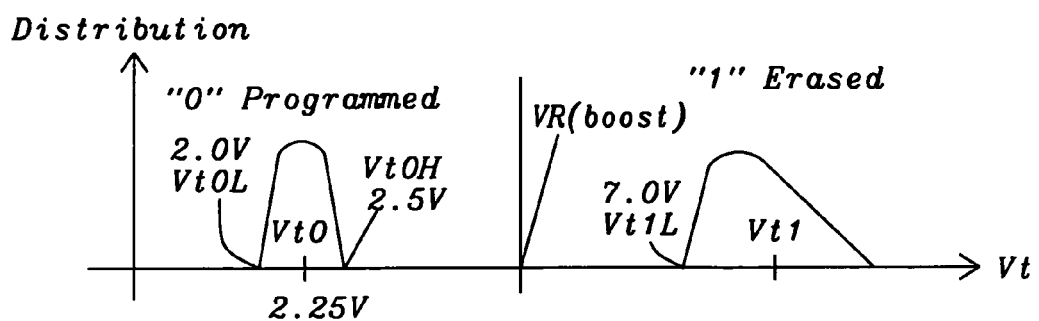

FIGS. 2f-1 illustrates a the first threshold voltage distribution of the NMOS NOR floating gate transistors 205a and 205b of FIG. 2d-1 when both the drains (D) 215a and 215b and the source line 260 are connected to approximately the read biasing voltage of approximately +1.0V and the P-type well TPW 244 is biased at the voltage level of approximately the ground reference voltage level (0.0V). Because the drains (D) 215a and 215b and sources 220 of the NMOS NOR floating gate transistors 205a and 205b are biased at approximately the read bias voltage level of approximately 1.0V, the threshold voltage levels of the NMOS NOR floating gate transistors 205a and 205b are shifted in positive direction of approximately 1.0V. The nominal value of the programmed threshold voltage level Vt0 of approximately +0.25V shifts to a new nominal value of approximately +1.25V plus with a threshold voltage variation generated from body effect. The lower boundary Vt1L of the erased threshold voltage level Vt1 that is larger than approximately +5.0V shifts to a threshold voltage level of approximately +6.0V. The programmed threshold voltage level Vt0 shift of +1.0V is occurs in the NMOS NOR floating gate transistors 205a and 205b that are connected the selected bit lines in the read operation.

FIG. 2d-2 is a plot of two threshold voltage distributions of a floating-gate transistor NMOS NOR flash cell having a second implementation of a positive program level and a single positive erase level of a single level cell program. In the NMOS NOR floating gate transistors 205a and 205b of FIG. 2a, either the drains (D) 215a and 215b or source line 260 is connected to a voltage level of approximately the ground reference voltage level (0.0V) and the P-type well TPW 244 is also biased voltage level of approximately the ground reference voltage level (0.0V). The programmed threshold voltage level Vt0 is the programmed state for a datum of a logical "0" and the erased threshold voltage level Vt1 is the erased state for a datum of a logical "1". The programmed threshold voltage level Vt0 is accomplished employing a Fowler-Nordheim edge tunneling programming operation and the erased threshold voltage level Vt1 is accomplished employing a Fowler-Nordheim channel tunneling erase operation. The low and narrow programmed threshold voltage level Vt0 is the result of a bit-by-bit and iterative program operation such that programmed threshold voltage level Vt0 can be easily be controlled. The low and narrow programmed threshold voltage level Vt0 distribution achieves a fast, low-voltage VDD read operation without a boosted word line voltage. The high positive erased threshold voltage level Vt1 has a wide threshold voltage distribution with a lower boundary Vt1L that is larger than approximately +6.0V. The low positive narrow programmed threshold voltage level Vt0 has a distribution ranging from a lower boundary Vt0L of approximately +1.0V to an upper boundary Vt0H of approximately +1.5V and nominal value of the programmed threshold voltage level Vt0 is approximately +1.25V. Each of the NMOS NOR floating gate transistors 205a and 205b that have two threshold voltage levels are referred to as being a single level cell program (SLC). The read voltage level, VR is used to distinguish between the programmed threshold voltage level Vt0 that stores the logical "0" and the erased threshold voltage level Vt1 that stores the logical "1" is set to approximately the voltage level of the power supply voltage source VDD to accomplish a read without having a boosted read voltage level.

FIGS. 2f-2 illustrates a the first threshold voltage distribution of each of the NMOS NOR floating gate transistors 205a and 205b of FIG. 2d-2 when both the drains (D) 215a and 215b and the source line 260 are connected to the read biasing voltage of approximately +1.0V and the P-type well TPW 244 is biased at the voltage level of approximately the ground reference voltage level (0.0V). Because the drains (D) 215a and 215b and sources 220 of the NMOS NOR floating gate transistors 205a and 205b are biased at the read bias voltage level of approximately 1.0V, the threshold voltage level of the NMOS NOR floating gate transistors 205a and 205b are shifted in positive direction of approximately 1.0V. The nominal value of the programmed threshold voltage level Vt0 of approximately +1.25V shifts to a new nominal value of approximately +2.25V plus with a threshold voltage variation generated from body effect. The lower boundary Vt1L of the erased threshold voltage level Vt1 shifts from the threshold voltage level of approximately +7.0V to a threshold voltage level of approximately +6.0V. The programmed threshold voltage level Vt0 shift of +1.0V occurs in the NMOS NOR floating gate transistors 205a and 205b that are connected the selected bit lines in the read operation.

If the threshold voltage level of the unselected NMOS NOR floating gate transistors 205a and 205b in the selected word line 225a or 225b are lower than the read biasing voltage level VR, then the drains (D) 215a and 215b of the unselected NMOS NOR floating gate transistors 205a and 205b in the unselected bit lines 255 would be discharged to the voltage level of approximately the ground reference voltage level (0.0V). Therefore the unselected NMOS NOR floating gate transistors 205a and 205b connected to the unselected bit lines 255 would not be shifted the same voltage as the source bias voltage (approximately +1.0V) because all NMOS NOR floating gate transistors 205a and 205b and sources 220 of the unselected NMOS NOR floating gate transistors 205a and 205b in the unselected bit lines 255 are biased to a voltage level of approximately +1.0V. The drains (D) 215a and 215b of the unselected NMOS NOR floating gate transistors 205a and 205b are connected to voltage level of approximately the ground reference voltage level (0.0V) with sources 220 are connected to the source line source inhibit biasing voltage of approximately +1.0V. Since one of drains (D) 215a and 215b and sources 220 is connected to the voltage level of approximately the ground reference voltage level (0.0V), therefore the threshold voltage of the NMOS NOR floating gate transistors 205a and 205b is not shifted up by source inhibit biasing voltage of approximately +1.0V.

FIG. 2e-1 is a plot of four threshold voltage distributions of a floating-gate transistor NMOS NOR flash cell having a first implementation of a positive erase level and three positive program levels of a multiple level with the sources 220 or drains (D) 215a and 215b and "P-type well TPW 244 biased to the voltage level of approximately the ground reference voltage level (0.0V). It should be noted that when the drains (D) 215a and 215b of the NMOS NOR floating gate transistors 205a and 205b are connected to the voltage level of approximately the ground reference voltage level (0.0V), the threshold voltage levels are the same as when the sources 220 are connected to the voltage level of approximately the ground reference voltage level (0.0V) because NMOS NOR floating gate transistors 205a and 205b have symmetrical characteristics. As long as one of drains (D) 215a and 215b or sources 220 of the NMOS NOR floating gate transistors 205a and 205b are connected to the voltage level of approximately the ground reference voltage level (0.0V), then the threshold voltage levels of the NMOS NOR floating gate transistors 205a and 205b are as shown in FIG. 2e-1.

The multiple level cell program of the NMOS NOR floating gate transistors 205a and 205b includes a high, wide, positive erased threshold voltage level Vt3 that stores a datum representing a digital "11". The lower boundary of the erased threshold voltage level Vt3 is approximately +5.0V. The narrow third programmed threshold voltage level Vt2 stores a datum representing a logical "01". The third narrow programmed threshold voltage level Vt2 has a distribution that varies by approximately 0.5V with a nominal value of +3.25V such that the lower boundary Vt2L of the third programmed threshold voltage level Vt2 is approximately +3.0V and the upper boundary Vt2H of the third programmed threshold voltage level Vt2 is approximately +3.5V. The second narrow programmed threshold voltage level Vt1 stores a datum representing a logical "10". The second narrow programmed threshold voltage level Vt1 has a distribution that varies by approximately 0.5V with a nominal value of +1.75V such that the lower boundary Vt1L of the second programmed threshold voltage level Vt1 is approximately +1.5V and the upper boundary Vt1H of the second programmed threshold voltage level Vt1 is approximately +2.0V. The narrow third programmed threshold voltage level Vt0 stores a datum representing a logical "00". The third narrow programmed state Vt0 has a distribution that varies by approximately 0.5V with a nominal value of +0.25V such that the lower boundary Vt0L of the third programmed threshold voltage level Vt0 is approximately +0.0V and the upper boundary Vt0H of the third programmed threshold voltage level Vt0 is approximately +0.5V.

Figures 1, 2G:
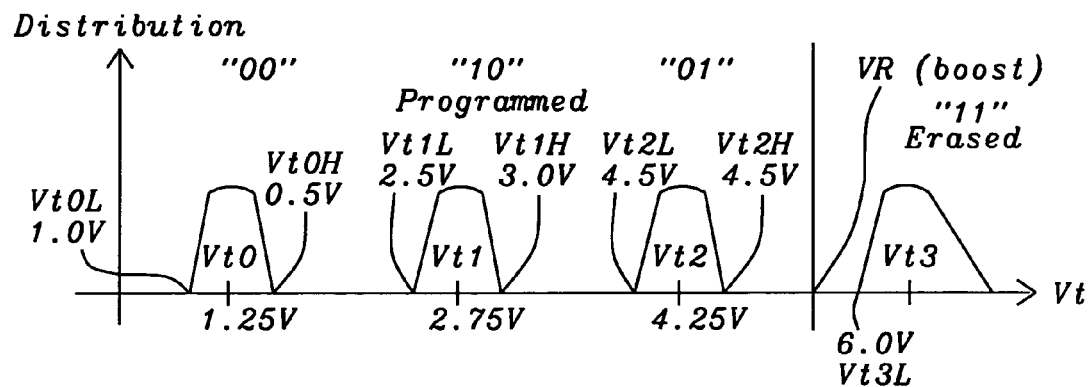
Figures 2, 2G:
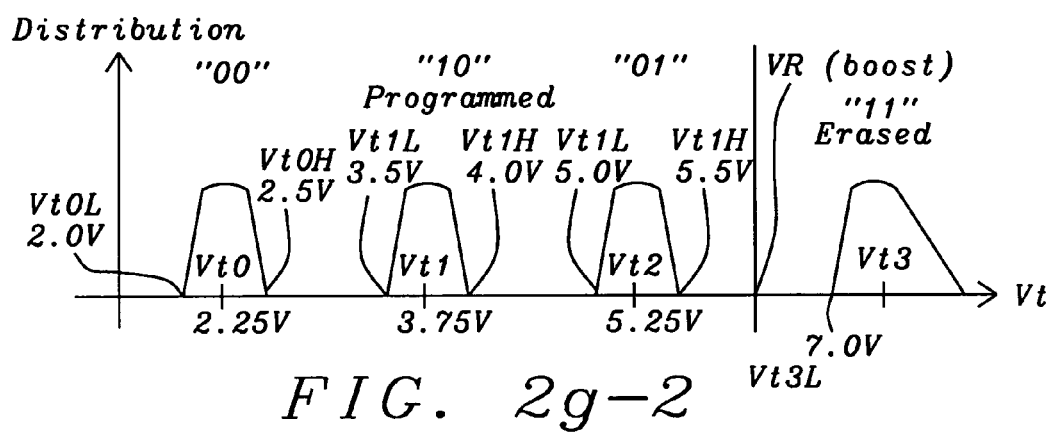

FIGS. 2g-1 illustrates the first threshold voltage distribution of the NMOS NOR floating gate transistors 205a and 205b of FIG. 2e-1 when both the drains (D) 215a and 215b and the source line 260 are connected to approximately the read biasing voltage of approximately +1.0V and the P-type well TPW 244 is biased at the voltage level of approximately the ground reference voltage level (0.0V). Because the drains (D) 215a and 215b and sources 220 of the NMOS NOR floating gate transistors 205a and 205b are biased at approximately the read bias voltage level of approximately 1.0V, the threshold voltage level of the NMOS NOR floating gate transistors 205a and 205b are shifted in positive direction of approximately 1.0V. The lower boundary of the erased threshold voltage level Vt3 is shifted from the nominal magnitude of approximately +5.0V to a magnitude of approximately +6.0V. The third programmed state Vt2 is shifted from the nominal magnitude of approximately +3.25V to a magnitude of approximately +4.25V. The second programmed state Vt1 is shifted from a nominal magnitude of approximately +1.75V to a magnitude of approximately +2.75V. The third programmed threshold voltage level Vt0 is shifted from a nominal magnitude of approximately +0.25V to a magnitude of approximately +1.25V. The shift of +1.0V for the three programmed threshold voltage levels Vt0, Vt1, and Vt2 occurs in the NMOS NOR floating gate transistors 205a and 205b that are connected the selected bit lines in the read operation.

FIG. 2e-2 is a plot of four threshold voltage distributions of a floating-gate transistor NMOS NOR flash cell having a second implementation of a positive erase level and three positive program levels of a multiple level with the sources 220 or drains (D) 215a and 215b and "P-type well TPW 244 biased to the voltage level of approximately the ground reference voltage level (0.0V). It should be noted that when the drains (D) 215a and 215b of the NMOS NOR floating gate transistors 205a and 205b are connected to the voltage level of approximately the ground reference voltage level (0.0V), the threshold voltage levels are the same as when the sources 220 are connected to the voltage level of approximately the ground reference voltage level (0.0V) because NMOS NOR floating gate transistors 205a and 205b have symmetrical characteristics. As long as one of drains (D) 215a and 215b or sources 220 of the NMOS NOR floating gate transistors 205a and 205b are connected to the voltage level of approximately the ground reference voltage level (0.0V), then the threshold voltage levels of the NMOS NOR floating gate transistors 205a and 205b are as shown in FIG. 2e-2.

The multiple level cell program of the NMOS NOR floating gate transistors 205a and 205b includes a high, wide, positive erased threshold voltage level Vt3 that stores a datum representing a digital "11". The lower boundary of the erased threshold voltage level Vt3 is approximately +6.0V. The narrow third programmed threshold voltage level Vt2 stores a datum representing a logical "01". The third narrow programmed state Vt2 has a distribution that varies by approximately 0.5V with a nominal value of +4.25V such that the lower boundary Vt2L of third programmed threshold voltage level Vt2 is approximately +4.0V and the upper boundary Vt2H of third programmed threshold voltage level Vt2 is approximately +4.5V. The narrow second programmed threshold voltage level Vt1 stores a datum representing a logical "10". The second narrow programmed state Vt1 has a distribution that varies by approximately 0.5V with a nominal value of +2.75V such that the lower boundary Vt1L of second programmed threshold voltage level Vt1 is approximately +2.5V and the upper boundary Vt1H of second programmed threshold voltage level Vt1 is approximately +3.0V. The narrow first programmed threshold voltage level Vt0 stores a datum representing a logical "00". The first narrow programmed state Vt0 has a distribution that varies by approximately 0.5V with a nominal value of +1.25V such that the lower boundary Vt0L of first programmed threshold voltage level Vt0 is approximately +1.0V and the upper boundary Vt0H of first programmed threshold voltage level Vt0 is approximately +1.5V.

FIGS. 2g-2 illustrates the second threshold voltage distribution of the NMOS NOR floating gate transistors 205a and 205b of FIG. 2e-2 when both the drains (D) 215a and 215b and the source line 260 are connected to approximately the read biasing voltage of approximately +1.0V and the P-type well TPW 244 is biased at the voltage level of approximately the ground reference voltage level (0.0V). Because the drains (D) 215a and 215b and sources 220 of the NMOS NOR floating gate transistors 205a and 205b are biased at approximately the read bias voltage level of approximately 1.0V, the threshold voltage level of the NMOS NOR floating gate transistors 205a and 205b are shifted in positive direction of approximately 1.0V. The lower boundary of the erased threshold voltage level Vt3L is shifted from a magnitude approximately +6.0V to a magnitude of approximately +7.0V. The third programmed state Vt2 is shifted from a magnitude of approximately +4.25V to a magnitude of approximately +5.25V. The second programmed state Vt1 is shifted from a magnitude of +2.75V to a magnitude of approximately +3.75V. The first programmed threshold voltage level Vt0 is shifted from a magnitude of +1.25V to a magnitude of approximately +2.25V. The shift of +1.0V in the three programmed threshold voltage levels Vt0 Vt1, and Vt2 occurs in the NMOS NOR floating gate transistors 205a and 205b that are connected the selected bit lines in the read operation.

The voltage thresholds as shown in FIGS. 2f-1, 2f-2, 2g-1, and 2g-2 are shifted such that the NMOS NOR floating gate transistors 205a and 205b will not have sub-threshold bit line leakage current. To further decrease the leakage currents, the unselected word line 225a or 225b are biased to a word line inhibit biasing voltage of from approximately –2.0V to 0.0V. The lower voltage level of the word line inhibit biasing voltage is employed in the slow read operation to further decrease the leakage current. While the upper voltage (0.0V) is employed for the fast read operation to meet the present data access time requirements of 100 ns for a 1 GB capacity nonvolatile memory device. The slow read operation is commonly used in serial-type NOR flash charge retaining nonvolatile memory devices that do not need fast random access read. Therefore, the unselected word line read biasing voltages can be easily coupled to –2V to meet the slow read access time requirements of approximately 500 nS. For a fast read in a parallel NOR flash charge retaining nonvolatile memory device to meet 100 nS, the preferred read biasing voltage for the unselected word lines of the present invention is 0V without a need to connect to a read biasing voltage of approximately –2.0V. The negative read biasing voltage requires a on-chip negative charge pump circuit as in the slow serial-type NOR flash.

Figure 3A:
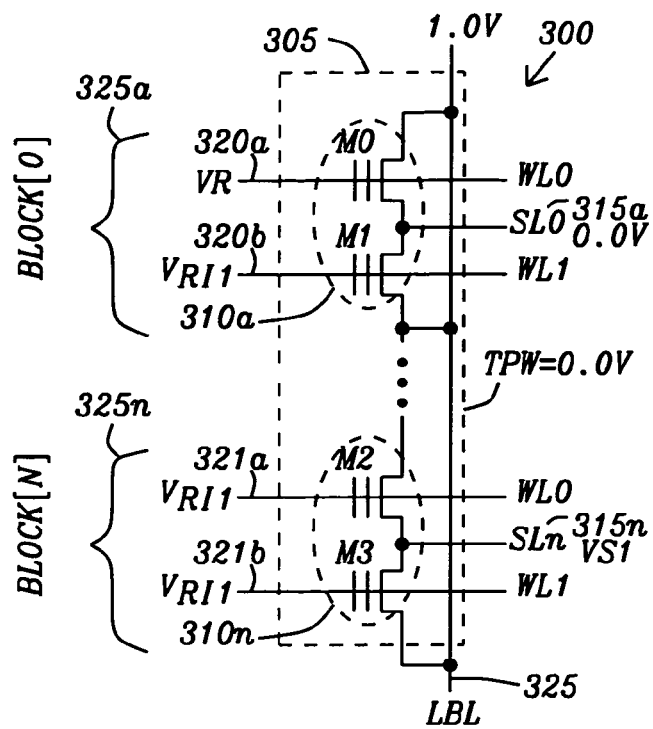
FIGS. 3a-3d are schematic diagrams of floating-gate transistor NMOS NOR flash cells illustrating the bias conditions for slow reading, fast reading, programming, and page erasing of floating-gate transistor NMOS NOR flash cells embodying the principles of the present invention.
Figure 3B:
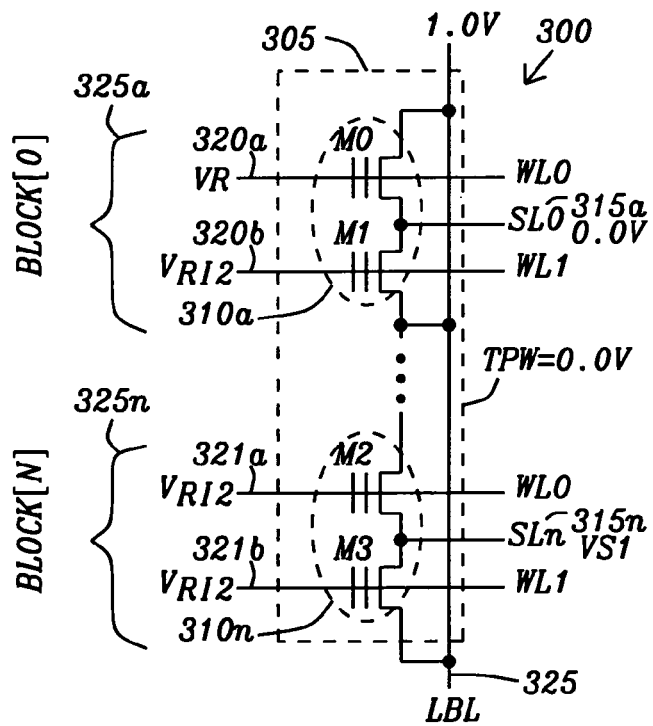
Figure 3C:
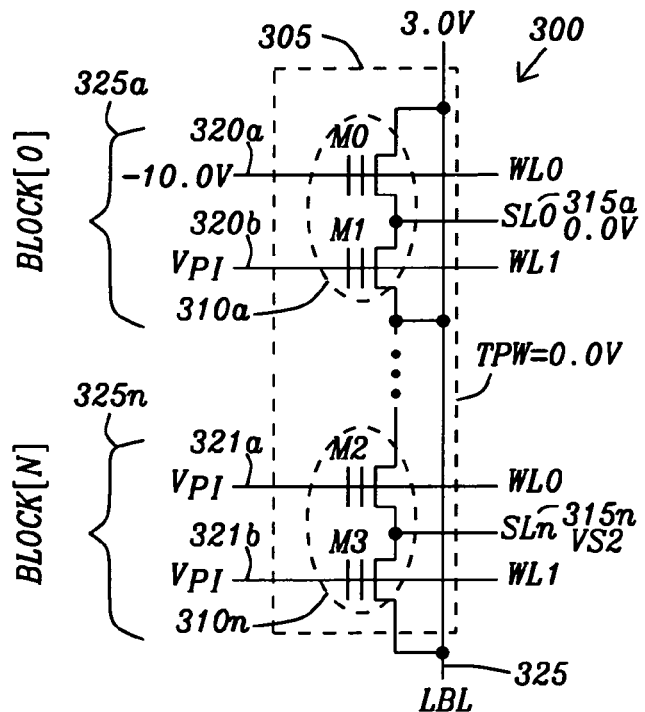

FIGS. 3a-3d are schematic diagrams of floating-gate transistor NMOS NOR flash cells illustrating the bias conditions reading, programming and page erasing of a floating-gate transistor NMOS NOR flash cells embodying the principles of the present invention. The schematic diagrams of FIGS. 3a-3c represents a sector 300 of an array of NOR flash cells 310a, . . . , 310n that include the NMOS floating gate transistors M0, M1 and M2, and M3. The NMOS NOR flash floating gate transistors M0, M1, M2, and M3 are arranged in rows and columns. The drains of the NMOS NOR flash floating gate transistors M0 and M1 are commonly connected to the local bit line LBL 320. The sources of the NMOS NOR flash floating gate transistors M0 and M1 are commonly connected to the source line SL0 315a. Similarly the drains of the NMOS NOR flash floating gate transistors M2, and M3 are commonly connected to the local bit line LBL 320. The sources of the NMOS NOR flash floating gate transistors M2 and M3 are commonly connected to the source line SLn 315n.

The control gate of the NMOS NOR flash floating gate transistor M0 of the block 325a is connected to the word line WL0 320a and the control gate of the NMOS NOR flash floating gate transistor M1 of the block 325a is connected to the word line WL1 320b. Similarly, the control gate of the NMOS NOR flash floating gate transistor M0 of the block 325n is connected to the word line WL0 321a and the control gate of the NMOS NOR flash floating gate transistor M1 of the block 325n is connected to the word line WL1 321b.

The illustrated sector 300 of the NMOS NOR flash floating gate transistors M0, M1, M2, and M3 are formed in a common P-type well 305. The word lines 320a, and 320b, and 321a, and 321b are connected to a row decoder that decodes a block and row address and applies the appropriate voltages to the word lines 320a, and 320b, and 321a, and 321b for reading, programming, and erasing the block 325a, . . . , 325n. The source lines 315a, . . . , 315n are connected to a source line decoder that decodes a block and row address and applies the appropriate voltage levels to the source lines 315a, . . . , 315n for reading, programming, and erasing the block. The bit line 320 is a column decoder that decodes a column address and applies the appropriate biasing for reading, programming, and erasing a block.

FIG. 3a illustrates the biasing voltages for selecting the NMOS NOR flash floating gate transistor M0 of the block 325a for slow reading. The word line 320a connected to the selected page of the block 325a and containing the NMOS NOR flash floating gate transistor M0 is set to the voltage level of the read voltage threshold VR or approximately the level of the power supply voltage source VDD. The unselected word line 320b of the selected block 325a and the word lines 321a and 321b of the unselected block 325a are set to a word line read inhibit voltage VRI1 that is approximately –2.0V to sufficiently turn off the unselected floating gate transistors M1 of the selected block 325a and M0 and M1 of the unselected block 325n. The bit line LBL 320 is set to the bit line read biasing voltage of approximately +1.0V. The source line 315a connected to the selected NMOS NOR flash floating gate transistor M0 is set to a source line read biasing voltage that is set to the voltage level of the ground reference voltage. The source line 315n that is connected to the unselected block 325n is set to a first source line inhibit biasing voltage VS1 that is equal to the voltage level of the bit line read biasing voltage or of approximately +1.0V. Having the voltage level of the source line 315n of the unselected block 325n equal to the voltage level of the bit line read biasing voltage causes the threshold voltages to shift by the magnitude of the source line and bit line read biasing voltages to further inhibit the sub-threshold leakage currents in the M0 and M1 of the unselected block 325n. The P-type well TPW 305 is set to the voltage level of the ground reference voltage source (0.0V). If the selected NMOS NOR flash floating gate transistor M0 of the block 325a is erased as a logical "1", the selected NMOS NOR flash floating gate transistor M0 will not turn on and a sense amplifier will detect the programmed level of the logical "1". Alternatively, if the selected NMOS NOR flash floating gate transistor M0 of the block 325a is programmed with a logical "0", the selected NMOS NOR flash floating gate transistor M0 will turn on and a sense amplifier will detect the programmed level of the logical "0".

FIG. 3b illustrates the biasing voltages for selecting the NMOS NOR flash floating gate transistor M0 of the block 325a for fast reading. The word line 320a connected to the selected page of the block 325a and containing the NMOS NOR flash floating gate transistor M0 is set to the voltage level of the read voltage threshold VR or approximately the level of an intermediate high read inhibit voltage level HV** of approximately +5.0V. The unselected word line 320b of the selected block 325a and the word lines 321a and 321b of the unselected block 325n are set to a word line read inhibit voltage VRI2 that is approximately the voltage level of the ground reference voltage source (0.0V). The voltage level of the word line read inhibit voltage is to sufficient turn off the unselected floating gate transistors M1 of the selected block 325a and M0 and M1 of the unselected block 325n to minimize sub-threshold leakage. The bit line LBL 320 is set to the bit line read biasing voltage of approximately +1.0V. The source line 315a connected to the selected NMOS NOR flash floating gate transistor M0 is set to a source line read biasing voltage that is set to the voltage level of the ground reference voltage. The source line 315n that is connected to the unselected block 325n is set to a first source line inhibit biasing voltage VS1 that is equal to the voltage level of the bit line read biasing voltage or of approximately +1.0V. Having the voltage level of the source line 315n of the unselected block 325n equal to the voltage level of the bit line read biasing voltage causes the threshold voltages to shift by the magnitude of the source line and bit line read biasing voltages to further inhibit the sub-threshold leakage currents in the M0 and M1 of the unselected block 325*n*. The P-type well TPW 305 is set to the voltage level of the ground reference voltage source (0.0V). If the selected NMOS NOR flash floating gate transistor M0 of the block 325*a* is erased as a logical "1", the selected NMOS NOR flash floating gate transistor M0 will not turn on and a sense amplifier will detect the programmed level of the logical "1". Alternatively, if the selected NMOS NOR flash floating gate transistor M0 of the block 325*a* is programmed with a logical "0", the selected NMOS NOR flash floating gate transistor M0 will turn on and a sense amplifier will detect the programmed level of the logical "0".

FIG. 3*c* illustrates the biasing voltages for selecting the NMOS NOR flash floating gate transistor M0 of the block 325*a* for programming. The word line 320*a* is connected to the selected page of the block 325*a* and containing the NMOS NOR flash floating gate transistor M0 is set to the voltage level of the very high negative program voltage level of from approximately −8.0V to approximately −10.0V. The P-type well TPW 305 is set to the voltage level of the ground reference voltage source (0.0V). The unselected word line 320*b* of the selected block 325*a* and the word lines 321*a* and 321*b* of the unselected block 325*a* are set to program inhibit VPI voltage of approximately −2.0V to more completely turn off the unselected NMOS NOR flash floating gate transistor M1 of the selected block 325*a* and the NMOS NOR flash floating gate transistor M0 and M1 of the unselected block 325*n* to minimized sub-threshold leakage current. The source line 315*a* that is connected to the selected NMOS NOR flash floating gate transistor M0 is set to the voltage level of the ground reference voltage. The source line 315*n* that is connected to the unselected block 325*n* is set to a second source line inhibit biasing voltage VS2 that has a voltage level of from approximately +1.5V to approximately 1.8V. The bit line LBL 320 is set to the high program select voltage of approximately +5.0V. If the selected NMOS NOR flash floating gate transistor M0 is not to be programmed (i.e. remain erased), the bit line LBL 320 is set to the voltage level of the ground reference voltage to inhibit the programming of the NMOS NOR flash floating gate transistors that are to remain erased.

Figure 3D:
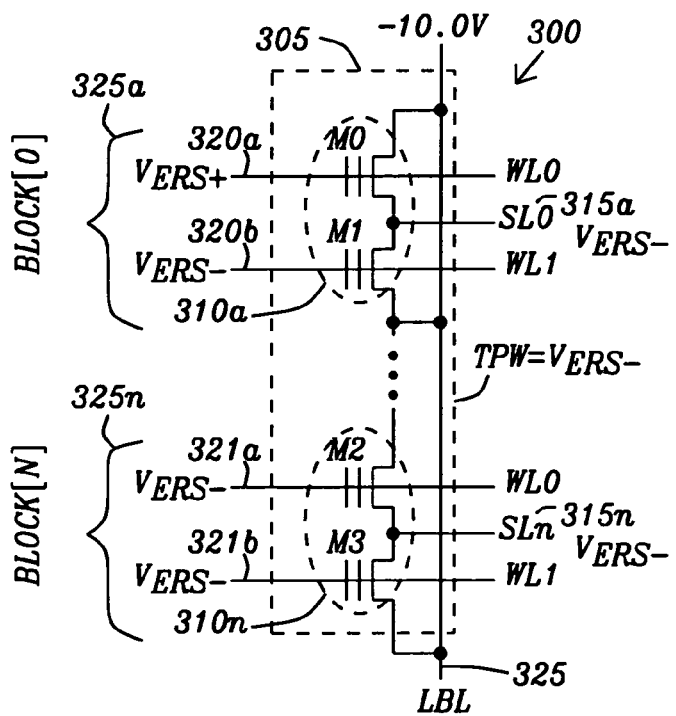

FIG. 3*d* illustrates the biasing voltages for selecting the NMOS NOR flash floating gate transistor M0 of the block 325*a* for page erasing. The word line 320*a* connected to the selected page to be erased of the block 325*a* and containing the NMOS NOR flash floating gate transistor M0 is set to the voltage level of the very high positive program voltage level VERS+ that is from approximately +8.0V to approximately +10.0V. The P-type well TPW 305 is set to the voltage level of the very large negative erase voltage VERS− that is from approximately −8.0V to approximately −10.0V. The unselected word line 320*b* of the selected block 325*a* is set to the ground reference voltage level to inhibit the unselected NMOS NOR flash floating gate transistor M1 of the block 325*a* from erasure. The word lines 321*a* and 321*b* of the unselected block 325*n* are coupled to the very large negative erase voltage VERS− through the P-type well TPW. The source line 315*a* that is connected to the selected NMOS NOR flash floating gate transistor M0 and the source line 315*n* that is connected to the unselected block 325*n* is set to the very large negative erase voltage VERS−. The bit line LBL 320 is set to the very large negative erase voltage VERS−. In this example only the page containing the NMOS NOR flash floating gate transistor M0 is erased and the unselected page of the selected block 325*a* and the unselected block 325*n* are inhibited from erasing.

Figure 4:
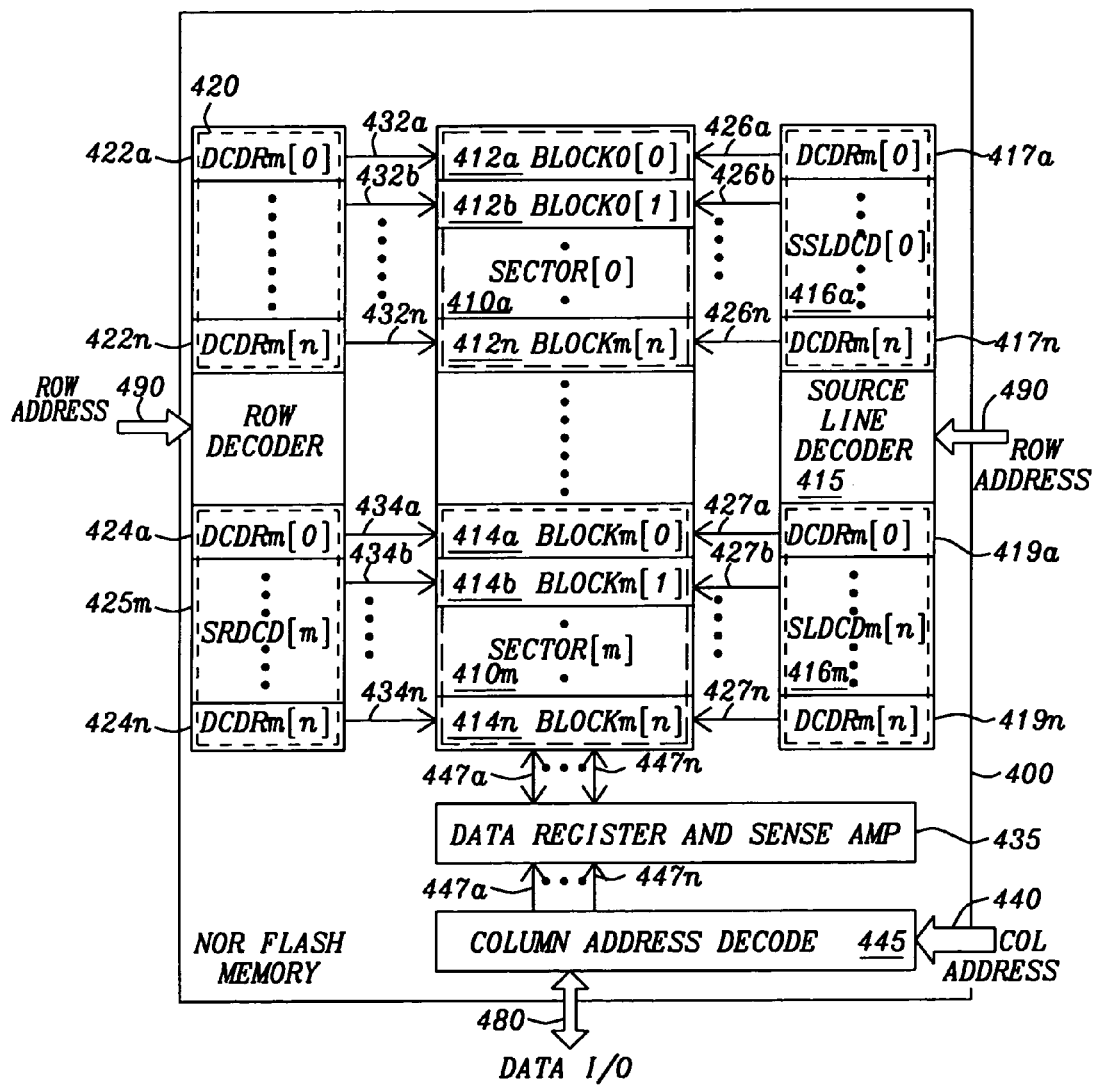
FIG. 4 is a block diagram of a NOR flash nonvolatile memory device embodying the principles of the present invention.

FIG. 4 is a block diagram of a nonvolatile memory device 400 embodying the principles of the present invention incorporating the various embodiments of NOR flash floating-gate transistors. The NOR flash charge retaining nonvolatile memory device 400 includes an array 405 of NMOS flash floating-gate transistors arranged in a matrix of rows and columns. The array 405 is partitioned into a uniform number of sectors 410*a*, . . . , 410*m* and each sector is divided into a uniform number of blocks 412*a*, 412*b*, . . . , 412*n*, and 414*a*, 414*b*, . . . , 414*n*. For instance, a 1 Gb memory array device may be divided into 1024 sectors. Each sector then becomes 128 KB and may be divided into a number blocks such as 8 blocks of 16 KB each. Further, the block is divided into pages. In this example, the page may have a size of 4 Kb such that one page is equivalent to one word line or row of the block or sub-array 412*a*, 412*b*, 412*n*, and 414*a*, 414*b*, . . . , 414*n*. Thus, each block 412*a*, 412*b*, . . . , 412*n*, and 414*a*, 414*b*, . . . , 414*n* has 32 pages or word lines.

The column address decoder 445 receives a column address 440, decodes the column address 440, and from the decoded column address 440 selects which one of the data registers and sense amplifiers 435 are being accessed. The column address decoder 445 activates the appropriate global bit lines 447*a*, . . . , 447*n* for operating a selected sector 410*a*, . . . , 410*m*. The appropriate global bit lines 447*a*, . . . , 447*n* are further connected to the data register and sense amplifier 435. The data register and sense amplifier 435 receives the data signals through the global bit lines 447*a*, . . . , 447*n* from the selected sector 410*a*, . . . , 410*m* and senses and holds the data from the data signal for a read operation. In a program operation, the data is transferred from the data register and sense amplifier 435 through the global bit lines 447*a*, . . . , 447*n* to the selected sector 410*a*, . . . , 410*m*. The data being read from or written (program and erase) to the array 405 of NOR NMOS flash floating-gate transistors is transferred to and from the data register and sense amplifier 435 through the column address decoder 445 from and to the data input/output bus 480.

Each block 412*a*, 412*b*, . . . , 412*n*, and 414*a*, 414*b*, . . . , 414*n* of the array 405 of NOR NMOS flash floating-gate transistors is connected to a row decoder 420 through the word lines 432*a*, 432*b*, 432*n*, 434*a*, 434*b*, 434*n*. Each sector 410*a*, . . . , 410*m* is connected to a sector row decoder 425*a*, . . . , 425*m* within the row decoder 420. Each sector 410*a*, . . . , 410*m* is connected to one of the sector row decoder 425*a*, . . . , 425*m*. The sector row decoders 425*a*, . . . , 425*m* further incorporate block row decoders 422*a*, 422*b*, . . . , 422*n*, and 424*a*, 424*b*, 424*n* such that each block 412*a*, 412*b*, . . . , 412*n*, and 414*a*, 414*b*, . . . , 414*n* is connected with its own block row decoder 422*a*, 422*b*, 422*n*, and 424*a*, 424*b*, 424*n* for providing the appropriate voltage levels to a selected page or word line for reading, programming, and erasing selected NMOS flash floating-gate transistors. The row address 490 are transferred to each of the row decoders 422*a*, 422*b*, 422*n*, and 424*a*, 424*b*, 424*n* select the page or word line and to provide the appropriate voltage levels for reading and programming the selected NMOS flash floating gate transistors. The row decoder 420 further provides the necessary word line read inhibit voltages and word line program inhibit voltages for minimizing the sub-threshold leakage currents from the unselected NOR NMOS flash floating-gate transistors of the array 405 during the read and program operation. The row decoder further disconnects the unselected word lines to couple the very large negative erase voltage (−10.0V) to the word lines of the unselected blocks 412*a*, 412*b*, . . . , 412*n*, and 414*a*, 414*b*, . . . , 414*n* within the selected sector 410*a*, . . . , 410*m* of the array 405 and to couple the ground reference voltage level to word lines of the selected blocks 412a, 412b, ..., 412n, and 414a, 414b, ..., 414n within the selected sector 410a, ..., 410m of the array 405 to inhibit disturbances in unselected nonvolatile memory cells of the array 405.

Each block 412a, 412b, ..., 412n, and 414a, 414b, ..., 414n of the array 405 of NMOS NOR flash floating-gate transistors is connected to a source line decoder 415 through the source lines 426a, 426b, 426n, 427a, 427b, 427n. The source line decoder 420 is formed of multiple sector source line decoders 416a, ..., 416m. Each sector source line decoder 416a, ..., 416m has multiple block source line decoders 417a, 417b, ..., 417n, and 419a, 419b, ..., 419n such that each block 412a, 412b, ..., 412n, and 414a, 414b, ..., 414n is connected with its own source line decoder 417a, 417b, ..., 417n, and 419a, 419b, ..., 419n for providing the appropriate voltage levels to a selected page or word line for reading and programming selected NMOS flash floating-gate transistors. The row address 490 is transferred to each of the source line decoders 417a, 417b, ..., 417n, and 419a, 419b, ..., 419n to select the source line 426a, 426b, 426n, 427a, 427b, 427n of the selected page to provide the appropriate voltage levels for reading, programming, and erasing the selected NMOS flash floating gate transistors. The source line decoders 417a, 417b, ..., 417n, and 419a, 419b, ..., 419n connected to the unselected blocks 412a, 412b, ..., 412n, and 414a, 414b, ..., 414n within the selected sector 410a, ..., 410m of the array 405 transfer a source line inhibit biasing voltage to the unselected source lines 426a, 426b, ..., 426n, 427a, 427b, 427n to minimize sub-threshold leakage current in the unselected NOR NMOS flash floating-gate transistors in the array 405.

Figure 5:
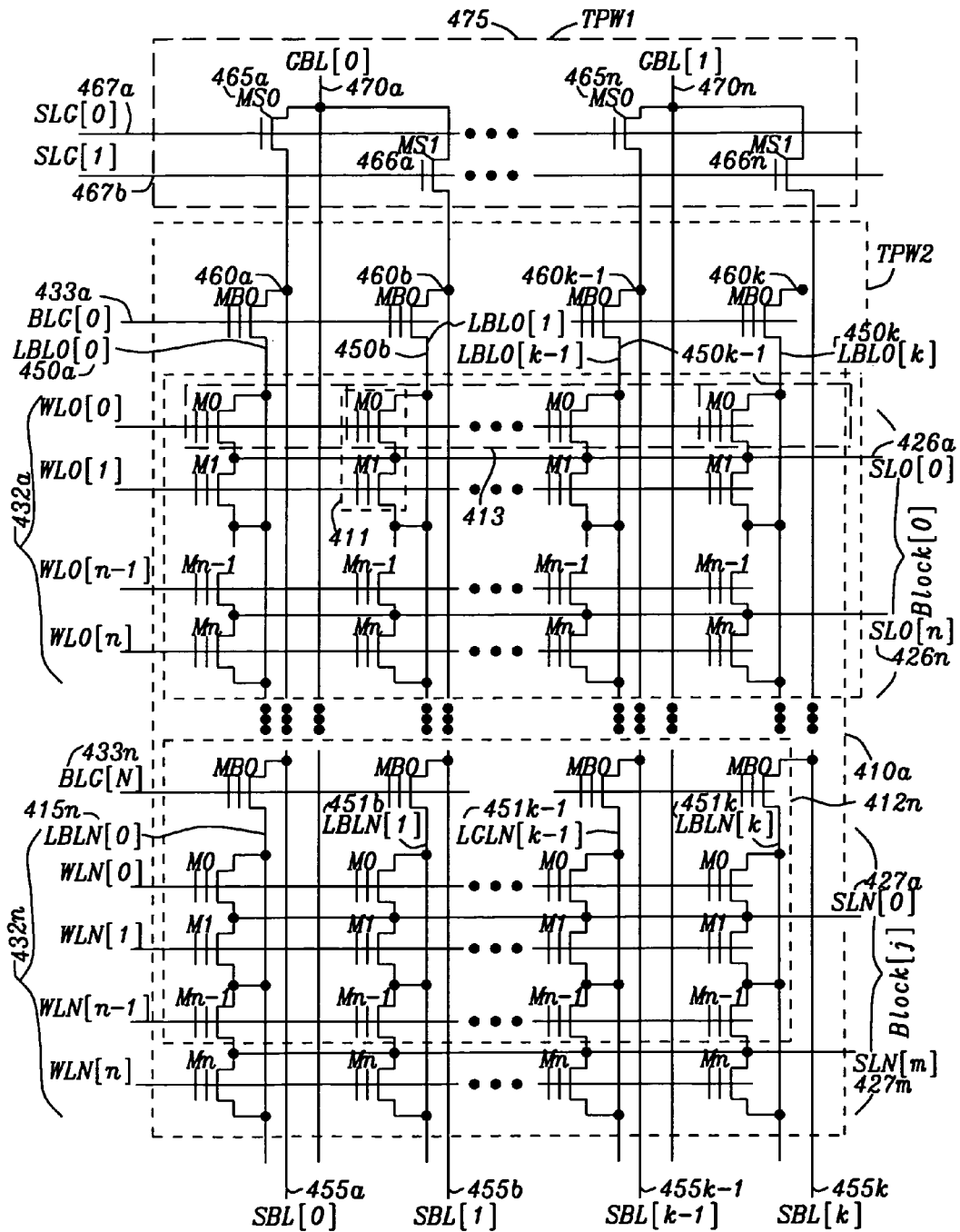
FIG. 5 is a schematic diagram illustrating an array of floating-gate transistor NMOS NOR flash cells of FIG. 4 embodying the principles of the present invention.

Refer now to FIG. 5 for a discussion of the structure of a sector 410a of the array 405 of FIG. 4. The sector 410a is exemplary of the all the sectors 410a, ..., 410m of array 405: The sector 410a is placed in a common P-type well (TPW2) and contains all the NMOS floating gate transistors M0, ..., Mn of the sector 410a. The NMOS floating gate transistors M0, ..., Mn are arranged in rows and columns to form the sub-array of the sector 410a. The NMOS floating gate transistors M0, ..., Mn are formed pair-wise to create a NOR flash nonvolatile memory cell 411. The two NMOS floating gate transistors M0 and M1 of the NOR flash nonvolatile memory cell 411 have their drains commonly connected to a local bit line 450a, ..., 450k and 451a, ..., 451k. The local bit lines 450a, ..., 450k and 451a, ..., 451k are connected through the selected select floating gate transistor MB0 460a, ..., 460k and global bit line gating transistors MS) 465a, 465n or MS1 466a, 466n to the data register and sense amplifier 435 and the column address decoder 445 of FIG. 4. The column address decoder 445 of FIG. 4 provides the bit line read bias voltage, the bit line erase bias voltage, the bit line program bias voltage, the bit line read bias voltage, and the bit line read inhibit bias voltage to the local bit lines 450a, ..., 450k and 451a, ..., 451k for reading, programming, erasing, and verifying the selected NMOS floating gate transistors M0, ..., Mn.

The sources of the two NMOS floating gate transistors M0 and M1 are connected to one source line 426a, ..., 426k and 427a, ..., 427k. The source lines 426a, ..., 426m and 427a, ..., 427m of each block 412a, ..., 412n are connected to the source line decoder 415 of FIG. 4. The source line decoder 415 of FIG. 4 provides the source line read bias voltage, the source line erase bias voltage, the source line program bias voltage, the source line read inhibit bias voltage, and the source line program inhibit bias voltage to the source lines 426a, ..., 426m and 427a, ..., 427m of each block 412a, ..., 412n for reading, programming, erasing, and verifying the selected NMOS floating gate transistors M0, ..., Mn.

The control gates of the two NMOS floating gate transistors M0 and M1 are connected to the word lines 432a, ..., 432n. The word lines 432a, ..., 432n are connected to the row decoder 420 of FIG. 4. The row decoder 420 of FIG. 4 provides the first and second word line read bias voltages, the word line erase bias voltage, the word line program bias voltage, the first and second word line read inhibit bias voltages, and the word line program inhibit bias voltage to the 432a, ..., 432n for reading, programming, erasing, and verifying the selected NMOS floating gate transistors M0, ..., Mn. The first and second word line read inhibit bias voltages, and the word line program inhibit bias voltage provide the necessary voltages for minimizing the sub-threshold leakage currents through the unselected NMOS floating gate transistors M0, ..., Mn.

The sector 410a is divided into multiple blocks 412a, ..., 412n and each block 412a, ..., 412n is further divided into pages 413. The page 413 being a grouping of the NMOS floating gate transistors M0, ..., Mn having their control gates connected commonly to a word line (WL0, ..., WLN) of the word lines 432a, ..., 432n. Each local bit line 450a, ..., 450k and 451a, ..., 451k is connected to the source of a block select floating gate transistor MB0 460a, ..., 460k. The drains of the block select floating gate transistors MB0 460a, ..., 460k are connected to the associated sector bit lines 455a, 455b, 455k. The gate of each of the select floating gate transistor MB0 460a, ..., 460k is connected to one of the block gate select lines 433a, 433n that provides the activation voltage to connect the NMOS floating gate transistors M0, ..., Mn to its associated sector bit line 455a, 455b, 455k.

Each of the sector bit lines 455a, 455b, 455k is connected to one of the sources of the global bit line gating transistors 465a, 465n and 466a, 466n and each of the drains of the global bit line gating transistors 465a, 465n and 466a, ..., 466n is connected to one of the global bit lines 470a, ..., 470n. The gates of each of the global bit line gating transistors 465a, 465n and 466a, 466n are connected to their associated global bit line select lines SLG[0] 467a and SLG[1] 467b. The global bit lines 470a, ..., 470n are connected to the column address decoder 445 and the data register and sense amplifier 435.

When one row of the block select floating gate transistors MB0 460a, ..., 460k is activated one of the blocks 412a, ..., 412n is selected to be connected to the sector bit lines 455a, 455b, ..., 455k. One of a pair of columns of the selected block 412a, ..., 412n is connected to the global bit lines when one grouping of the global bit line select lines SLG[0] 467a or SLG[1] 467b are activated to selectively turn on the global bit line gating transistors 465a, ..., 465n and 466a, ..., 466n. In a read and a program operation, one of the global bit line gating transistors 465a, ..., 465n and 466a, ..., 466n is activated at a time to read the one column of the NMOS floating gate transistors M0, ..., Mn following deactivating the first of the global bit line gating transistors 465a, ..., 465n and 466a, ..., 466n and activating the second of the global bit line gating transistors 465a, ..., 465n and 466a, ..., 466n to read or program the second column of the NMOS floating gate transistors M0, ..., Mn.

Figure 6:
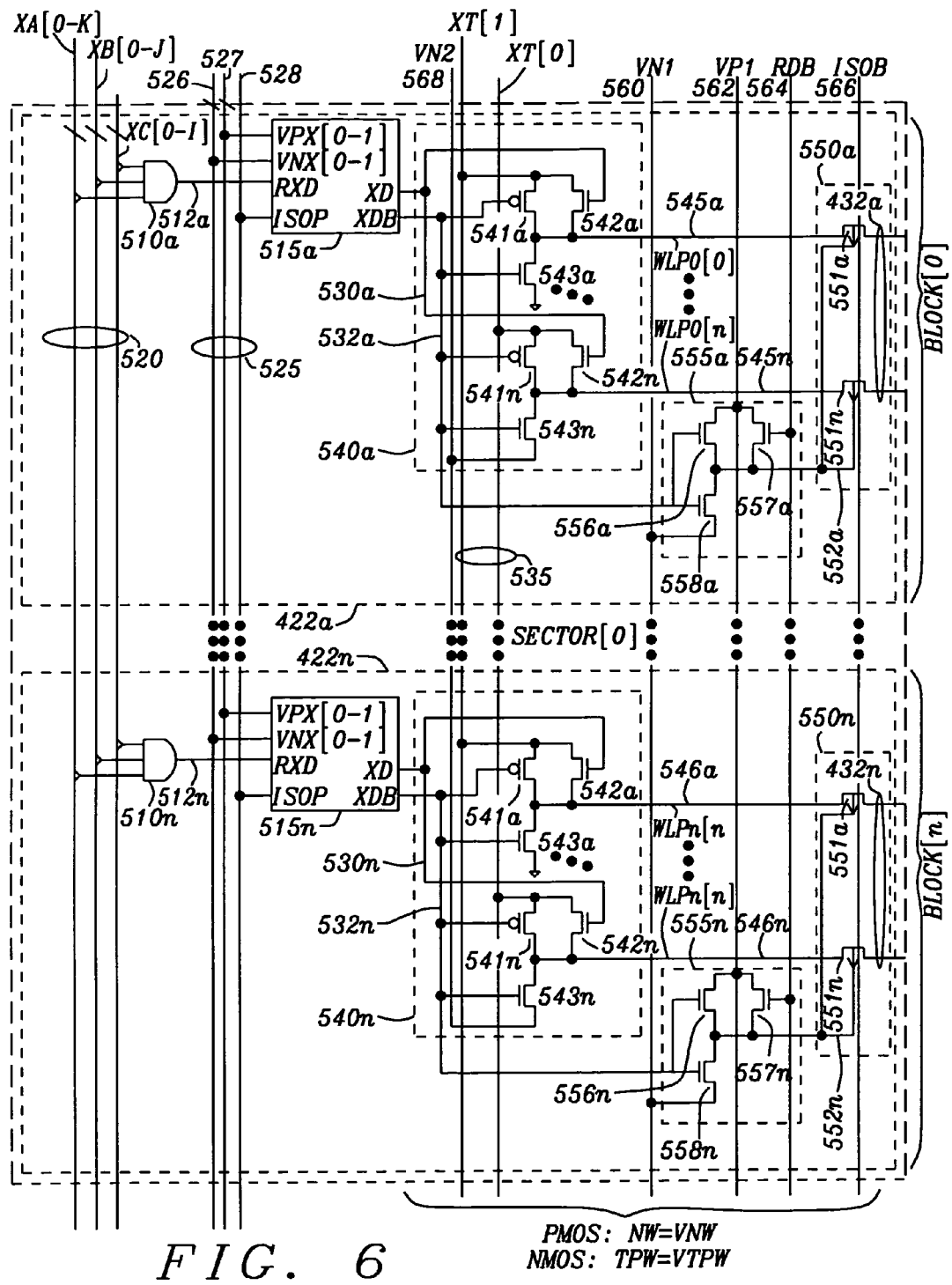
FIG. 6 is a schematic diagram of a block row decoder of the NOR flash nonvolatile memory device of FIG. 4 embodying the principles of the present invention.

FIG. 6 is a schematic diagram of a representative sector decoder 425 of the nonvolatile memory device of FIG. 4. Each sector decoder 425 is partitioned into block row decoders 422a, 422b, ..., 422n (Note that in FIG. 4, the row decoders are designated (422a, 422b, ..., 422n, and 424a, 424b, ..., 424n). The number of block row decoders 422a, 422b, ..., 422n in each sector decoder 425 is equal to the number of rows of NMOS floating gate transistors M0, ..., Mn in each sector 410a, ..., 410m of FIG. 4. the logic gate 510a, ..., 510n (a AND gate in this embodiment) receives the block address 520 of the row address 490 of FIG. 4, decodes the block address 520 to select which of the block row decoders 422a, ..., 422n are to be activated for reading, programming, erasing, or verifying. The output of the logic gate 510a, ..., 510n is the block select signal RXD [0] 512a, ..., RXD [n] 512n that is the input to a level shift circuit 515a, ..., 515n. The level shift circuit 515a, ..., 515n receives the power supply voltage levels 525 that are used to shift the lower voltage logic level of the block select signal RXD [0] 512a, ..., RXD [n] 512n to the levels required for reading, programming, and erasing. The outputs of the level shift circuit 515a, ..., 515n are the high voltage block select signals XD 430a, ..., 430n and XDB 532a, ..., 532n that are applied to the row decode circuit 540a, ..., 540n.

The row decode circuit 540a, ..., 540n provides the appropriate voltage levels for transfer to the rows of the word lines 432a, ..., 432n of the selected block 412a, ..., 412n of FIG. 4. The voltage levels applied to row decode circuit 540a, ..., 540n are provided by the high voltage power supply voltage lines XT[0:7] 535. Each high voltage power supply voltage line XT[0:7] 535 is associated with one of the word lines 432a, ..., 432n and is set according to the operation (read, program, erase, or verify) to be executed and are discussed hereinafter. The row decode circuit 540a, ..., 540n has the row pass devices formed of the high voltage PMOS transistors 541a, ..., 541n and the high voltage NMOS transistors 542a, ..., 542n connected pair-wise in parallel. The gates of the PMOS transistors 541a, ..., 541n are each connected to one of the high voltage out of phase block select signals XDB 532a, ..., 532n. and the gates of the NMOS transistors 542a, ..., 542n are each connected to one of the in-phase block select signals XD 530a, ..., 530n. The sources of the PMOS transistors 541a, ..., 541n and the drains of the high voltage NMOS transistors 542a, ..., 542n are connected to the high voltage power supply voltage lines XT[0:7] 535 associated with one of the word lines 432a, ..., 432n. The drains of the PMOS transistors 541a, ..., 541n and the sources of the high voltage NMOS transistors 542a, ..., 542n are connected to the drain high voltage pass transistors 551a, ..., 551n associated with one of the word lines 432a, ..., 432n. The drains of the PMOS transistors 541a, ..., 541n and the sources of the high voltage NMOS transistors 542a, ..., 542n are further connected to the drain of the NMOS transistors 543a, ..., 543n. The gate of the NMOS transistors 543a, ..., 543n is connected to the out of phase block select signals XDB 532a, ..., 532n and the sources of the NMOS transistors 543a, ..., 543n are connected to negative inhibit voltage line VN2 568. For the row decoders 422a, ..., 422n of the unselected block 412a, ..., 412n, the level shift circuits 515a, ..., 515n are deactivated and the out of phase block select signals XDB 532a, ..., 532n are set to turn on the NMOS transistors 543a, ..., 543n to set the drains of the NMOS transistors 543a, ..., 543n to the voltage level of the negative inhibit voltage line VN2 568 that are passed to the unselected word lines for minimizing the sub-threshold leakage current in the unselected NMOS floating gate transistors M0, ..., Mn of the array 405.

The high voltage pass transistors 551a, ..., 551n form the PMOS high voltage isolators 550a, ..., 550n. The gates of the high voltage pass transistors 551a, ..., 551n are connected together by the isolation signal ISOB 566. When activated, the high voltage pass transistors 551a, ..., 551n connect the word lines 432a, ..., 432n to the row decode circuits 540a, ..., 540n. When deactivated, the high voltage pass transistors 551a, ..., 551n isolate the word lines 432a, ..., 432n from the row decode circuits 540a, ..., 540n. It should be noted that maintaining the drain to source voltages of the high voltage pass transistors 551a, ..., 551n less than the +/−10V eliminates the need for special high voltage devices with larger dimensions.

The PMOS high voltage isolators 550a, ..., 550n are each formed in an independent N-type well independently controlled by the control lines 552a, ..., 552n. The N-type well for each of the N-type well is connected through the control lines 552a, ..., 552n to a corresponding N-type well switch 555a, ..., 555n to individually charge or discharge the N-type wells. The N-type well switch 555a, ..., 555n includes the PMOS transistors 556a, ..., 556n and 557a, ..., 557n and the NMOS transistors 558a, ..., 558n. The gates of the PMOS transistors 556a, ..., 556n and the NMOS transistors 558a, ..., 558n are connected to the out of phase block select signals XDB 532a, ..., 532n. The gates of the PMOS transistors 557a, ..., 557n are connected to the out of is phase read signal RDB 564. The drains the PMOS transistors 556a, ..., 556n and 557a, ..., 557n and drains the NMOS transistors 558a, ..., 558n are connected via the control lines 552a, ..., 552n to the N-type wells 552a, ..., 552n. The sources of the PMOS transistors 556a, ..., 556n and 557a, ..., 557n are connected to the positive N-well biasing voltage source VP1 562 and the sources of the NMOS transistors 558a, ..., 558n are connected to the negative N-well biasing voltage source VN1 560.

Figure 7:
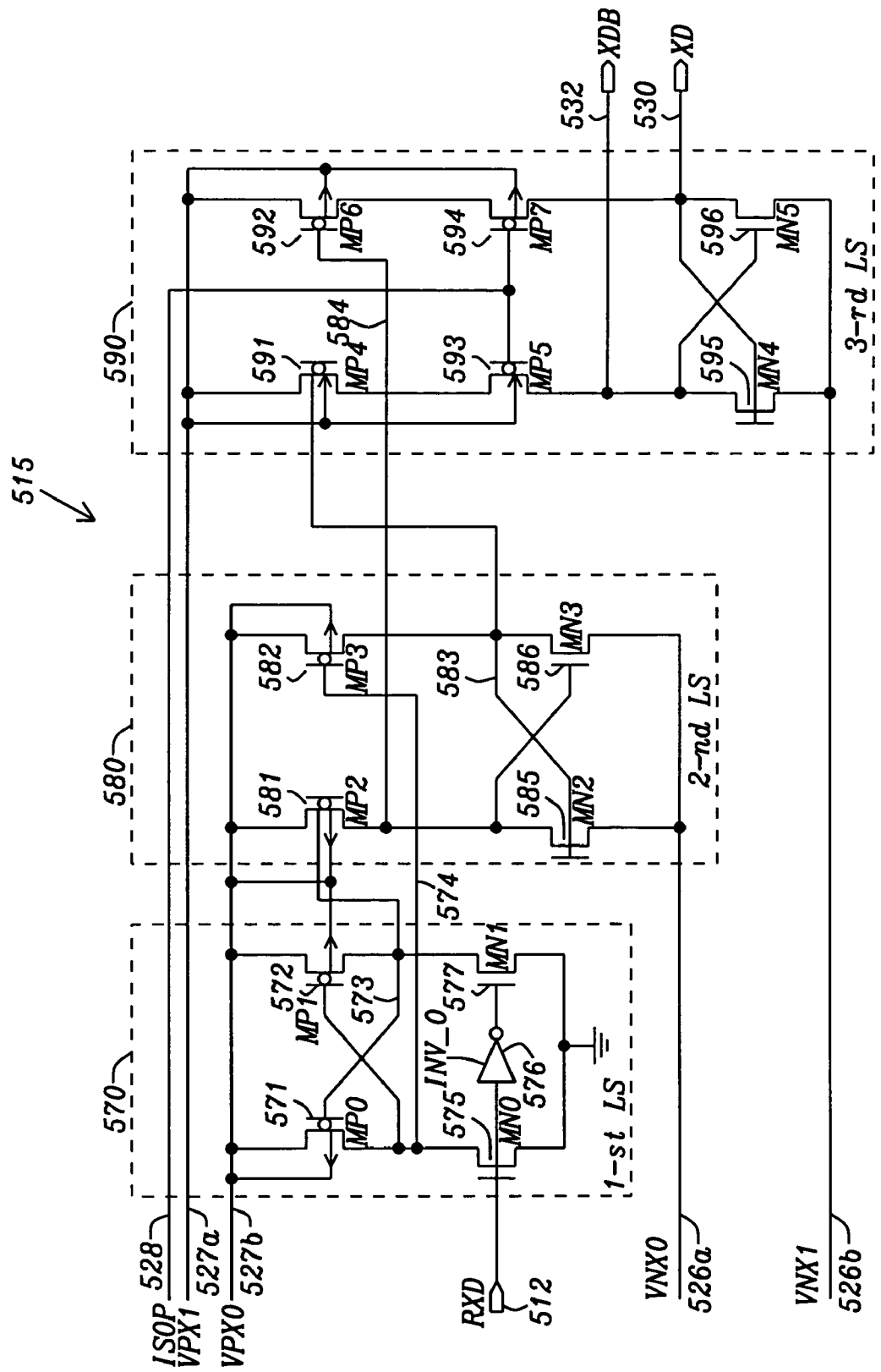
FIG. 7 is a schematic diagram of a level shifter circuit of the block row decoders of FIG. 6 embodying the principles of the present invention.

FIG. 7 is a schematic diagram of a level shifter circuit of the row decoder of FIG. 6. Referring now to FIG. 7, the level shifter circuit 515 includes three sub-level-shifter circuits 570, 580, and 590 to translate the low voltage level of the block select signal RXD 512 to a voltage level of a first positive high voltage power source VPX1 527a. The voltage translation maintains the drain to source breakdown voltage of the peripheral circuitry of the nonvolatile memory device 400 of FIG. 4 to be less than or equal to the drain to source breakdown voltage BVDSS that is approximately +/−10V. Maintaining the drain to source voltages of the sector decoder 425 of the nonvolatile memory device of FIG. 4 less than the +/−10V eliminates the need for special high voltage devices with larger dimensions. The first level shift circuit 570 has pair of cross connected PMOS transistors 571 and 572 that have their sources connected to a second positive high voltage power source VPX0 527b. The bulk regions of the PMOS transistors 571 and 572 are connected to the second positive high voltage power source VPX0 527b. The drain of the PMOS transistor 571 is connected to the gate of the PMOS transistors 572 and the drain of the PMOS transistor 572 is connected to the gate of the PMOS transistor 571. The drain of the PMOS transistor 571 is connected to the drain of the NMOS transistor 575 and the drain of the PMOS transistor 572 is connected to the drain of the NMOS transistor 577. The gate of the NMOS transistor 575 is connected to receive the block select signal RXD 512. The block select signal RXD 512 is connected to the input of the inverter 576. The output of the inverter 576 is connected to the gate of the NMOS transistor 577. The sources of the NMOS transistors 575 and 577 are connected to the ground reference voltage source (0.0V).

The output nodes 573 and 574 of the first level shift circuit 570 are the input nodes of the second level shift circuit 580. The second level shift circuit 580 has pair of PMOS transistors 581 and 582 that have their sources connected to a second high voltage power supply VPX0 527b. The bulk regions of the PMOS transistors 581 and 582 are connected to the second high voltage power supply VPX0 527b. The drain of the PMOS transistor 581 is connected to the gate of the PMOS transistor 582 and the drain of the PMOS transistors 582 is connected to the gate of the PMOS transistors 581. The drain of the PMOS transistor 581 is connected to the drain of the NMOS transistor 585 and the drain of the PMOS transistor 582 is connected to the drain of the NMOS transistor 586. The output node 573 of the first level shift circuit 570 is connected to the gate of the PMOS transistor 581 and the output node 574 of the first level shift circuit 570 is connected to the gate of the PMOS transistor 582. The sources of the NMOS transistors 585 and 586 are connected to the first negative high voltage source VNX0 526a. The output node 583 is at the junction of the connection of the drains of the PMOS transistor 582 and the NMOS transistor 586. The output node 584 is at the junction of the connection of the drains of the PMOS transistor 581 and the NMOS transistor 585.

The output nodes 583 and 584 of the second level shift circuit 580 are the input nodes of the third level shift circuit 590. The third level shift circuit 590 has pair of PMOS transistors 591 and 592 that have their sources connected to a second positive high voltage power supply VPX1 527a. The drain of the PMOS transistors 591 is connected to the source of the PMOS transistor 593. The drain of the PMOS transistors 592 is connected to the source of the PMOS transistor 594. The output node 583 of the second level shift circuit 580 is connected to the gate of the PMOS transistor 591 and the output node 584 of the second level shift circuit 580 is connected to the gate of the PMOS transistor 592. The gates of the PMOS transistors 593 and 594 are connected to the isolation signal ISOP 528. The isolation signal ISOP 528 is used to isolate the drain of PMOS transistors 591 and 592 from the in-phase high voltage block select signal XD 530 and the inverse high voltage block select signal XDB 532 at the program mode. If the PMOS transistors 593 and 594 were to be eliminated or removed, the voltage level of the power supply voltage source VDD would be applied to the output node 583 or the output node 584 during a program operation. This would cause a voltage level of the power supply voltage source VDD plus the very high positive erase voltage to be applied from the gate to the drain of the PMOS transistors 591 or 592. With the PMOS transistors 591 or 592 having a drain to source breakdown voltage BVDSS of less than −10V, the PMOS transistors 591 or 592 breakdown thus causing a malfunction of the circuit. The drain of the PMOS transistor 593 is connected to the drain of the NMOS transistor 595 and the gate of the NMOS transistor 596. The drain of the PMOS transistor 594 is connected to the drain of the NMOS transistor 596 and the gate of the NMOS transistor 595. The bulk regions of the PMOS transistors 591, 592, 593, and 595 are connected to the second high voltage power supply VPX1 527a. The sources of the NMOS transistors are connected to the second negative high voltage source VNX1 526b. The high voltage block select signal XD 530 is present at the junction of the connection of the drains of the PMOS transistor 594 and the NMOS transistor 596. The inverse high voltage block select signal XDB 532 is present at the junction of the connection of the drains of the PMOS transistor 593 and the NMOS transistor 595.

Figure 8:
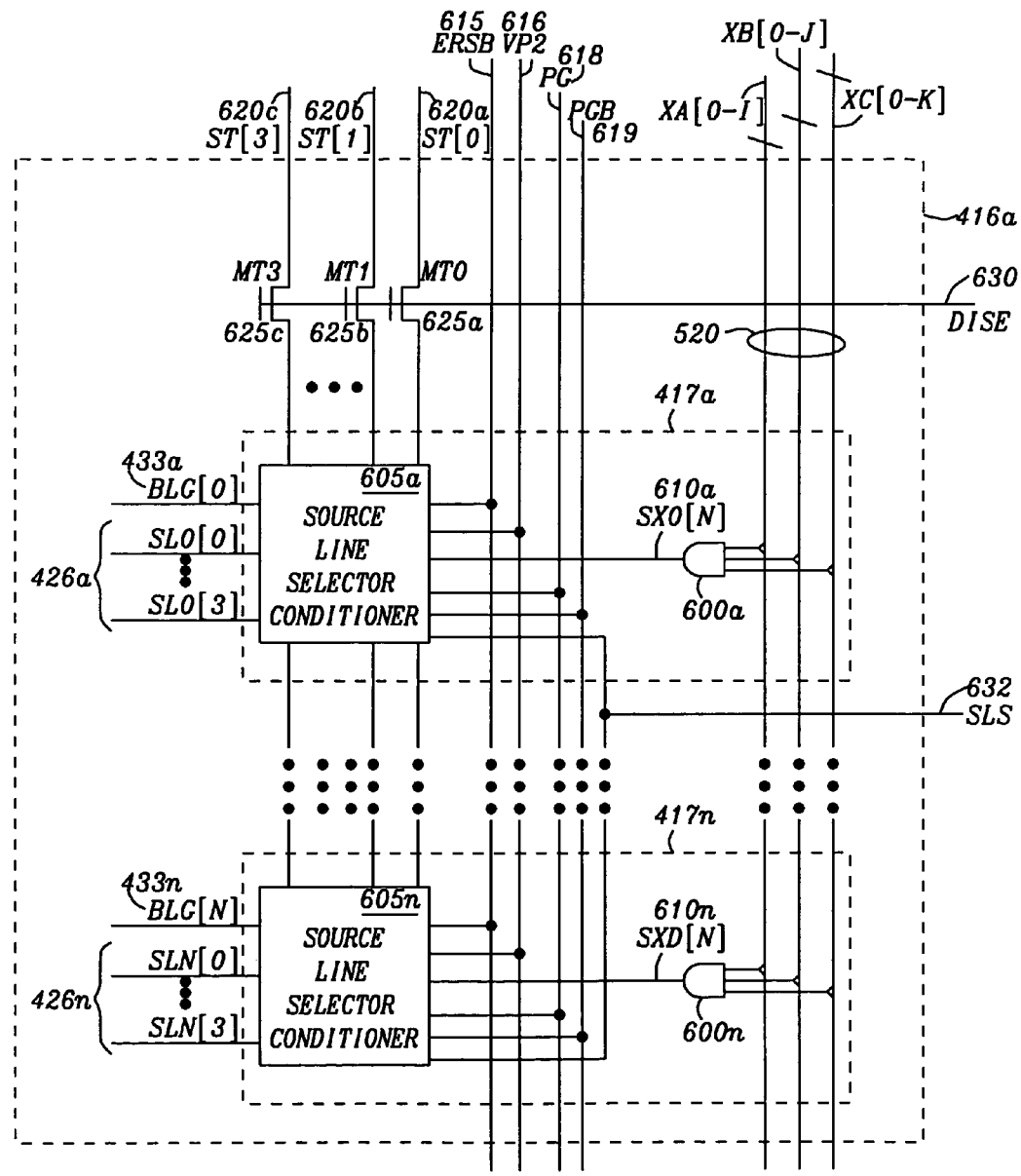
FIG. 8 is a schematic diagram of source line decoder of the NOR flash nonvolatile memory device of FIG. 4 embodying the principles of the present invention.

FIG. 8 is a schematic diagram of sector source line decoder of the nonvolatile memory device of FIG. 4. The sector source line decoder 416a is divided into multiple block source line decoders 417a, . . . , 417n. Each of the block source line decoders 417a, . . . , 417n has a logic gate 600a, . . . , 600n (a AND gate in this embodiment) that receives and decodes the block address 520 of the row address 490 of FIG. 4. The output of the block source line decoders 417a, . . . , 417n is the block source line selection signal 610a, . . . , 610n that is the input to the source line selector/conditioner 605a, . . . , 605n.

The source line selector/conditioner 605a, . . . , 605n is connected to the source lines 426a, . . . , 426n to apply the correct voltage levels to the source lines 426a, . . . , 426n for reading, programming, and erasing the selected NMOS floating gate transistors M0, . . . , Mn. The source line selector/conditioner 605a, . . . , 605n is connected to the block gate select lines 433a, 433n to provide the activation signal for activating the block select floating gate transistor MB0 460a, . . . , 460n of FIG. 5 to connect the selected NMOS floating gate transistors M0, . . . , Mn to the associated sector bit lines 455a, 455b, 455k. The out-of-phase erase signal ERSB 615, positive high voltage source VP2 616, the in-phase program signal PG 618, and the out-of-phase program signal PGB 619 provide the activation signals for setting the appropriate voltage levels to the source lines 426a, . . . , 426n and the block gate select lines 433a, 433n from the source line address lines ST[0] 620a, ST[1] 620b, and ST[3] 620c and the source line select line SLS 632. The source line address lines ST[0] 620a, ST[1] 620b, and ST[3] 620c are connected to the drains of the NMOS transistors 625a, 625b, and 625c. The sources of the NMOS transistors 625a, 625b, and 625c are connected to the source line selector/conditioner 605a, . . . , 605n. The gates of the NMOS transistors 625a, 625b, and 625c are connected to the source line isolation signal DISE 630 to isolate the source line address lines ST[0] 620a, ST[1] 620b, and ST[3] 620c from the source line selector/conditioner 605a, . . . , 605n during an erase operation.

Figure 9:
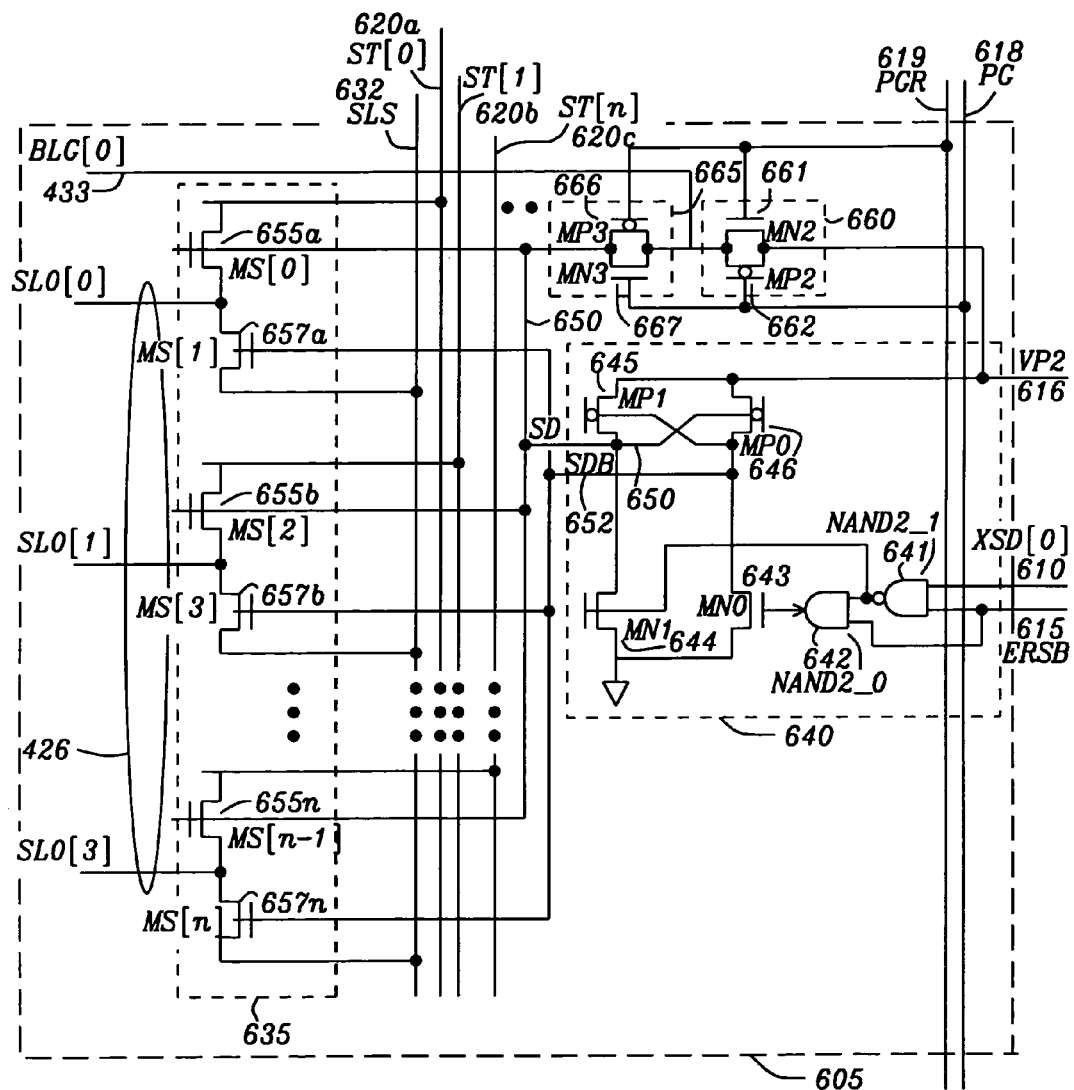
FIG. 9 is a schematic diagram of a source line selector/conditioner of the source line decoder of FIG. 8 embodying the principles of this invention.

FIG. 9 is a schematic diagram of a source line selector/conditioner 605a, . . . , 605n of the sector source line decoder 416a of FIG. 8. The source line selector/conditioner 605 has a voltage level shifter 640 that receives the block selection signal 610 and translates the voltage level of the block selection signal 610 to those required by the source lines 426 and the block gate select signal BLG[0] 433. The voltage level shifter 640 has a logic gate 641 (a NAND circuit in this embodiment) that receives the block selection signal 610 and the out of phase of the erase command signal 615. The output of the logic gate 641 is an input to a logic gate 642 (a NAND circuit in this embodiment). The second input of the logic gate 642 is the erase command signal ERSB 615. The output of the logic gate 641 is connected to the input of the NMOS transistor 644. The output of the logic gate 642 is the input of the NMOS transistor 643. The sources of the NMOS transistors 643 and 644 are connected to the ground reference voltage source (0.0V). The drain of the NMOS transistor 643 is connected to the drain of the PMOS transistor 646 and the gate of the PMOS transistor 645. The drain of the NMOS transistor 644 is connected to the drain of the PMOS transistor 645 and the gate of the PMOS transistor 646. The sources of the PMOS transistors 645 and 646 are connected to the positive high voltage source VP2 616. The in-phase output SD 650 of the voltage level shifter 640 is generated at the junction of the connection of the drains of the NMOS transistor 644 and the PMOS transistor 645. The out-of-phase output SDB 652 of the voltage level shifter 640 is generated at the junction of the connection of the drains of the NMOS transistor 643 and the PMOS transistor 646.

The in-phase output SD 650 and out-of-phase output SDB 652 of the voltage level shifter 640 are connected to the inputs of the source line decoder 635. The source line decoder 635 is formed of pairs of NMOS transistors 655a, . . . , 655n and 657a, . . . , 657n. The gates of the NMOS transistors 655a, . . . , 655n are connected to the in-phase output SD 650 of the voltage level shifter 640 and the gates of the NMOS transistors 657a, . . . , 657n are connected to the out-of-phase output SDB 652 in-phase output SD 650. The sources of the NMOS transistors 655a, . . . , 655n and the drains of the NMOS transistors 657*a*, . . . , 657*n* are connected to the source lines 426*a*. The drains of the NMOS transistors 655*a*, . . . , 655*n* are connected to the source line address lines ST[0] 620*a*, ST[1] 620*b*, and ST[3] 620*c*. The sources of the NMOS transistors 657*a*, . . . , 657*n* are connected to the source line select line SLS 632.

The in-phase program command signal PG 618 and the out-of-phase program command signal PGB 619 are connected to the pass gate circuits 660 and 665. The NMOS transistor 661 and the PMOS transistor 662 are placed in parallel to form the pass gate circuit 660 and the PMOS transistor 666 and the NMOS transistor 667 are placed in parallel to form the pass gate circuit 665. The out-of-phase program command signal PGB 619 is connected to the gates of the NMOS transistor 661 and the PMOS transistor 666 and the in-phase program command signal PG 618 is connected to the PMOS transistors 662 and 667. The sources of the NMOS transistor 661 and the PMOS transistor 662 are connected to the positive high voltage source VP2 616. The drains of the NMOS transistor 661 and the PMOS transistor 662 are connected to the sources of the PMOS transistor 666 and the NMOS transistor 667 and to the block gate select line 433 of each block to selectively activate the block select floating gate transistors MB0 460*a*, . . . , 460*n* of FIG. 5. The sources of the PMOS transistor 666 and the NMOS transistor 667 are connected to the gates of the NMOS transistors 655*a*, . . . , 655*n* to transfer the decoded in-phase output SD 650 to activate one of the NMOS transistors 655*a*, . . . , 655*n* when the of the voltage level shifter 640 is active during a program operation.

Figure 10:
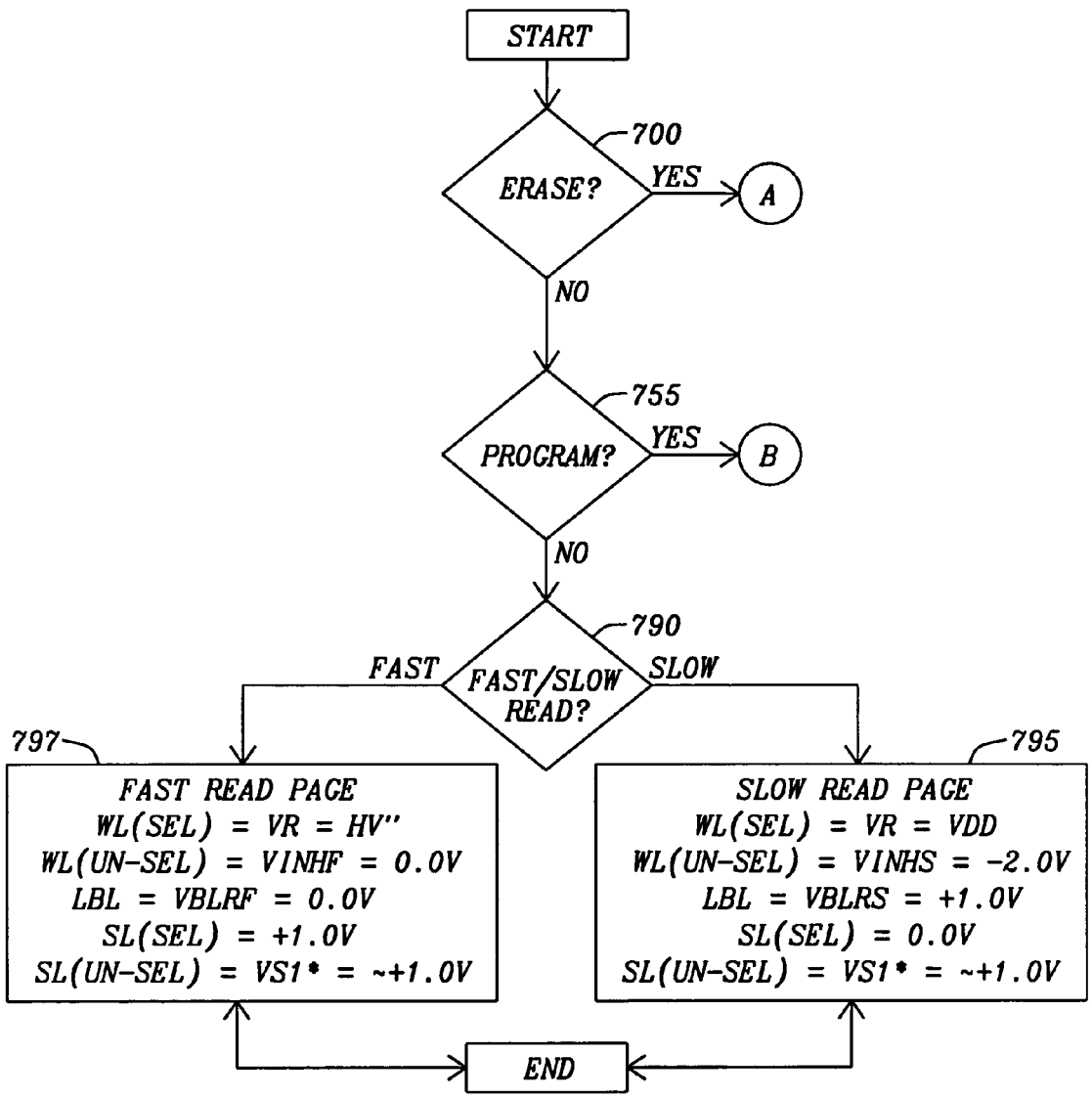
FIG. 10 is flow chart for the method for operating the NOR flash nonvolatile memory device of FIG. 4.
Figure 11:
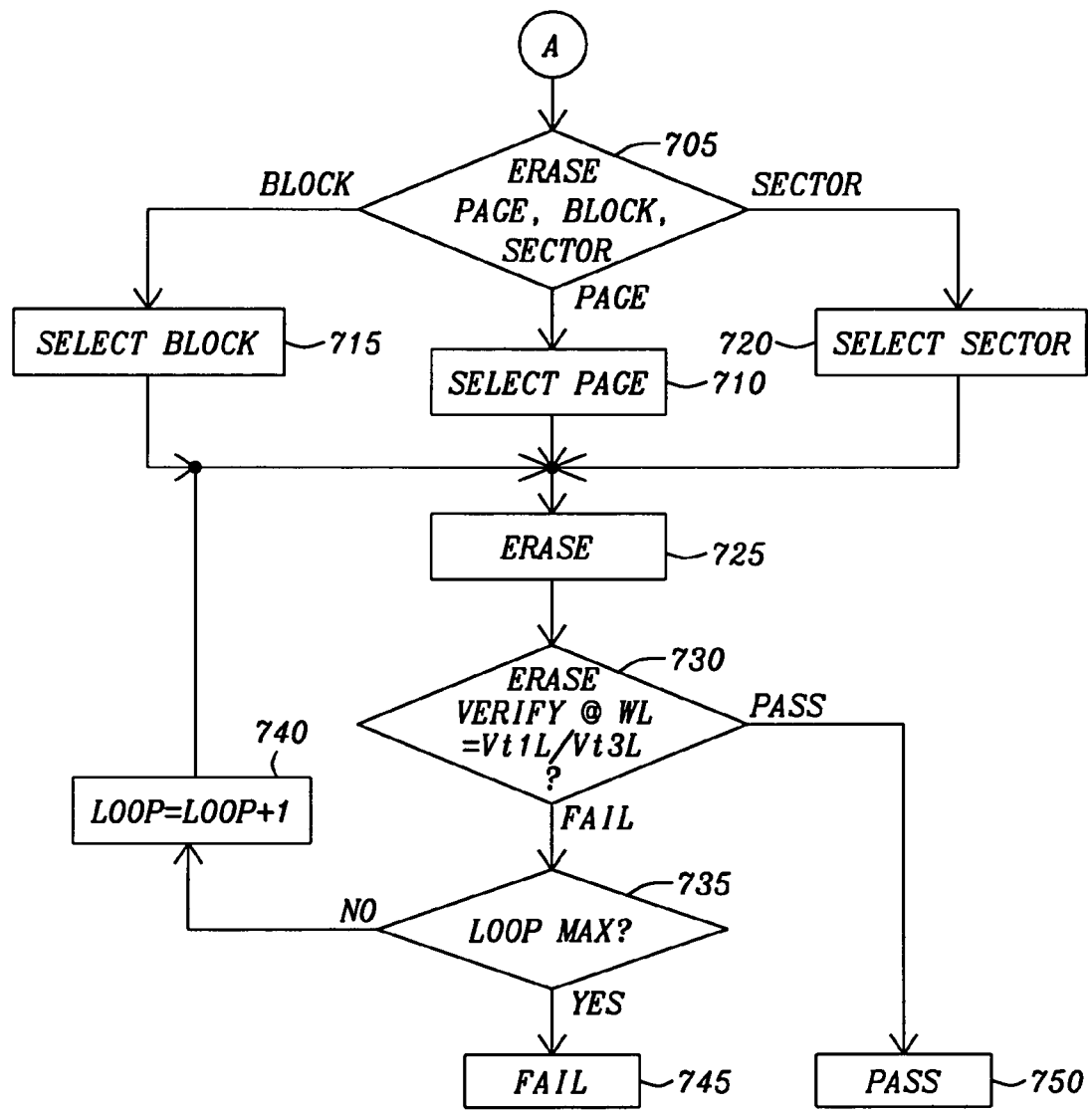
FIG. 11 is flow chart for the method for erasing and erase verifying a page, block, or sector of the NOR flash nonvolatile memory device of FIG. 4.
Figure 12:
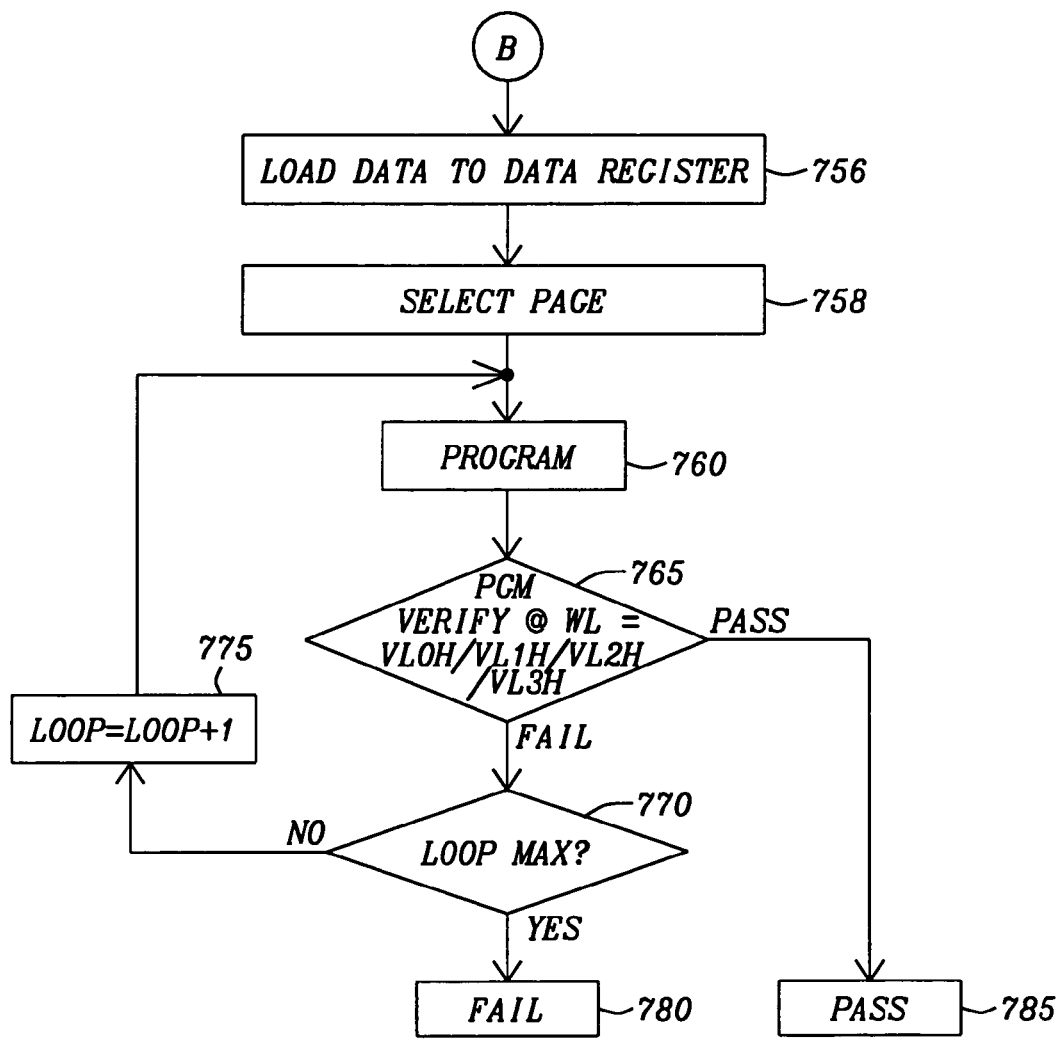
FIG. 12 is flow chart for the method for programming and program verifying a page of the NOR flash nonvolatile memory device of FIG. 4.

FIG. 10 is flow chart for the method for operating the nonvolatile memory device of FIG. 4. FIG. 11 is flow chart of the method for erasing and erase verifying a page, block, or sector of the nonvolatile memory device of FIG. 4. FIG. 12 is flow chart of the method for programming and program verifying a page of the nonvolatile memory device of FIG. 4. Refer now to FIGS. 4-12, 13*a*, 13*b*, 14*a*, 14*b*, and 15 for a discussion of the operating voltage levels required for the reading, programming, erasing, and verification of the nonvolatile memory device. The method begins by determining (Box 700) if the operation is an erase. If the operation is an erase operation, the erase is determined (Box 705) to be a page, block, or sector erase. If the operation is to be a page erase, the page to be erased is selected (Box 710) and the page is erased (Box 725). The voltage levels for the array 405 of the NMOS floating gate transistors M0, . . . , Mn are shown in FIG. 13*a* for a single level cell program and FIG. 13*b* for a multiple level cell program. For the page erase the voltage levels are the same for the single level cell program and the multiple level cell program. The word lines 432U of the selected blocks of the selected sectors are coupled to the very high negative erase voltage. The very high negative erase voltage is from approximately −8.0V to approximately −10.0V as coupled from the P-type well TPW 244S of the selected sector. The P-type well TPW 244S of the selected sector set to the very high negative erase voltage. In the unselected sectors 410*a*, . . . , 410*m* of the array 405, the P-type well TPW 244U is set to approximately the voltage level of the ground reference voltage source (0.0V). The word lines of the unselected sectors 410U are disconnected and allow to float such that the ground reference voltage source (0.0V) is coupled to the word lines of the unselected sectors (0.0V). The selected word line 432S of the selected block is set to a very high positive erase voltage. The very high positive erase voltage is from approximately +8.0V to approximately +10.0V. The unselected word lines 432SU in the selected block 412S are coupled to the approximately the voltage level of the very high negative erase voltage. The selected local bit line 450S is set to the very high negative erase voltage. The block gate select lines 433S are set to the high erase select voltage of approximately +5.0V to couple the local bit line 450*a*, . . . , 450*k* and 451*a*, . . . , 451*k* to the associated sector bit lines 455*a*, 455*b*, 455*k*. The selected source line 426S are set to the very high negative erase voltage. The selected global bit line select lines 467S are set to the very high negative erase voltage to connect the sector bit lines 455*a*, 455*b*, 455*k* to the global bit lines 470*a*, . . . , 470*n*.

To establish the page erase values as just described the row decoders 422*a*, 422*b*, 422*n*, and 424*a*, 424*b*, 424*n* of the selected sector have voltage levels described in FIGS. 14*a* and 14*b*. The single level cell program signal of FIG. 14*a* and the multiple level cell program signals of FIG. 14*b* are identical for a page erase operation The selected word line 432S must be set to the very high positive erase voltage and the unselected word lines 432SU of the selected block are set to the approximately the voltage level of the ground reference voltage source (0.0V). The unselected word lines 432U of the unselected blocks are coupled to the very high negative erase voltage. The very high negative erase voltage is from approximately −8.0V to approximately −10.0V from the P-type well TPW 244S. To accomplish these levels, the row decoders 422*a*, 422*b*, 422*n* of the selected blocks 412S have their selected high voltage power supply voltage line XT 535S associated with the selected word line 432S set to the very high positive erase voltage. The very high positive erase voltage is from approximately +8.0V to approximately +10.0V to be fed through the row decode circuit 540*a*, . . . , 540*n* and the PMOS high voltage isolators 550*a*, . . . , 550*n* to the selected word line 432. The unselected high voltage power supply voltage line 535U associated with the selected word line 432SU set to the voltage level of the ground reference voltage level to be fed through the row decode circuit 540*a*, . . . , 540*n* and the PMOS high voltage isolators 550*a*, . . . , 550*n* to the unselected word line 432SU. The voltage level of the selected in-phase block select signals XD 530S, indicating that a block 412S is selected, is set to the very high positive erase voltage and the voltage level of the out-of-phase block select signals XD 530U, indicating that a block 412U is unselected, is set to approximately the voltage level of the ground reference voltage source (0.0V) to be coupled from the row decode circuit 540*a*, . . . , 540*n* through the PMOS high voltage isolators 550*a*, . . . , 550*n* such that the unselected word lines 432U are coupled to the very high negative erase voltage from the P-type well TPW 244S. The N-type wells 552S of the selected block 412S is connected to the very high positive erase voltage to avoid voltage breakdown in the PMOS high voltage isolators 550*a*, . . . , 550*n* and the N-type well switch 555*a*, . . . , 555*n*. The N-type wells 552U of the unselected block 412U is connected to the voltage level of the ground reference voltage source (0.0V).

To transfer the very high positive erase voltage present on the selected high voltage power supply voltage line XT 535S to the selected word line 432S, the PMOS high voltage isolators 550*a*, . . . , 550*n* are activated with the isolation signal ISOB 566 is set to the voltage level of the ground reference voltage source (0.0V). The out of phase read signal RDB 564, first positive high voltage power source VPX1 527*a*, the second high voltage power source VPX0 527*b*, and the positive N-well biasing voltage source VP1 562 are set to the very high positive erase voltage is from approximately +8.0V to approximately +10.0V to set the selected word line 432S to the voltage level of the very high positive erase. The first high negative voltage source VNX0 526*a*, the second negative high voltage source VNX1 526*b*, the negative N-well biasing voltage source VN1 560 and isolation signal ISOP 528 are set to the voltage level of the ground reference voltage source (0.0V) to set the unselected word lines 432SU of the selected block 412S to approximately the voltage level of the ground reference voltage source (0.0V).

FIG. 15 is a table illustrating the voltage levels applied to the source line decoder of FIG. 8 for generating the biasing voltages for the source lines of both the single level cell program and the multiple level cell program memory cells of the NOR flash nonvolatile memory device for the page, block, or sector erase. In the erase operation for the page, block, sector all the source lines 426S, 426SU, and 426U are selected and set to the very high negative erase voltage level. The very high negative erase voltage level of from approximately −8.0V to approximately −10.0V, because the very high negative erase voltage applied to the P-type well TPW 244S is transferred from source line select line SLS 632. All the source line address lines ST 620S and 620U are selected and set to approximately the voltage level of the ground reference voltage source (0.0V). All the block source line selection signals 610S and 610U are selected and set to the voltage level of the power=supply voltage source VDD. All the block gate select lines BLG 433S and 433U are selected and set to approximately the voltage level of the ground reference voltage source (0.0V). The out of phase erase command signal 615, the positive high voltage source VP2 616, and the in-phase program command signal PG 618 are set to approximately the voltage level of the ground reference voltage source (0.0V). The source line select line SLS 632 and the source line erase isolation signal DISE 630 are set to the very high negative erase voltage level. The out-of-phase program command signal PGB 619 is set to the voltage level of the power supply voltage source. The very high negative erase voltage level as applied to the source line select line SLS 632 is fed to the selected source lines 426S, but to prevent the very high negative erase voltage level of from approximately −8.0V to approximately −10.0V from passing to all the source lines 426U, 426SU, and 426U in a selected sector the source line address lines ST 620S, the NMOS transistors 625a, 625b, and 625c must be turned off. The source line erase isolation signal DISE 630 is set to the very high negative erase voltage level to turn off the NMOS transistors 625a, 625b, and 625c.

Returning now to FIG. 11, after the completion of the erase operation (Box 725), the page erase verify operation is executed (Box 730) to determine if the erase has been successfully accomplished. If the erase is not successful, a loop counter is tested (Box 735) to assess that the maximum number of erasure trials is not exceeded. If the maximum number of erasure trials is not exceeded, the loop counter is incremented (Box 740) and the page erase operation is executed repetitively until the maximum number of erasure trials is exceeded and the nonvolatile memory device is declared as having failed (Box 745) or the erasure is a success and the nonvolatile memory device is declared as having successfully been erased (Box 750).

The voltage levels for the page erase verification for the array 405 of the NMOS floating gate transistors M0, . . . , Mn are shown in FIG. 13a for a single level cell program and FIG. 13b for a multiple level cell program. Referring to FIGS. 13a and 13b, the unselected word lines 432U of the unselected blocks 412U and the unselected word lines 432SU of the selected blocks 412S are set to the word line read inhibit voltage that is approximately the voltage level of the ground reference voltage source (0.0V). The word line read inhibit voltage level is set to turn off the unselected NMOS floating gate transistors M0, . . . , Mn to prevent sub-threshold leakage currents. The selected word line 432S is set to a voltage level of the lower boundary of the erase threshold voltage Vt1L or approximately +5.0V for the single level cell program as shown in FIG. 13a. The selected word line 432S is set to a voltage level of the lower boundary of the erase threshold voltage Vt3L or approximately +5.0V for the multiple level cell program as shown in FIG. 13b.

Referring to FIGS. 14a and 14b, the selected word line 432S is set to the lower boundary of the erase threshold voltage Vt1L by setting selected high voltage power supply voltage line XT 535S to the voltage level of the lower boundary of the erase threshold voltage level (Vt1L for single level program cell and VT3L for multi-level program cell). The voltage level of the selected in-phase block select signals XD 530S, the first positive high voltage power source VPX1 527a, the second high voltage power source VPX0 527b, negative N-well biasing voltage source VN1 560, and the positive N-well biasing voltage source VP1 562 are set to lower boundary of the erase threshold voltage (Vt1L for single level program cell and VT3L for multi-level program cell). to pass the lower boundary of the erase threshold voltage (Vt1L for single level program cell and VT3L for multi-level program cell) to the selected word line 432S. The out of phase read signal RDB 564, the first high negative voltage source VNX0 526a, the second negative high voltage source VNX1 526b, and the isolation signal ISOP 528 are set to the voltage level of the ground reference voltage source (0.0V). These voltage levels, as described, pass the lower boundary of the erase threshold voltage (Vt1L for single level program cell and VT3L for multi-level program cell) from the selected high voltage power supply voltage line XT 535S to the selected word line 432S. Further, The voltage levels, as described, pass the voltage level of the ground reference voltage source (0.0V) from the unselected high voltage power supply voltage line XT 535U to the unselected word line 432U.

The bit lines local bit lines 450a, . . . , 450k and 451a, . . . , 451k as shown in FIG. 5 are selectively connected to the associated sector bit lines 455a, 455b, 455k. Two of the sector bit lines 455a, 455b, 455k are selectively connected to one of the global bit lines 470a, . . . , 470n. The local bit line 450a, . . . , 450k and 451a, . . . , 451k of one column is read or verified followed by reading or verifying the second local bit line 450a, . . . , 450k and 451a, . . . , 451k of the adjacent associated column. To accomplish this, the selected bit lines LBL 450S for the column being read is pre-charged to the pre-charge voltage level of the power supply voltage source VDD less the threshold voltage Vt (VDD−Vt) for sensing the status of the selected NMOS floating gate transistors M0, . . . , Mn on the activated column. The pre-charge voltage level (VDD−Vt) will be discharged to 0V when the NMOS floating gate transistor M0, . . . , Mn has not been successfully erased to the erased threshold voltage level is lower than the lower boundary of the erased threshold voltage level (Vt1L for single level program cell and VT3L for multi-level program cell). If the NMOS floating gate transistors M0, . . . , Mn are erased, the pre-charged level will be maintained when the threshold voltage of the erased NMOS floating gate transistors M0, . . . , Mn is greater than the erased threshold voltage level (Vt1L for single level program cell and VT3L for multi-level program cell). Since, all the local bit lines 450a, . . . , 450k and 451a, . . . , 451k are tested during the erase verify operation, there are no unselected local bit lines 450U. The selected block gate select line 433S for all the blocks of the selected sector are set to the voltage level of the high read select voltage HV" of approximately +5.0V to fully couple the local bit line 450a, . . . , 450k and 451a, . . . , 451k to the associated sector bit lines 455a, 455b, 455k.

The selected source line 426S in the selected sector 412S are set to the voltage level of the ground reference voltage source (0.0V). The unselected source lines 426U are set to the source line read inhibit voltage is approximately +1.0V. The source line read inhibit voltage is approximately equal to the bit line read biasing voltage to shift the threshold voltages of the unselected NMOS floating gate transistors M0, . . . , Mn such that the sub-threshold leakage current is minimized. The selected global bit line select line 467S of the selected sector 410S are set to the voltage level of the power supply voltage source VDD to connect a first set of sector bit lines 455a, 455b, . . . , 455k to the associated global bit lines 470a, . . . , 470n. The unselected global bit line select lines 467U of the selected sector 410S are set to the voltage level of the power supply voltage source VDD to disconnect a second set of sector bit lines 455a, 455b, . . . , 455k from the associated global bit lines 470a, . . . , 470n. The P-type well TPW 244S selected sector 410S and the P-type well TPW 244U unselected sectors 410U are set to the voltage level of the ground reference voltage source (0.0V).

To establish the voltage levels as described for the erase verification in FIGS. 13a and 13b, the source line decoder 415 has the voltage levels shown in FIG. 15. Referring to FIG. 15, the selected source line 426S is set to the voltage level of the ground reference voltage source (0.0V) and the unselected source lines 426SU and 426U are set to the first read inhibit voltage VS1* that is approximately +1.0V. Further, the selected block gate select line 433S and the unselected block gate select lines 433U are to be set to the voltage level of the high source line select voltage HV" that is approximately +5.0V. To accomplish these voltage levels, the selected source line address line ST 620S for the selected source line 426S is set to the voltage level of the ground reference voltage source (0.0V) and the unselected source line address line ST 620U is set to the first read inhibit voltage VS1*. The selected block source line selection signal SXD 610S is set to the voltage level of the power supply voltage source VDD and the unselected block source line selection signal SXD 610U is set to the voltage level of the ground reference voltage source (0.0V). The out of phase erase command signal ERSB 615 is set to the voltage level of the power supply voltage source VDD. The positive high voltage source VP2 616 and the out-of-phase program command signal PGB 619 are set to voltage level of the high source line select voltage HV" that is approximately +5.0V. The source line select line SLS 632 is set to the voltage level of the first read inhibit voltage VS1*. The source line erase isolation signal DISE 630 is set to the voltage level of the power supply voltage source VDD. The in-phase program command signal PG 618 is set to approximately the voltage level of the ground reference voltage source (0.0V).

Return now to FIG. 11. If the operation is to be a block erase, the block to be erased is selected (Box 715) and the block is erased (Box 725). Referring now to FIGS. 14a and 14b, the voltage levels for the block erase are identical to that of the page erase described above except that there are no unselected word lines 432SU in the selected block 412S. All the word lines 432S within the selected block 412S are now selected for erasure and placed at the very high positive erase voltage level that has a magnitude of from approximately +8.0V to approximately +10.0V to accomplish the block erase. In the unselected sectors 410a, . . . , 410m of the array 405, the P-type well TPW 244U is set to approximately the voltage level of the ground reference voltage source (0.0V). The word lines of the unselected sectors 410U are discon-nected and allow to float such that the ground reference voltage source (0.0V) is coupled to the word lines of the unselected sectors (0.0V).

Returning now to FIG. 11, after the completion of the erase operation (Box 725), the block erase verify operation is executed (Box 730) to determine if the erase has been successfully accomplished. The block erase verify is identical to the page erase verify, except, again, there are no unselected word lines 432U. The selected word lines 432S are set to a voltage level of the lower boundary of the erase threshold voltage Vt1L or approximately +5.0V for the single level cell program as shown in FIG. 13a. The selected word lines 432S are set to a voltage level of the lower boundary of the erase threshold voltage Vt3L or approximately +5.0V for the multiple level cell program as shown in FIG. 13b.

Returning to FIG. 11, if the block erase is not successful, a loop counter is tested (Box 735) to assess that the maximum number of erasure trials is not exceeded. If the maximum number of erasure trials is not exceeded, the loop counter is incremented (Box 740) and the page erase operation is executed repetitively until the maximum number of erasure trials is exceeded and the nonvolatile memory device is declared as having failed (Box 745) or the erasure is a success and the nonvolatile memory device is declared as having successfully been erased (Box 750).

Return now to FIG. 11. If the operation is to be a sector erase, the sector to be erased is selected (Box 715) and the sector is erased (Box 725). Referring now to FIGS. 14a and 14b, the voltage levels for the sector erase are identical to that of the page erase and block erase described above except that there are no unselected word lines 432SU or 432U. All the word lines 432S are now selected for erasure and placed at the very high positive erase voltage level that has a magnitude of from approximately +8.0V to approximately +10.0V to accomplish the sector erase. In the unselected sectors 410a, . . . , 410m of the array 405, the P-type well TPW 244U is set to approximately the voltage level of the ground reference voltage source (0.0V). The word lines of the unselected sectors 410U are disconnected and allow to float such that the ground reference voltage source (0.0V) is coupled to the word lines of the unselected sectors (0.0V).

Returning now to FIG. 11, after the completion of the erase operation (Box 725), the sector erase verify operation is executed (Box 730) to determine if the erase has been successfully accomplished. The sector erase verify is identical to the page erase verify, except, again, there are no unselected word lines 432SU or 432U. All the selected word lines 432S are set to a voltage level of the lower boundary of the erase threshold voltage Vt1L or approximately +5.0V for the single level cell program as shown in FIG. 13a. The selected word lines 432S are set to a voltage level of the lower boundary of the erase threshold voltage Vt3L or approximately +6.0V for the multiple level cell program as shown in FIG. 13b. Returning to FIG. 11, if the sector erase is not successful, a loop counter is tested (Box 735) to assess that the maximum number of erasure trials is not exceeded. If the maximum number of erasure trials is not exceeded, the loop counter is incremented (Box 740) and the page erase operation is executed repetitively until the maximum number of erasure trials is exceeded and the nonvolatile memory device is declared as having failed (Box 745) or the erasure is a success and the nonvolatile memory device is declared as having successfully been erased (Box 750).

Returning now to FIG. 10, if the operation is determined (Box 700) not to be an erase operation, the operation is determine (Box 755) if it is a program operation. If the operation is determined (Box 755) to be a program operation (referring to FIG. 12), data is loaded (Box 756) to the data register and sense amplifier 435 and the page to be programmed is selected (Box 758). The selected page is then programmed with the voltage levels applied as shown in FIGS. 13a, 13b, 14a, 14b, and 15. Referring to FIGS. 13a and 13b, the unselected word lines 432U of the unselected blocks 412U and the unselected word lines 432SU of the selected block 412S are set to the negative word line program inhibit voltage that is approximately −2.0V. The negative word line program inhibit voltage biases the unselected NMOS floating gate transistors M0, . . . , Mn of the array to be turned off to minimized the sub-threshold leakage current during programming. The selected word line 432S is set to the high negative program voltage level. The high negative program voltage level is from approximately −8.0V to approximately −10, which is somewhat less than the breakdown voltage BVDSS of the transistors of the row decoder 420 of FIG. 4. The selected local bit lines LBL 450S for the columns that are to be programmed are set to the high program voltage that is approximately +5.0V for the single level cell program cell (FIG. 13a). The selected local bit lines LBL 450S for the columns that are to be programmed are set to one of the program voltages that establish the desired threshold voltage representing the data to be programmed. The program voltages, as shown in FIG. 13b, are approximately +4.0V for the first level cell programmed threshold voltage Vt2, approximately +5.0V for the first level cell programmed threshold voltage Vt1, and approximately +6.0V for the first level cell programmed threshold voltage Vt0. The unselected local bit lines LBL 450U and the program inhibit of the selected local bit lines LBL 450S for the columns that are to remain erased are set to a voltage level of approximately the ground reference voltage source (0.0V) or alternately disconnected and allowed to float. To insure that the program voltages are passed from the column address decoder 445 to the global bit lines 447a, . . . , 447n to the sector bit lines 455a, 455b, 455k to the local bit line 450a, . . . , 450k and 451a, . . . , 451k, the selected block gate select line 433S for the selected block 412S and the sector gate select line 467S for the selected sector 410S is set to the high program select voltage that is from approximately +8.0V to approximately +10.0V. The unselected block select gate lines 433U for the unselected blocks 412U and the unselected sector gate select lines 467U for the unselected sectors 410U are set to the voltage level of the ground reference voltage source. The selected source line 426S connected to the selected page of the selected block 412S is set to the voltage level of the ground reference voltage source. The unselected source lines 426U of the selected sector 410S are set to the source line program inhibit voltage that is from approximately +1.5V to approximately 1.8V. The selected P-type well TPW 244S in which the selected sector 410S is formed and the unselected P-type wells TPW 244U in which the unselected sectors 410U are formed are set to the voltage level of the ground reference voltage source.

To establish the voltage levels as described for the programming in FIGS. 13a and 13b, the row decoder 420 has the voltage levels shown in FIGS. 14a and 14b. To have the selected word line 432S set to the high negative program voltage. The high negative program voltage is from approximately −8.0V to approximately −10.0V, the selected high voltage power supply voltage line XT 535S associated with the selected word line 432S set to the very high negative program voltage. To have the unselected word lines 432SU and 432U set to the negative program inhibit voltage that is approximately −2.0V, the unselected high voltage power supply voltage line XT 535U associated with the unselected word lines 432U set to the negative program inhibit voltage that is approximately −2.0V. The voltage level of the selected in-phase block select signals XD 530S, indicating that a block 412S is selected is set to approximately the voltage level of the ground reference voltage source (0.0V) such that the very high negative program voltage that is coupled from the row decode circuit 540a, . . . , 540n through the PMOS high voltage isolators 550a, . . . , 550n to the selected word line 432S. The voltage level of the out-of-phase block select signals XD 530U, indicating that a block 412U is unselected, is set to the very high negative program voltage to couple the negative program inhibit voltage that is approximately −2.0V to the unselected high voltage power supply voltage line XT 535U to the unselected word line 432SU and 432U. The N-type wells 552S of the selected block 412S and the N-type wells 552U of the unselected blocks 412U is connected to the voltage level of approximately the ground reference voltage source (0.0V).

To establish the voltage levels as described for the programming in FIGS. 13a and 13b, the source line decoder 415 has the voltage levels shown in FIG. 15. Referring to FIG. 15, the selected source line 426S is set to the voltage level of the ground reference voltage source (0.0V) or disconnected and allowed to float. The unselected source lines 426SU and 426U are set to the second read inhibit voltage VS2 that is from approximately +1.5V to approximately 1.8V. Further, the selected block gate select lines 433S is to be set to the voltage level of very high program voltage. The very high program voltage is from approximately +8.0V to approximately +10.0V and the unselected block gate select lines 433U is to be set to the voltage level of approximately the ground reference voltage source (0.0V). To accomplish these voltage levels, the selected source line address line ST 620S for the selected source line 426S is set to the voltage level of the ground reference voltage source (0.0V) or disconnected and allowed to float. The unselected source line address line ST 620U is set to the first read inhibit voltage VS2. The magnitude of the first read inhibit voltage VS2 is from approximately +1.5V to approximately +1.8V. The selected block source line selection signal SXD 610S is set to the voltage level of the power supply voltage source VDD and the unselected block source line selection signal SXD 610U is set to the voltage level of the ground reference voltage source (0.0V). The out of phase erase command signal ERSB 615 is set to the voltage level of the power supply voltage source VDD. The positive high voltage source VP2 616 and the in-phase program command signal PG 618 are set to very high program voltage that is from approximately +8.0V to approximately +10.0V. The source line select line SLS 632 is set to the voltage level of the first read inhibit voltage VS2. The source line erase isolation signal DISE 630 is set to the voltage level of the high program select voltage is approximately +5.0V. The out-of-phase program command signal PGB 619 is set to approximately the voltage level of the ground reference voltage source (0.0V).

Returning now to FIG. 11, after the completion of the program operation (Box 760), the page program verify operation is executed (Box 765) to determine if the program has been successfully accomplished. If the program is not successful, a loop counter is tested (Box 770) to assess that the maximum number of program trials is not exceeded. If the maximum number of program trials is not exceeded, the loop counter is incremented (Box 775) and the page program operation is executed repetitively until the maximum number of program trials is exceeded and the nonvolatile memory device is declared as having failed (Box 780) or the programming is a success and the nonvolatile memory device is declared as having successfully been programmed (Box 785).

The program verify (Box 765) is essentially the same as the erase verify (Box 730) of FIG. 11 except the selected word line 432S of the single level cell program cell of FIG. 13a is set to the upper boundary of the threshold voltage Vt0H to evaluate the programmed threshold voltage of the selected NMOS floating gate transistors M0, . . . , Mn. In the case of the multiple level cell program cell of FIG. 13b, selected word line 432S is iteratively set to the upper boundary of the first threshold voltage Vt0H, second threshold voltage Vt1H, and the third threshold voltage Vt2H to evaluate the programmed threshold voltage of the selected NMOS floating gate transistors M0, . . . , Mn.

Returning now to FIG. 10, if the operation is determined (Box 755) not to be a program operation, the operation is a read operation and the read operation is evaluated to determine (Box 790) if the read is a slow read or a fast read. If the read is a slow read, the selected page is then read with the voltage levels applied as shown in FIGS. 13a, 13b, 14a, 14b, and 15. Referring to FIGS. 13a and 13b, the unselected word lines 432U of the unselected blocks 412U and the unselected word lines 432SU of the selected block 432S are voltage level of world line read inhibit voltage level of approximately −2.0V. The word line read inhibit voltage turns off the unselected NMOS floating gate transistors M0, . . . , Mn such that the sub-threshold leakage current is minimized. The selected word line 412S is set to word line read biasing voltage that is the voltage level of the power supply voltage source VDD for the single level cell program or to the high read select voltage HV" of approximately +5.0V for the multiple level cell program. The selected local bit lines LBL 450S for the columns that are to be read are set to the first read biasing voltage of approximately +1.0V for the single level cell program cell (FIG. 13a) and the multiple level cell program cell (FIG. 13b). The unselected local bit lines LBL 450U for the columns that are set to a voltage level of approximately the ground reference voltage source (0.0V). To insure that the voltages are passed from the column address decoder 445 to the global bit lines 447a, . . . , 447n to the sector bit lines 455a, 455b, 455k to the local bit line 450a, . . . , 450k and 451a, . . . , 451k, the selected block gate select line 433S for the selected block 412S is set to the high read select voltage HV" that is approximately +5.0V to fully couple the local bit line 450a, . . . , 450k and 451a, . . . , 451k to the associated sector bit lines 455a, 455b, 455k. The sector gate select line 467S for the selected sector 410S is set to voltage level of the power supply voltage source VDD. The unselected sector gate select lines 467U for the unselected sectors 410U are set to the voltage level of the ground reference voltage source (0.0V). The selected source line 426S connected to the selected page of the selected block 412S is set to the voltage level of the ground reference voltage source (0.0V). The unselected source lines 426U of the selected block 412S is set to the source line read inhibit voltage that is approximately +1.0V to shift the threshold voltage levels of the unselected NMOS floating gate transistors M0, . . . , Mn to further minimize the sub-threshold leakage current. The selected P-type well TPW 244S in which the selected sector is formed and the unselected P-type wells TPW 244U in which the unselected sectors are formed are set to the voltage level of the ground reference voltage source.

To establish the read voltages of FIGS. 13a and 13b (referring to FIGS. 14a and 14b), the selected word line 432S is set to the voltage level of the power supply voltage source VDD by setting selected high voltage power supply voltage line XT 535S to the voltage level of the power supply voltage source VDD. The voltage level of the selected in-phase block select signals XD 530S, the first positive high voltage power source VPX1 527a, the second high voltage power source VPX0 527b, negative N-well biasing voltage source VN1 560, and the positive N-well biasing voltage source VP1 562 are set to the voltage level of the power supply voltage source VDD to pass the voltage level of the power supply voltage source VDD to the selected word line 432S. The out of phase read signal RDB 564, the first high negative voltage source VNX0 526a, the second negative high voltage source VNX1 526b, and the isolation signal ISOP 528 are set to the voltage level of the ground reference voltage source (0.0V). These voltage levels, as described, pass the voltage level of the power supply voltage source VDD from the selected high voltage power supply voltage line XT 535S to the selected word line 432S. Further, The voltage levels, as described, pass the voltage level of the ground reference voltage source (0.0V) from the unselected high voltage power supply voltage line XT 535U to the unselected word line 432U.

The local bit lines 450a, . . . , 450k and 451a, . . . , 451k as shown in FIG. 5 are selectively connected to the associated sector bit lines 455a, 455b, . . . , 455k. Two of the sector bit lines 455a, 455b, . . . , 455k are selectively connected to one of the global bit lines 470a, . . . , 470n. The local bit line 450a, . . . , 450k and 451a, . . . , 451k of one column is read or verified followed by reading the second local bit line 450a, . . . , 450k and 451a, . . . , 451k of the adjacent associated column. To accomplish this, the selected bit lines LBL 450S for the column being read is set to the voltage level of the bit line biasing voltage that is approximately +1.0V for sensing the status of the selected NMOS floating gate transistors M0, . . . , Mn on the activated column. The unselected bit lines LBL 450U for the column not being read is set to the voltage level of the ground reference voltage source (0.0V) to disable the column not being read. The selected block gate select line 433S and the unselected block gate select line 433U for the selected sector is set to the voltage level of the high read select voltage HV" that is approximately +5.0V to fully couple the local bit line 450a, . . . , 450k and 451a, . . . , 451k to the associated sector bit lines 455a, 455b, . . . , 455k.

The selected source line 426S in the selected sector 412S are set to the voltage level of the ground reference voltage source (0.0V). The unselected source lines 426U is first read inhibit voltage is approximately +1.0V to shift the threshold voltage levels of the unselected NMOS floating gate transistors M0, . . . , Mn to further minimize the sub-threshold leakage current. The selected global bit line select line 467S of the selected sector 410S are set to the voltage level of the power supply voltage source VDD to connect a first set of sector bit lines 455a, 455b, 455k to the associated global bit lines 470a, . . . , 470n. The unselected global bit line select lines 467U of the selected sector 410S are set to the voltage level of the ground reference voltage source (0.0V) to disconnect a second set of sector bit lines 455a, 455b, 455k from the associated global bit lines 470a, . . . , 470n. For the read and program verify operations, the enabled global bit line select lines SLG[0] 467a and SLG[1] 467b will determine the sequence (order) of the reading or verifying of the adjacent columns of the NMOS floating gate transistors M0, . . . , Mn. The split program and program verify operations are done according to the order of activation of the associated global bit line select lines SLG[0] 467a and SLG[1] 467b. The P-type well TPW 244S selected sector 410S and the P-type well TPW 244U unselected sectors 410U are set to the voltage level of the ground reference voltage source (0.0V).

To establish the voltage levels as described for the read operation in FIGS. 13a and 13b, the source line decoder 415 has the voltage levels shown in FIG. 15. Referring to FIG. 15, the selected source line 426S is set to the voltage level of the ground reference voltage source (0.0V) and the unselected source lines 426SU and 426U are set to the first read inhibit voltage VS1* that is approximately +1.0V to shift the threshold voltage levels of the unselected NMOS floating gate transistors M0, . . . , Mn to further minimize the sub-threshold leakage current. Further, the selected block gate select line 433S and unselected block gate select lines 433U are to be set to the voltage level of the high source line select voltage HV''' that is approximately +5.0V. To accomplish these voltage levels, the selected source line address line ST 620S for the selected source line 426S is set to the voltage level of the ground reference voltage source (0.0V) and the unselected source line address line ST 620U is set to the first read inhibit voltage VS1*. The selected block source line selection signal SXD 610S is set to the voltage level of the power supply voltage source VDD and the unselected block source line selection signal SXD 610U is set to the voltage level of the ground reference voltage source (0.0V). The out of phase erase command signal ERSB 615 is set to the voltage level of the power supply voltage source VDD. The positive high voltage source VP2 616 and the out-of-phase program command signal PGB 619 are set to voltage level of the high source line select voltage HV''' that is approximately +5.0V. The source line select line SLS 632 is set to the voltage level of the first read inhibit voltage VS1*. The source line erase isolation signal DISE 630 is set to the voltage level of the power supply voltage source VDD. The in-phase program command signal PG 618 is set to approximately the voltage level of the ground reference voltage source (0.0V).

Returning now to FIG. 10, if the read is a fast read, the selected page is then read with the voltage levels applied as shown in FIGS. 13a, 13b, 14a, 14b, and 15. Referring to FIGS. 13a and 13b, the unselected word lines 432U of the unselected blocks 412U and the unselected word lines 432SU of the selected block 432S are voltage level of world line read inhibit voltage level of approximately the voltage level of the ground reference voltage source (0.0V). The word line read inhibit voltage turns off the unselected NMOS floating gate transistors M0, . . . , Mn such that the sub-threshold leakage current is minimized. The selected word line 412S is set to the word line read biasing voltage level that is voltage level of the high read select voltage HV''' that is approximately +5.0V for both the single level cell program and the multiple level cell program. The selected local bit lines LBL 450S for the columns that are to be read are set to the first read biasing voltage that is approximately +1.0V for the single level cell program cell (FIG. 13a) and the multiple level cell program cell (FIG. 13b). The unselected local bit lines LBL 450U for the columns that are set to a voltage level of approximately the ground reference voltage source (0.0V). To insure that the voltages are passed from the column address decoder 445 to the global bit lines 447a, . . . , 447n to the sector bit lines 455a, 455b, 455k to the local bit line 450a, . . . , 450k and 451a, . . . , 451k, the selected block gate select line 433S for the selected block 412S is set to the high read select voltage HV''' of approximately +5.0V to fully couple the local bit line 450a, . . . , 450k and 451a, . . . , 451k to the associated sector bit lines 455a, 455b, 455k. The sector gate select line 467S for the selected sector 410S is set to voltage level of the power supply voltage source VDD. The unselected sector gate select lines 467U for the unselected sectors 410U are set to the voltage level of the ground reference voltage source. The selected source line 426S connected to the selected page of the selected block 412S is set to the voltage level of the ground reference voltage source. The unselected source lines 426U of the selected block 412S is set to the source line read inhibit voltage that is approximately +1.0V to shift the threshold voltage levels of the unselected NMOS floating gate transistors M0, . . . , Mn to further minimize the sub-threshold leakage current. The selected P-type well TPW 244S in which the selected sector is formed and the unselected P-type wells TPW 244U in which the unselected sectors are formed are set to the voltage level of the ground reference voltage source.

To establish the read voltages of FIGS. 13a and 13b (referring to FIGS. 14a and 14b), the selected word line 432S is set to the voltage level word line read biasing voltage that is high read select voltage HV''' by setting selected high voltage power supply voltage line XT 535S to the voltage level of the voltage level of the high read select voltage HV'''. The voltage level of the selected in-phase block select signals XD 530S, the first positive high voltage power source VPX1 527a, the second high voltage power source VPX0 527b, negative N-well biasing voltage source VN1 560, and the positive N-well biasing voltage source VP1 562 are set to the voltage level of the power supply voltage source VDD to pass the voltage level of the power supply voltage source VDD to the selected word line 432S. The out of phase read signal RDB 564, the first high negative voltage source VNX0 526a, the second negative high voltage source VNX1 526b, and the isolation signal ISOP 528 are set to the voltage level of the ground reference voltage source (0.0V). These voltage levels, as described, pass the voltage level of the power supply voltage source VDD from the selected high voltage power supply voltage line XT 535S to the selected word line 432S. Further, The voltage levels, as described, pass the voltage level of the ground reference voltage source (0.0V) from the unselected high voltage power supply voltage line XT 535U to the unselected word line 432U.

The local bit lines 450a, . . . , 450k and 451a, . . . , 451k as shown in FIG. 5 are selectively connected to the associated sector bit lines 455a, 455b, . . . , 455k. Two of the sector bit lines 455a, 455b, 455k are selectively connected to one of the global bit lines 470a, . . . , 470n. The local bit line 450a, . . . , 450k and 451a, . . . , 451k of one column is read or verified followed by reading or verifying the second local bit line 450a, . . . , 450k and 451a, . . . , 451k of the adjacent associated column. To accomplish this, the selected bit lines LBL 450S for the column being read is set to the voltage level of the bit line biasing voltage that is approximately +1.0V for sensing the status of the selected NMOS floating gate transistors M0, . . . , Mn on the activated column. The unselected bit lines LBL 450U for the column not being read is set to the voltage level of the ground reference voltage source (0.0V) to disable the column not being read. The selected block gate select line 433S and the unselected block gate select line 433U for the selected sector is set to the voltage level of the high read select voltage HV''' that is approximately +5.0V to fully couple the local bit line 450a, . . . , 450k and 451a, . . . , 451k to the associated sector bit lines 455a, 455b, 455k.

The selected source line 426S in the selected sector 412S are set to the voltage level of the ground reference voltage source (0.0V). The unselected source lines 426U are set to a first read inhibit voltage is approximately +1.0V to shift the threshold voltage levels of the unselected NMOS floating gate transistors M0, . . . , Mn to further minimize the sub-threshold leakage current. The selected global bit line select line 467S of the selected sector 410S are set to the voltage level of the power supply voltage source VDD to connect a first set of sector bit lines 455a, 455b, 455k to the associated global bit lines 470a, . . . , 470n. The unselected global bit line select lines 467U of the selected sector 410S are set to the voltage level of the ground reference voltage source (0.0V) to disconnect a second set of sector bit lines 455a, 455b, 455k from the associated global bit lines 470a, . . . , 470n. For the read and program verify operations, the enabled global bit line select lines SLG[0] 467a and SLG[1] 467b will determine the sequence (order) of the reading or verifying of the adjacent columns of the NMOS floating gate transistors M0, . . . , Mn. The split program and program verify operations are done according to the order of activation of the associated global bit line select lines SLG[0] 467a and SLG[1] 467b. The P-type well TPW 244S selected sector 410S and the P-type well TPW 244U unselected sectors 410U are set to the voltage level of the ground reference voltage source (0.0V).

To establish the voltage levels as described for the read operation in FIGS. 13a and 13b, the source line decoder 415 has the voltage levels shown in FIG. 15. Referring to FIG. 15, the selected source line 426S is set to the voltage level of the ground reference voltage source (0.0V) and the unselected source lines 426SU and 426U are set to the first read inhibit voltage VS1* that is approximately +1.0V to shift the threshold voltage levels of the unselected NMOS floating gate transistors M0, . . . , Mn to further minimize the sub-threshold leakage current. Further, the selected block gate select line 433S and unselected block gate select lines 433U are to be set to the voltage level of the high source line select voltage HV" that is approximately +5.0V. To accomplish these voltage levels, the selected source line address line ST 620S for the selected source line 426S is set to the voltage level of the ground reference voltage source (0.0V) and the unselected source line address line ST 620U is set to the first read inhibit voltage VS1* that is approximately +1.0V. The selected block source line selection signal SXD 610S is set to the voltage level of the power supply voltage source VDD and the unselected block source line selection signal SXD 610U is set to the voltage level of the ground reference voltage source (0.0V). The out of phase erase command signal ERSB 615 is set to the voltage level of the power supply voltage source VDD. The positive high voltage source VP2 616 and the out-of-phase program command signal PGB 619 are set to voltage level of the high source line select voltage HV" that is approximately +5.0V. The source line select line SLS 632 is set to the voltage level of the first read inhibit voltage VS1*. The source line erase isolation signal DISE 630 is set to the voltage level of the power supply voltage source VDD. The in-phase program command signal PG 618 is set to approximately the voltage level of the ground reference voltage source (0.0V).

In other embodiments of this invention, nonvolatile memory device 400 incorporating NOR flash floating-gate transistors may have NAND strings of flash floating gate transistor cells and be in keeping with the intent of this invention. Further, the description of the nonvolatile memory device 400 incorporating NOR flash floating-gate transistors may also be NOR or NAND flash charge trapping transistors formed with a first layer of silicon dioxide, a layer of silicon nitride, a second layer of silicon oxide and a layer of polycrystalline silicon commonly referred to as a SONOS charge trapping transistor.

While this invention has been particularly shown and described with reference to the preferred embodiments thereof, it will be understood by those skilled in the art that various changes in form and details may be made without departing from the spirit and scope of the invention.

The invention claimed is:

1. A nonvolatile memory device comprising:
an array of nonvolatile memory cells arranged in rows and columns, such that the nonvolatile memory cells located on each column are connected to communicate with a local bit line associated with each column, the nonvolatile memory cells on each row are connected to communicate with a word line, and the nonvolatile memory cells on two adjacent rows are commonly connected to a source line, wherein the array of nonvolatile memory cells is partitioned into sectors, where each sector is placed in a first isolation well and each sector of the array of the nonvolatile memory cells is divided into blocks and each block is divided into pages, and each page includes one row of the nonvolatile memory cells;
a plurality of peripheral circuits connected to the word lines, bit lines, and sources lines to provide biasing voltages for reading, programming, erasing, and verifying selected nonvolatile memory cells, such that the biasing voltages do not exceed a drain-to-source breakdown voltage of the peripheral circuits for eliminating high voltage transistors with larger dimensions and wherein the biasing voltages include a word line read inhibit voltage level that is applied to the word lines and a source line read inhibit voltage during a read operation and a word line program inhibit voltage level that is applied to unselected word lines and a source line program inhibit voltage level that applied to unselected source lines during a program operation to minimize a sub-threshold leakage current through each of the unselected nonvolatile memory cells.

2. The nonvolatile memory device of claim 1 wherein the peripheral circuit comprises a plurality of transistors, such that the drain-to-source breakdown voltage is less than 10.0V.

3. The nonvolatile memory device of claim 1 wherein the groups of nonvolatile memory cells are connected into a NOR configuration or a NAND configuration.

4. The nonvolatile memory device of claim 1 wherein the groups of nonvolatile memory cells comprise charge storing floating gate transistors or charge trapping SONOS transistors.

5. The nonvolatile memory device of claim 1 wherein the peripheral circuit comprises:
a row decoder for selecting rows of the nonvolatile memory cells and the row decoder comprises:
a first block selector that activates when a block address indicates that a block is selected,
a word line selector circuit connected to the first block selector circuit, which based on a row address provides the word lines with word line biasing voltages necessary for biasing the control gates of the nonvolatile memory cells for reading, programming, verifying, and erasing;
a first voltage level shifter connected to the first block selector circuit for shifting a voltage level of a block select signal to activate pass gates to transfer the biasing voltages to the word lines of the selected block for biasing the control gates of the nonvolatile memory cells of the block for reading, programming, verifying, and erasing the selected nonvolatile memory cells.

6. The nonvolatile memory device of claim 5 wherein the peripheral circuit comprises:
a source decoder circuit connected to each source line within each block to transfer necessary source line biasing voltage for reading, programming, verifying, and erasing selected nonvolatile memory cells wherein the source decoder comprises:
a second block selector circuit which activates for the selection of the block being addressed, and
a source voltage level shifter connected to the block selector circuit to shift a voltage level of the block selector signals for activating pass transistors to transfer source line biasing voltages to the source lines connected to the sources of the nonvolatile memory cells of the selected block for reading, programming, verifying, and erasing the selected nonvolatile memory cells.

7. The nonvolatile memory device of claim 6 wherein the peripheral circuit comprises:
a column decoder in communication with a local bit line for providing bit line biasing voltages for reading, programming, verifying, and erasing selected nonvolatile memory cells.

8. The nonvolatile memory device of claim 7 wherein the row decoder and source decoder, provide the word line read inhibit voltage level, the source line read inhibit voltage level, the word line program inhibit voltage level, and the source line program inhibit voltage level to all the non-selected nonvolatile memory cells to minimize disturbances and sub-threshold leakage current in unselected nonvolatile cells resulting from the reading, programming, and verifying programming and erasing selected nonvolatile memory cells.

9. The nonvolatile memory device of claim 8 wherein for reading a selected page of the array of nonvolatile memory cells:
the row decoder transfers a word line read biasing voltage level to the word line of the selected nonvolatile memory cells and the word line read inhibit voltage level to the word lines of the unselected nonvolatile memory cells to minimize the sub-threshold leakage current through each of the unselected nonvolatile memory cells;
the column decoder transfers a first bit line read biasing voltage to the drains of the selected nonvolatile memory cells; and
the source decoder transfers source line read biasing voltage to the source lines of the selected nonvolatile memory cells and transfers a source line read inhibit voltage to the source lines of the unselected nonvolatile memory cells to minimize the sub-threshold leakage current through each of the unselected nonvolatile memory cells.

10. The nonvolatile memory device of claim 9 wherein the voltage level of the word line read biasing voltage is approximately the voltage level of the power supply voltage source for a single level cell program for slow read of the selected nonvolatile memory cells.

11. The nonvolatile memory device of claim 9 wherein the word line read biasing voltage is a high read select voltage for a multiple level cell program for slow reading of the selected nonvolatile memory cells.

12. The nonvolatile memory device of claim 9 wherein the word line read biasing voltage is a high read select voltage for the single level cell program and the multiple level cell program for fast reading of the selected nonvolatile memory cells.

13. The nonvolatile memory device of claim 12 wherein the voltage level of the power supply voltage source is +1.8V or +3.0V and the high read select voltage is approximately +5.0V.

14. The nonvolatile memory device of claim 9 wherein the voltage level of the first bit line read biasing voltage is approximately +1.0V and the source line read inhibit voltage level is approximately +1.0V.

15. The nonvolatile memory device of claim 8 wherein for programming a selected page of the array of nonvolatile memory cells:
the row decoder transfers a very high negative program voltage to the word line of the selected nonvolatile memory cells and a positive program inhibit voltage to the word lines of the unselected word lines is the selected block and the unselected blocks of the array of nonvolatile memory cells;
the column decoder transfers a bit line high program select voltage to the bit lines and thus to the drains of the selected nonvolatile memory cells; and
the source line decoder transfers the ground reference voltage level to the source lines connected to the selected nonvolatile voltage cells; and a second source line program inhibit voltage to the source lines of the unselected nonvolatile memory cells.

16. The nonvolatile memory device of claim 15 wherein the voltage level of the very high negative program voltage is less than the drain-to-source breakdown voltage level of transistors forming the row decoder for eliminating high voltage devices with larger dimensions.

17. The nonvolatile memory device of claim 16 wherein the voltage level of the high negative program voltage −10.0V to approximately −8.0V.

18. The nonvolatile memory device of claim 15 wherein the voltage level of the negative word line program inhibit biasing voltage is approximately −2.0V.

19. The nonvolatile memory device of claim 15 wherein the high program select voltage is approximately +5.0V.

20. The nonvolatile memory device of claim 15 wherein second source line program inhibit voltage is from approximately +1.5V to approximately +1.8V.

21. The nonvolatile memory device of claim 8 wherein for verifying a page program,
the row decoder transfers a voltage level of an upper boundary of a programmed threshold voltage level to the word line of the selected nonvolatile memory cells when the nonvolatile memory cells are programmed to the single level cell programming or iteratively set to a the upper boundaries of a first threshold voltage level, a second threshold voltage level and a third threshold voltage level when the nonvolatile memory cells are programmed to the multi-level programming and the row decoder transfers the word line inhibit biasing voltage to the word lines of the unselected nonvolatile memory cells;
the column decoder transfers a second bit line read biasing voltage to the drains of the selected nonvolatile memory cells to pre-charge the bit line connected to the drains of the selected nonvolatile memory cells to the second bit line read biasing voltage, wherein the pre-charged level of the second bit line read biasing voltage level is discharged to approximately 0.0V if the memory cell has not been successfully programmed to the programmed threshold voltage level that is greater than the lower boundary of the programmed threshold voltage level and if the selected nonvolatile memory cells are programmed, the pre-charged level of the second bit line read biasing voltage level will be maintained when the threshold voltage of the erased nonvolatile memory cells is less than the programmed threshold voltage level;
the source decoder transfers the ground reference voltage level to the source lines of the selected nonvolatile memory cells and the first source line read inhibit voltage to the source lines of the unselected nonvolatile memory cells.

22. The nonvolatile memory device of claim 21 wherein the upper boundary of the programmed threshold voltage level is approximately +1.5V for the single level cell programming.

23. The nonvolatile memory device of claim 21 wherein the upper boundaries of a first threshold voltage level, a second threshold voltage level and a third threshold voltage level are respectively +1.5V, +3.0V, and +4.5V for the multiple level cell programming.

24. The nonvolatile memory device of claim 21 wherein the voltage level of the second bit line read biasing voltage is the voltage level of the power supply voltage source less a threshold voltage level of an NMOS transistor, wherein power supply voltage source is +1.8V or +2.3V.

25. The nonvolatile memory device of claim 21 wherein the voltage level of the second source line read inhibit voltage is approximately +1.0V.

26. The nonvolatile memory device of claim 8 wherein for erasing a selected page, a selected block or a selected sector of the array of nonvolatile memory cells,
   a very high negative erase voltage is applied to the first isolation well into which the selected sector of nonvolatile memory cells is formed;
   the ground reference voltage level is applied to the first isolation well into which unselected sectors of nonvolatile memory cells are formed;
   the row decoder of selected blocks transfers a very high positive erase voltage to the word line of the selected nonvolatile memory cells and disconnects the word lines of the unselected nonvolatile memory cells of the selected block such that the very high negative erase voltage is coupled to the word lines of the unselected memory cells of the selected block;
   the row decoders of the unselected sectors of the nonvolatile memory cells disconnect the word lines of the unselected nonvolatile memory cells so that the ground reference voltage level is coupled from the isolation well of the isolation well of the unselected sectors to the word lines of the unselected nonvolatile memory cells in unselected blocks; and
   the source line decoder transfers the very high negative erase voltage to the selected and unselected source lines.

27. The nonvolatile memory device of claim 26 wherein the voltage levels of the very high positive erase voltage and the very high negative erase voltage is approximately the drain-to-source breakdown voltage level of transistors forming the row decoder, column decoder, and the source line decoder for eliminating high voltage devices with larger dimensions.

28. The nonvolatile memory device of claim 26 wherein the voltage level of the very high positive erase voltage is from approximately +8.0V to approximately +10.0V and the voltage level of the very high negative erase voltage is from approximately −10.0V to approximately −8.0V.

29. The nonvolatile memory device of claim 8 wherein for verifying erasing of a selected page, a selected block or a selected page of the array of nonvolatile memory cells,
   the row decoder transfers a voltage level of a lower boundary of an erased threshold voltage level to the word line of the selected nonvolatile memory cells, and second word line read inhibit biasing voltage to the word lines of the word lines of the unselected nonvolatile memory cells to minimize a sub-threshold leakage current through each of the unselected nonvolatile memory cells;
   the column decoder transfers the second bit line read biasing voltage to the drains of the selected nonvolatile memory cells to pre-charge the bit line connected to the drains of the selected nonvolatile memory cells to the second bit line read biasing voltage, wherein the pre-charged level of the second bit line read biasing voltage level is discharged to approximately 0.0V, if the memory cell has not been successfully erased to the erased threshold voltage level that is lower than the lower boundary of the erased threshold voltage level and if the selected nonvolatile memory cells are erased, the pre-charged level of the second bit line read biasing voltage level will be maintained when the threshold voltage level of the erased nonvolatile memory cells is greater than the erased threshold voltage level;
   the source line decoder transfers the ground reference voltage level to the source lines of the selected nonvolatile memory cells and the source line read inhibit voltage to the source lines of the unselected nonvolatile memory cells.

30. The nonvolatile memory device of claim 29 wherein the lower boundary of an erased threshold voltage level is approximately 6.0V for the single level cell program and a multiple level cell programming.

31. The nonvolatile memory device of claim 29 wherein the voltage level of the second bit line read biasing voltage is the voltage level of the power supply voltage source less a threshold voltage level of an NMOS transistor, wherein power supply voltage source is +1.8V or +2.3V.

32. The nonvolatile memory device of claim 29 wherein the voltage level of the source line read inhibit voltage is approximately +1.0V.

33. A method for operating an array of nonvolatile memory cells comprise the steps of:
   slow reading a selected page of the array of nonvolatile memory cells by the steps of:
      applying a first word line read biasing voltage to the word line of the selected nonvolatile memory cells when the array of nonvolatile memory cells are programmed with a single level cell program or applying a second word line read biasing voltage level to the word line of the selected nonvolatile memory cells for a multiple level cell program when the array of nonvolatile memory cells are programmed with a multiple level program;
      applying a first word line read inhibit voltage level to the word lines of the unselected nonvolatile memory cells;
      applying a first bit line read biasing voltage to bit lines of the array of the selected nonvolatile memory cells;
      applying a source line read biasing voltage to the selected source lines of the array of the selected nonvolatile memory cells; and
      applying a source line read inhibit voltage to the unselected source lines of the unselected nonvolatile memory cells to shift the threshold biasing voltages of the unselected nonvolatile memory cells to minimize the sub-threshold leakage current in the unselected nonvolatile memory cells.

34. The method for operating an array of nonvolatile memory cells of claim 33 wherein the first word line read biasing voltage is approximately the voltage level of the power supply voltage source.

35. The method for operating an array of nonvolatile memory cells of claim 33 wherein the voltage level of the power supply voltage source is +1.8V or +3.0V.

36. The method for operating an array of nonvolatile memory cells of claim 33 wherein the first read inhibit voltage level is approximately −2.0V.

37. The method for operating an array of nonvolatile memory cells of claim 33 wherein the voltage level of the second word line read biasing voltage is approximately +5.0V.

38. The method for operating an array of nonvolatile memory cells of claim 33 wherein the bit line read biasing voltage is approximately +1.0V.

39. The method for operating an array of nonvolatile memory cells of claim 33 wherein the source line read biasing voltage is approximately the ground reference voltage level.

40. The method for operating an array of nonvolatile memory cells of claim 33 wherein the voltage level of the source line read inhibit voltage is approximately +1.0V.

41. The method for operating an array of nonvolatile memory cells of claim 33 further comprising:
fast reading a selected page of the array of nonvolatile memory cells by the steps of:
applying the second word line read biasing voltage level to the word line of the selected nonvolatile memory cells;
applying the second word line read inhibit voltage level to the word lines of the unselected nonvolatile memory cells to minimize sub-threshold leakage currents in the unselected nonvolatile memory cells;
applying the first bit line read biasing voltage to bit lines of the array of the selected nonvolatile memory cells;
applying the source line read biasing voltage to the selected source lines of the array of the selected nonvolatile memory cells; and
applying the source line read inhibit voltage to the unselected source lines of the unselected nonvolatile memory cells to shift the threshold biasing voltages of the unselected nonvolatile memory cells to minimize the sub-threshold leakage current in the unselected nonvolatile memory cells.

42. The method for operating an array of nonvolatile memory cells of claim 41 wherein the second read inhibit voltage level is approximately the ground reference voltage level.

43. The method for operating an array of nonvolatile memory cells of claim 41 wherein the voltage level of the second word line read biasing voltage is approximately +5.0V.

44. The method for operating an array of nonvolatile memory cells of claim 41 wherein the first bit line read biasing voltage is approximately +1.0V.

45. The method for operating an array of nonvolatile memory cells of claim 41 wherein the source line read biasing voltage is approximately the ground reference voltage level.

46. The method for operating an array of nonvolatile memory cells of claim 41 wherein the voltage level of the source line read inhibit voltage is approximately +1.0V.

47. The method for operating an array of nonvolatile memory cells of claim 33 further comprising the step of:
programming a selected page of the array of nonvolatile memory cells by the steps of:
applying a very high negative word line program voltage to the word line of the selected nonvolatile memory cells;
applying a positive program word line inhibit voltage to the word lines of the unselected word lines in a selected block and unselected blocks of the array of nonvolatile memory cells;
applying a high program select voltage to the bit lines and thus to the drains of the selected nonvolatile memory cells;
applying a source line program biasing voltage to the source lines connected to the selected nonvolatile voltage cells; and
applying a source line program inhibit voltage to the source lines of the unselected nonvolatile memory cells.

48. The method for operating an array of nonvolatile memory cells of claim 47 wherein the voltage level of the very high negative program voltage is approximately the breakdown voltage level of transistors forming the row decoder.

49. The method for operating an array of nonvolatile memory cells of claim 47 wherein the voltage level of the high negative word line program voltage is from approximately −10.0V to approximately −8.0V.

50. The method for operating an array of nonvolatile memory cells of claim 47 wherein the voltage level of the negative word line program inhibit voltage is approximately −2.0V.

51. The method for operating an array of nonvolatile memory cells of claim 47 wherein the high bit line program select voltage is approximately +5.0V when the nonvolatile memory cells are programmed with the single level cell program.

52. The method for operating an array of nonvolatile memory cells of claim 47 wherein the high bit line program select voltage is approximately +4.0V, approximately +5.0V or approximately +6.0V dependent on a datum to be programmed when the nonvolatile memory cells are programmed with the multiple level cell program.

53. The method for operating an array of nonvolatile memory cells of claim 47 wherein the source line program biasing voltage is approximately the ground reference voltage level.

54. The method for operating an array of nonvolatile memory cells of claim 47 wherein the source line program inhibit voltage is from approximately +1.5V to approximately +1.8V.

55. The method for operating an array of nonvolatile memory cells of claim 33 further comprising the step of:
verifying a page programming of a selected page of the array of nonvolatile memory cells by the steps of:
applying the voltage level of an upper boundary of a programmed threshold voltage level to the word line of the selected nonvolatile memory cells when the array of nonvolatile memory cells are programmed with a the single level cell programming or iteratively applying the upper boundaries of a first threshold voltage level, a second threshold voltage level and a third threshold voltage level to the word line of the selected nonvolatile memory cells when the array of nonvolatile memory cells are programmed with a the multiple level cell programming;
applying the word line read inhibit voltage to the word lines of the unselected nonvolatile memory cells;
applying a second bit line read biasing voltage to the drains of the selected nonvolatile memory cells to pre-charge the bit line connected to the drains of the selected nonvolatile memory cells to the second bit line read biasing voltage, wherein the pre-charged level of the second bit line read biasing voltage level is discharged to approximately 0.0V if the memory cell has not been successfully erased to the erased threshold voltage level that is lower than the lower boundary of the erased threshold voltage level and if the selected nonvolatile memory cells are erased, the pre-charged level of the second bit line read biasing voltage level will be maintained when the threshold voltage of the erased nonvolatile memory cells is greater than the erased threshold voltage level;
applying the source line read biasing voltage to the source lines of the selected nonvolatile memory cells; and
applying a source line read inhibit voltage to the source lines of the unselected nonvolatile memory cells.

56. The method for operating an array of nonvolatile memory cells of claim 55 wherein the upper boundary of a programmed threshold voltage level is approximately +1.5V when the nonvolatile memory cells are programmed with the single level cell programming.

57. The method for operating an array of nonvolatile memory cells of claim 55 wherein the upper boundaries of a first threshold voltage level, a second threshold voltage level and a third threshold voltage level are respectively +1.5V, +3.0V, and +4.5V for the when the nonvolatile memory cells are programmed with the multiple level cell programming.

58. The method for operating an array of nonvolatile memory cells of claim 55 wherein the word line read inhibit biasing voltage is approximately the ground reference voltage level.

59. The method for operating an array of nonvolatile memory cells of claim 55 wherein the voltage level of the second bit line read biasing voltage is approximately the voltage level of the power supply voltage source less a threshold voltage of an NMOS transistor wherein the voltage level of the power supply voltage source is +1.8V or +3.0V.

60. The method for operating an array of nonvolatile memory cells of claim 55 wherein the voltage level of the source line read inhibit voltage is approximately +1.0V.

61. The method for operating an array of nonvolatile memory cells of claim 55 wherein the source line read biasing voltage is approximately the ground reference voltage level.

62. The method for operating an array of nonvolatile memory cells of claim 33 further comprising the steps of:
    erasing a selected page, selected block, or a selected sector of the array of nonvolatile memory cells by the steps of:
        applying a very high negative erase voltage to the isolation well of the first impurity type
        applying a very high positive erase voltage to the word line of the selected nonvolatile memory cells;
        applying a word line erase inhibit voltage level to word lines of unselected nonvolatile memory cells of the selected block;
        disconnecting the word lines of the unselected nonvolatile memory cells so that the very high negative erase voltage is coupled from the first isolation well to the word lines of the unselected nonvolatile memory cells in unselected blocks; and
        applying the very high negative erase voltage to selected and unselected source lines.

63. The method for operating an array of nonvolatile memory cells of claim 62 wherein the voltage levels of the very high positive erase voltage and the very high negative erase voltage are approximately the drain-to-source breakdown voltage level of transistors forming peripheral circuitry of the array of nonvolatile memory cells to eliminate high voltage transistors with larger dimensions.

64. The method for operating an array of nonvolatile memory cells of claim 62 wherein the voltage level of the very high positive erase voltage is from approximately +8.0V to approximately +10.0V and the voltage level of the very high negative erase voltage is −10.0V to approximately −8.0V.

65. The method for operating an array of nonvolatile memory cells of claim 62 where in the word line erase inhibit voltage level is approximately the ground reference voltage level.

66. The method for operating an array of nonvolatile memory cells of claim 33 further comprising the step of:
    verifying a page erase of the selected page, the selected block, or the selected sector of the array of nonvolatile memory cells by the steps of:
        applying a voltage level of a lower boundary of an erased threshold voltage level to the word line of the selected nonvolatile memory cells;
        applying the ground reference voltage level to the word lines of the word lines of the unselected nonvolatile memory cells;
        applying the second bit line read biasing voltage to the drains of the selected nonvolatile memory cells to pre-charge the bit line connected to the drains of the selected nonvolatile memory cells to the second bit line read biasing voltage, wherein the pre-charged level of the second bit line read biasing voltage level is discharged to approximately 0.0V if the memory cell has not been successfully erased to the erased threshold voltage level that is lower than the lower boundary of the erased threshold voltage level and if the selected nonvolatile memory cells are erased, the pre-charged level of the second bit line read biasing voltage level will be maintained when the threshold voltage of the erased nonvolatile memory cells is greater than the erased threshold voltage level;
        applying the source line read biasing voltage to the source lines of the selected nonvolatile memory cells; and
        applying a second source line read inhibit voltage to the source lines of the unselected nonvolatile memory cells to minimize a sub-threshold leakage current through each of the unselected nonvolatile memory cells.

67. The method for operating an array of nonvolatile memory cells of claim 66 wherein the lower boundary of an erased threshold voltage level is approximately 6.0V.

68. The method for operating an array of nonvolatile memory cells of claim 66 wherein the voltage level of the second bit line read biasing voltage is approximately the voltage level of the power supply voltage source less a threshold voltage of an NMOS transistor.

69. The method for operating an array of nonvolatile memory cells of claim 68 wherein the voltage level of the power supply voltage source is +1.8V or +2.3V.

70. The method for operating an array of nonvolatile memory cells of claim 66 wherein the lower boundary of an erased threshold voltage level is approximately +6.0V.

71. The method for operating an array of nonvolatile memory cells of claim 66 wherein the source line read biasing voltage is approximately the ground reference voltage level.

72. The method for operating an array of nonvolatile memory cells of claim 66 wherein the voltage level of the second source line read inhibit voltage is approximately +2.0V.

73. A method for operating of a charge retaining charge retaining nonvolatile memory device comprising;
    inhibiting sub-threshold leakage current in unselected charge retaining nonvolatile memory devices during a read operation by the steps of:
        applying a bit line read biasing voltage to the selected bit lines voltage;
        applying a source line inhibit voltage approximately equal to the bit line read biasing voltage to the unselected source lines connected to charge retaining nonvolatile memory cells connected to the selected bit lines; and
        applying a word line read inhibit voltage to the unselected word lines;
    inhibiting sub-threshold leakage current in unselected charge retaining nonvolatile memory cells connected to selected bit lines during a program operation by the steps of:

applying a negative word line program inhibit voltage to the word line of the unselected charge retaining non-volatile memory cell;

applying a source line program inhibit voltage to the source lines of the unselected charge retaining non-volatile memory cells connected to the unselected bit lines.

74. The method of claim 73 wherein the bit line read biasing voltage level and the source line read inhibit voltage level is approximately +1.0V.

75. The method of claim 73 wherein the negative word line read inhibit voltage is approximately −2.0V.

76. The method of claim 73 wherein the negative word line program inhibit voltage is approximately −2.0V.

77. The method of claim 73 wherein the source line program inhibit voltage is from approximately +1.5V to approximately +1.8V.

* * * * *